United States Patent  
Cho et al.

(10) Patent No.: US 12,376,242 B2
(45) Date of Patent: Jul. 29, 2025

(54) ELECTRONIC DEVICE INCLUDING FLEXIBLE DISPLAY AND DISPLAY SUPPORT STRUCTURE, AND MANUFACTURING METHOD OF DISPLAY SUPPORT STRUCTURE

(71) Applicant: Samsung Electronics Co., Ltd., Suwon-si (KR)

(72) Inventors: Sunggun Cho, Suwon-si (KR); Wonhee Choi, Suwon-si (KR); Hwamok Pak, Suwon-si (KR); Minyee An, Suwon-si (KR); Byounguk Yoon, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 229 days.

(21) Appl. No.: 18/115,379

(22) Filed: Feb. 28, 2023

(65) Prior Publication Data

US 2023/0217613 A1    Jul. 6, 2023

Related U.S. Application Data

(63) Continuation of application No. PCT/KR2022/020867, filed on Dec. 20, 2022.

(30) Foreign Application Priority Data

Dec. 20, 2021  (KR) .................. 10-2021-0183165

(51) Int. Cl.
H05K 5/02 (2006.01)
(52) U.S. Cl.
CPC .............................. *H05K 5/0217* (2013.01)

(58) Field of Classification Search
CPC ... H05K 5/0217; G06F 1/1637; G06F 1/1652; G06F 1/1624; G06F 1/1626
See application file for complete search history.

(56) References Cited

U.S. PATENT DOCUMENTS 10,345,853 B2   7/2019  Wu et al.
10,747,269 B1   8/2020  Choi et al.
(Continued)

FOREIGN PATENT DOCUMENTS

CN   205943344 U   2/2017
KR   20180098644 A   9/2018
(Continued)

OTHER PUBLICATIONS

International Search Report and Written Opinion for International Application No. PCT/KR2022/020867; International Filing Date Dec. 20, 2022; Date of Mailing Mar. 23, 2023; 7 Pages.
(Continued)

*Primary Examiner* — Sagar Shrestha
(74) *Attorney, Agent, or Firm* — CANTOR COLBURN LLP

(57) ABSTRACT

Electronic devices may include a flexible display and a plate. The flexible display may be configured to be at least partially withdrawable from the internal space of the electronic device. The plate may be disposed on a rear surface of the flexible display. In the plate, a first portion of a first thickness and a second portion of a second thickness thicker than the first thickness may be repeatedly arranged based on one surface of the plate connected to the rear surface of the flexible display. The plate may include a plurality of openings formed on the first portion. The first portion and the second portion may be integrally formed, and may include or be formed from the same material.

18 Claims, 47 Drawing Sheets

(56) References Cited

U.S. PATENT DOCUMENTS

| | | | |
|---|---|---|---|
| 11,012,546 B1 | 5/2021 | Song et al. | |
| 11,343,364 B2 | 5/2022 | Cha et al. | |
| 12,080,197 B2* | 9/2024 | Chen | G06F 1/1601 |
| 2018/0124937 A1* | 5/2018 | Choi | G06F 1/1681 |
| 2018/0190936 A1* | 7/2018 | Lee | B32B 3/30 |
| 2020/0008308 A1* | 1/2020 | Shin | G02F 1/133305 |
| 2020/0120814 A1 | 4/2020 | Huang | |
| 2021/0120111 A1 | 4/2021 | Choi et al. | |
| 2021/0320992 A1 | 10/2021 | Song et al. | |
| 2021/0385315 A1* | 12/2021 | Cha | G06F 1/1675 |
| 2022/0057843 A1* | 2/2022 | Kim | G09F 9/301 |
| 2022/0121240 A1 | 4/2022 | Jang et al. | |
| 2022/0201880 A1* | 6/2022 | Choi | G06F 1/1637 |
| 2022/0210253 A1* | 6/2022 | Kwak | G09F 9/301 |
| 2022/0253103 A1* | 8/2022 | Choi | G09F 9/301 |
| 2023/0099802 A1 | 3/2023 | An et al. | |
| 2023/0124270 A1 | 4/2023 | Ko et al. | |
| 2023/0297143 A1* | 9/2023 | Kim | H04M 1/0268 |
| | | | 361/679.01 |
| 2023/0315146 A1* | 10/2023 | Myung | G06F 1/1656 |
| | | | 361/679.01 |
| 2023/0389243 A1* | 11/2023 | Cho | H05K 7/20963 |

FOREIGN PATENT DOCUMENTS

| | | |
|---|---|---|
| KR | 20190025799 A | 3/2019 |
| KR | 20210007773 A | 1/2021 |
| KR | 20210031348 A | 3/2021 |
| KR | 102331362 B1 | 11/2021 |
| KR | 20210148396 A | 12/2021 |
| WO | 2021049785 A1 | 3/2021 |
| WO | 2021246561 A1 | 12/2021 |
| WO | 2021246798 A1 | 12/2021 |

OTHER PUBLICATIONS

The extended European search report for EP Application No. 22911872.4 mailed on Feb. 14, 2025, citing the above reference(s).

* cited by examiner

ELECTRONIC DEVICE INCLUDING FLEXIBLE DISPLAY AND DISPLAY SUPPORT STRUCTURE, AND MANUFACTURING METHOD OF DISPLAY SUPPORT STRUCTURE

CROSS-REFERENCE TO RELATED APPLICATIONS

This application is a continuation application, claiming priority under § 365(c), of International Application No. PCT/KR2022/020867, filed on Dec. 20, 2022, which is based on and claims the benefit of Korean patent application number 10-2021-0183165, filed on Dec. 20, 2021, in the Korean Intellectual Property Office, the disclosures of which are incorporated by reference herein in their entireties.

TECHNICAL FIELD

Various embodiments of the disclosure relate to an electronic device including a flexible display and a display support structure, and a manufacturing method of the display support structure.

BACKGROUND

With the development of digital technologies, electronic devices are being provided in various forms, such as smart phones, tablet personal computers (PC), and personal digital assistants (PDA). Electronic devices are being designed to provide a larger screen while having a portable size that does not cause inconvenience to a user's hand.

DETAILED DESCRIPTION OF THE DISCLOSURE

Technical Problem

Electronic devices may be implemented to expand the screen by, for example, withdrawing at least a portion of the flexible display from an internal space of the electronic device. A display support structure for a seamless screen while supporting smooth movement of a flexible display may be required.

The technical problems to be addressed by this disclosure are not limited to those described above, and other technical problems, which are not described above, may be clearly understood by a person ordinarily skilled in the related art to which this disclosure belongs.

Technical Solution

Various embodiments of the disclosure may provide an electronic device including a flexible display and a display support structure capable of forming a seamless screen while enabling smooth and gentle movement of a flexible display in an electronic device capable of extending a screen, and a manufacturing method of the display support structure.

According to an embodiment of the disclosure, an electronic device may include a flexible display and a plate. The flexible display may be configured to be at least partially withdrawable from an internal space of the electronic device. The plate may be disposed on a rear surface of the flexible display. In the plate, a first portion of a first thickness and a second portion of a second thickness thicker than the first thickness may be repeatedly arranged based on one surface of the plate connected to the rear surface of the flexible display. The plate may include a plurality of openings formed on the first portion. The first portion and the second portion may be integrally formed, and may include the same material.

According to one embodiment of the disclosure, an electronic device may include a first housing, a second housing, a first support member, a second support member, a flexible display, and a plate. The second housing may be configured to be slidable with respect to the first housing. The first support member may be positioned in the first housing. The second support member may be positioned in the second housing. The flexible display may include a first display section and a second display section extended from the first display section. The first display section maybe disposed on the first support member and may be visually exposed to an outside. The second display section is supported by the second support during the sliding of the second housing, and may be withdrawn from or retracted into the internal space of the electronic device. The plate may be disposed on a rear surface of the flexible display. In the plate, a first portion of a first thickness and a second portion of a second thickness thicker than the first thickness may be repeatedly arranged based on one surface of the plate connected to the rear surface of the flexible display. The plate may include a lattice structure including a plurality of openings formed on the first portion. The first portion and the second portion may be integrally formed, and may include the same material.

Advantageous Effects

An electronic device including a flexible display and a display support structure according to various embodiments of the disclosure can form a seamless screen while enabling a smooth and gentle sliding operation, so that the reliability of the electronic device can be improved in which a screen is capable of being expanded in a sliding manner. The manufacturing method of the display support structure according to various embodiments of disclosure may serve to improve manufacturing processes, result in cost reduction, and/or process simplification.

In addition, effects obtained or predicted by various embodiments of the disclosure will be directly or implicitly disclosed in the detailed description of the embodiments of the disclosure.

MODE FOR DISCLOSURE

Hereinafter, various embodiments of the disclosure disclosed herein will be described with reference to the accompanying drawings.

Figure 1:
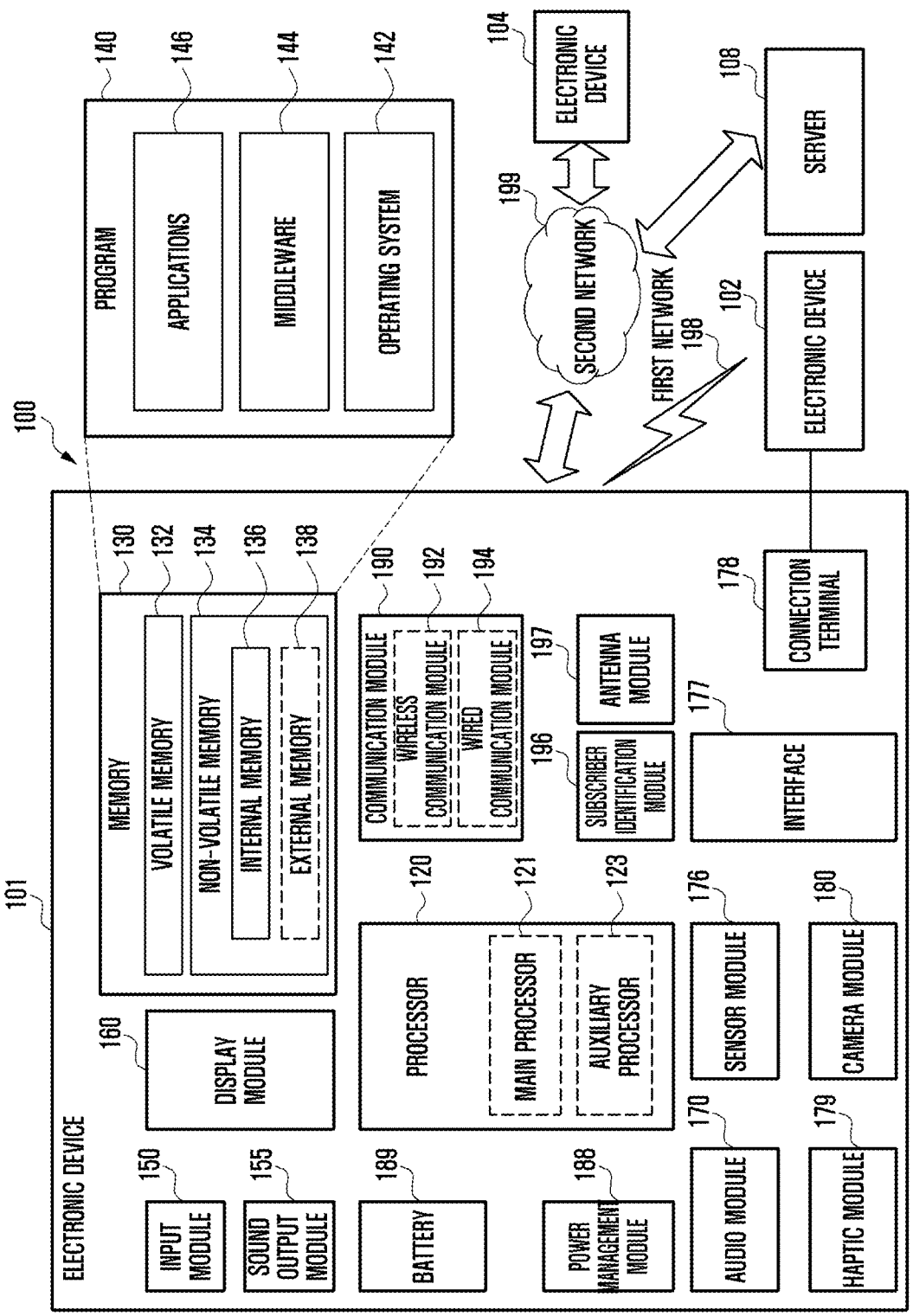
FIG. 1 is a block view of an electronic device in a network environment, according to an embodiment.

FIG. 1 is a block diagram of an electronic device 101 in a network environment 100 according to an embodiment.

Referring to FIG. 1, the electronic device 101 in the network environment 100 may communicate with an external electronic device 102 via a first network 198 (e.g., a short-range wireless communication network), or at least one of an external electronic device 104 or a server 108 via a second network 199 (e.g., a long-range wireless communication network). The electronic device 101 may communicate with the external electronic device 104 via the server 108. The electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, and/or an antenna module 197. In some embodiments of the disclosure, at least one (e.g., the connection terminal 178) of the components may be omitted from the electronic device 101, or one or more other components may be added in the electronic device 101. In some embodiments of the disclosure, some of the components may be implemented as single integrated circuitry. For example, the sensor module 176, the camera module 180, or the antenna module 197 may be implemented as embedded in single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in a volatile memory 132, process the command or the data stored in the volatile memory 132, and store resulting data in a non-volatile memory 134. The processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment of the disclosure, the auxiliary processor 123 (e.g., a neural network processing device) may include a hardware structure specified for processing an artificial intelligence model. The artificial intelligence model may be created through machine learning. Such learning may be performed, for example, in the electronic device 101 itself on which the artificial intelligence model is performed, or may be performed through a separate server (e.g., the server 108). The learning algorithms may include, for example, supervised learning, unsupervised learning, semi-supervised learning, or reinforcement learning, but is not limited thereto. The artificial intelligence model may include a plurality of artificial neural network layers. The artificial neural network may be any of a deep neural network (DNN), a convolutional neural network (CNN), a recurrent neural network (RNN), a restricted Boltzmann machine (RBM), a deep belief network (DBN), a bidirectional recurrent DNN (BRDNN), a deep Q-network, or a combination of two or more of the above-mentioned networks, but is not limited the above-mentioned examples. In addition to the hardware structure, the artificial intelligence model may additionally or alternatively include a software structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 and/or the non-volatile memory 134.

The program 140 may be stored in the memory 130 as software, and may include, for example, an operating system (OS) 142, middleware 144, and/or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record, and the receiver may be used for incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. The interface 177 may include, for example, a high-definition multimedia interface (HDMI), a universal serial bus (USB) interface, a secure digital (SD) card interface, and/or an audio interface.

The connecting terminal 178 may include a connector via which the electronic device 101 may be physically connected with the external electronic device (e.g., the external electronic device 102). The connecting terminal 178 may include, for example, an HDMI connector, a USB connector, an SD card connector, and/or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, ISPs, or flashes.

The power management module 188 may manage power supplied to or consumed by the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, and/or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or IR data association (IrDA)) or the second network 199 (e.g., a long-range communication network, such as a legacy cellular network, a $5^{th}$ generation (5G) network, a next generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a $4^{th}$ generation (4G) network, and next-generation communication technology, e.g., new radio (NR) access technology. The NR access technology may support high-speed transmission of high-capacity data (i.e., enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a mmWave band) to achieve, for example, a high data transmission rate. The wireless communication module 192 may support various technologies for securing performance in a high-frequency band, such as beamforming, massive multiple-input and multiple-output (MIMO), full-dimensional MIMO (FD-MIMO), array antenna, analog beam-forming, or large-scale antenna. The wireless communication module 192 may support various requirements specified in the electronic device 101, an external electronic device (e.g., external the electronic device 104), or a network system (e.g., the second network 199). According to an embodiment of the disclosure, the wireless communication module 192 may support a peak data rate for implementing eMBB (e.g., 20 Gbps or more), loss coverage for implementing mMTC (e.g., 164 dB or less), or U-plane latency for realizing URLLC (e.g., 0.5 ms or less for each of downlink (DL) and uplink (UL) or 1 ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a PCB, an RFIC that is disposed on or adjacent to a first surface (e.g., the bottom surface) of the PCB and is capable of supporting a predetermined high-frequency band (e.g., a mmWave band), and a plurality of antennas (e.g., array antennas) that is disposed on or adjacent to a second surface (e.g., the top surface or the side surface) of the PCB and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the external electronic devices 102 or 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide an ultra-low delay service using, for example, distributed computing or MEC. In another embodiment of the disclosure, the external electronic device 104 may include an internet of things (IoT) device. The server 108 may be an intelligent server using machine learning and/or neural networks. According to an embodiment of the disclosure, the external electronic device 104 or the server 108 may be included in the second network 199. The electronic device 101 may be applied to an intelligent service (e.g., smart home, smart city, smart car, or healthcare) based on 5G communication technology or IoT-related technology.

An electronic device according to an embodiment of the disclosure may be one of various types of electronic devices. The electronic devices may include a portable communication device (e.g., a smartphone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). If an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server. Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
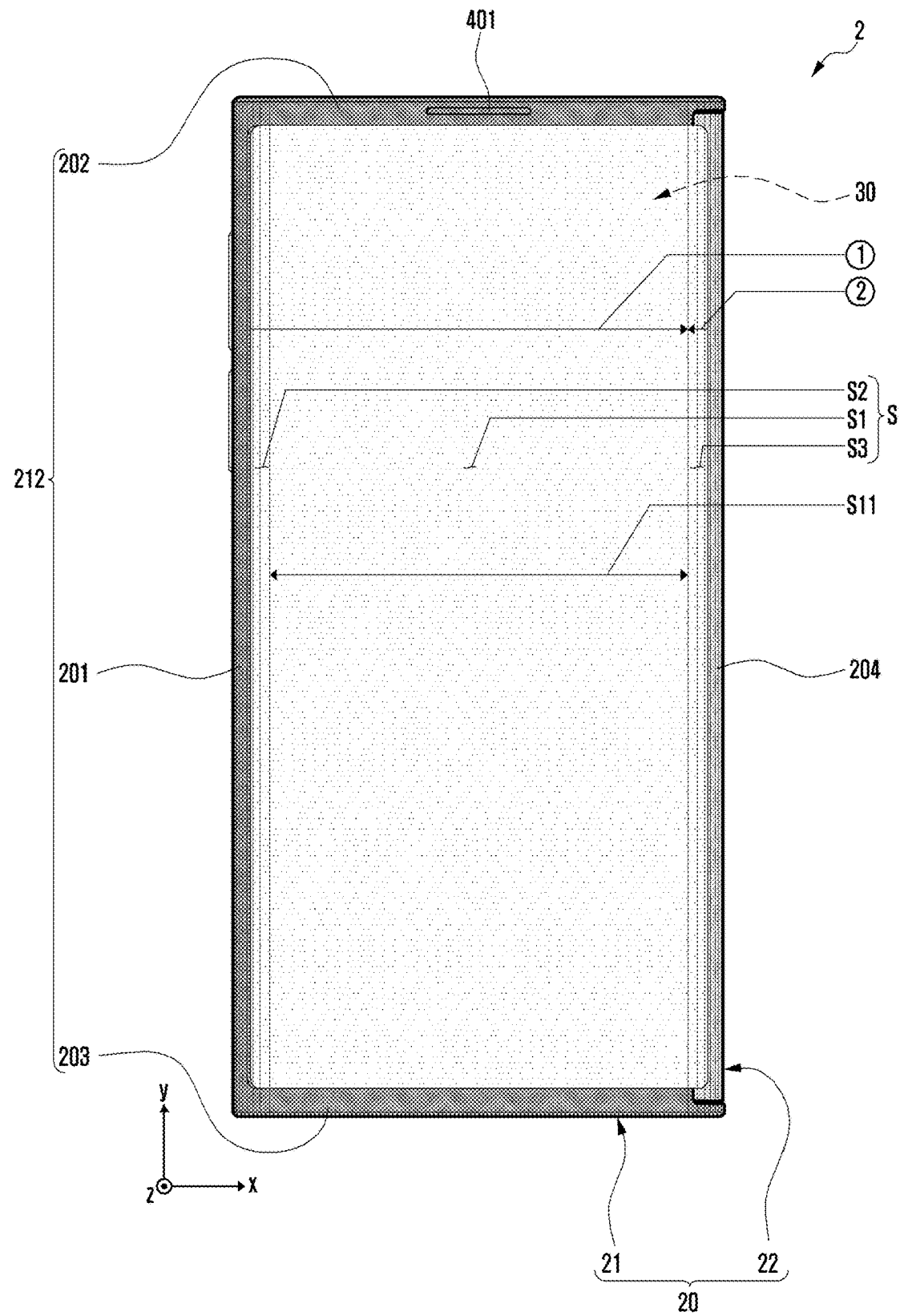
FIG. 2 is a front view illustrating a slidable electronic device in a closed state according to an embodiment.
Figure 3:
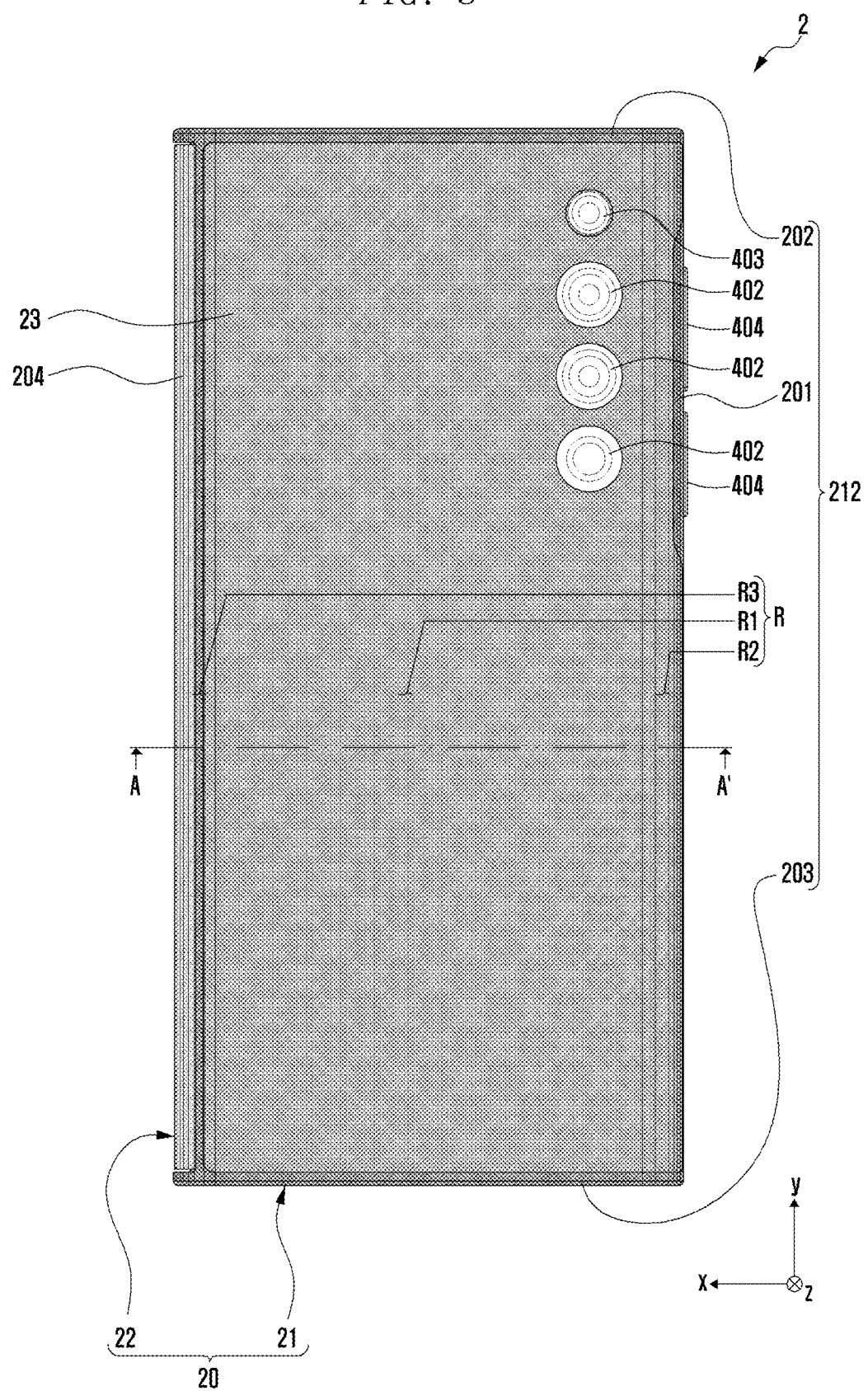
FIG. 3 is a rear view illustrating a slidable electronic device in a closed state according to an embodiment.
Figure 4:
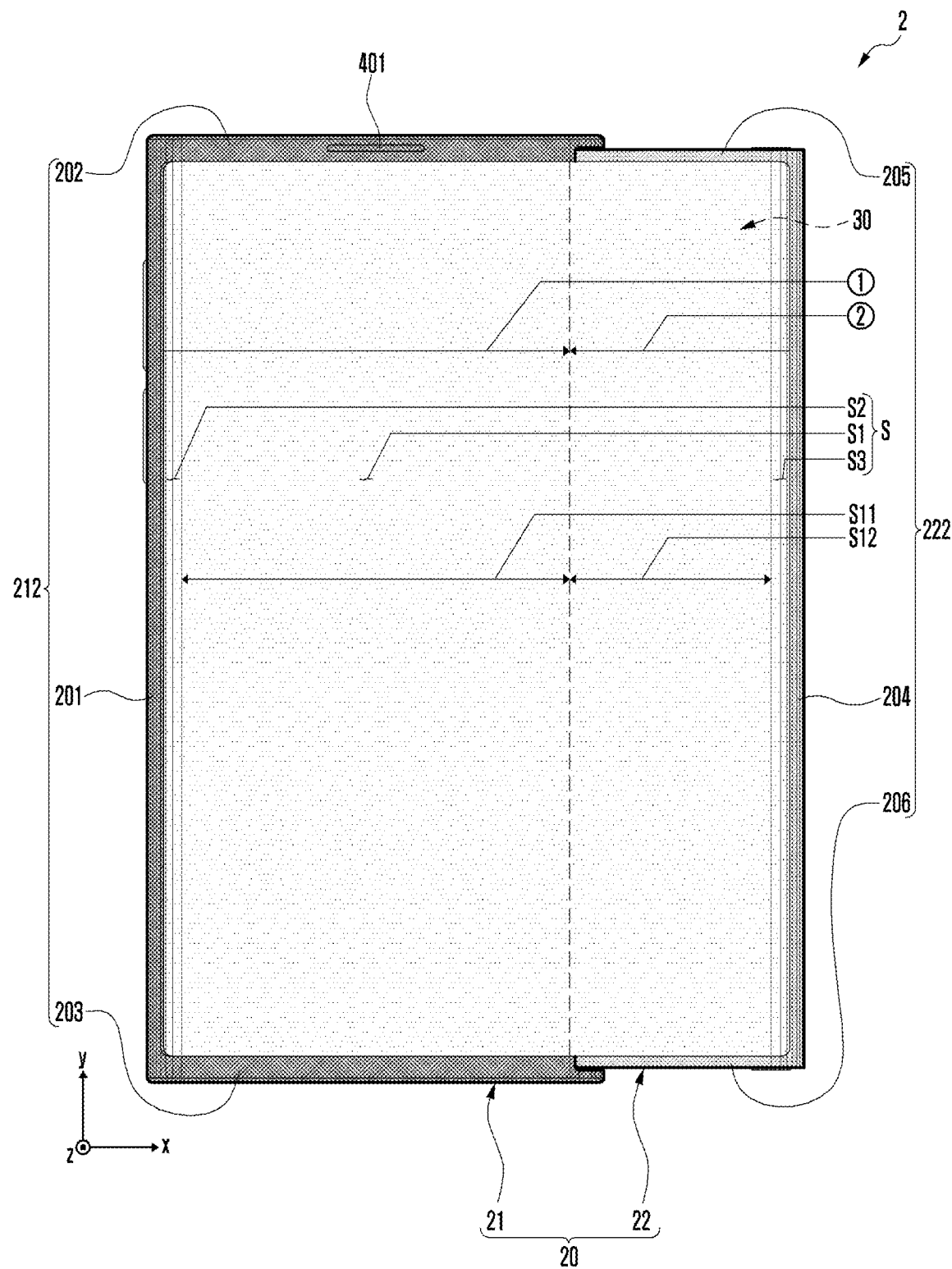
FIG. 4 is a front view illustrating a slidable electronic device in an open state according to an embodiment.
Figure 5:
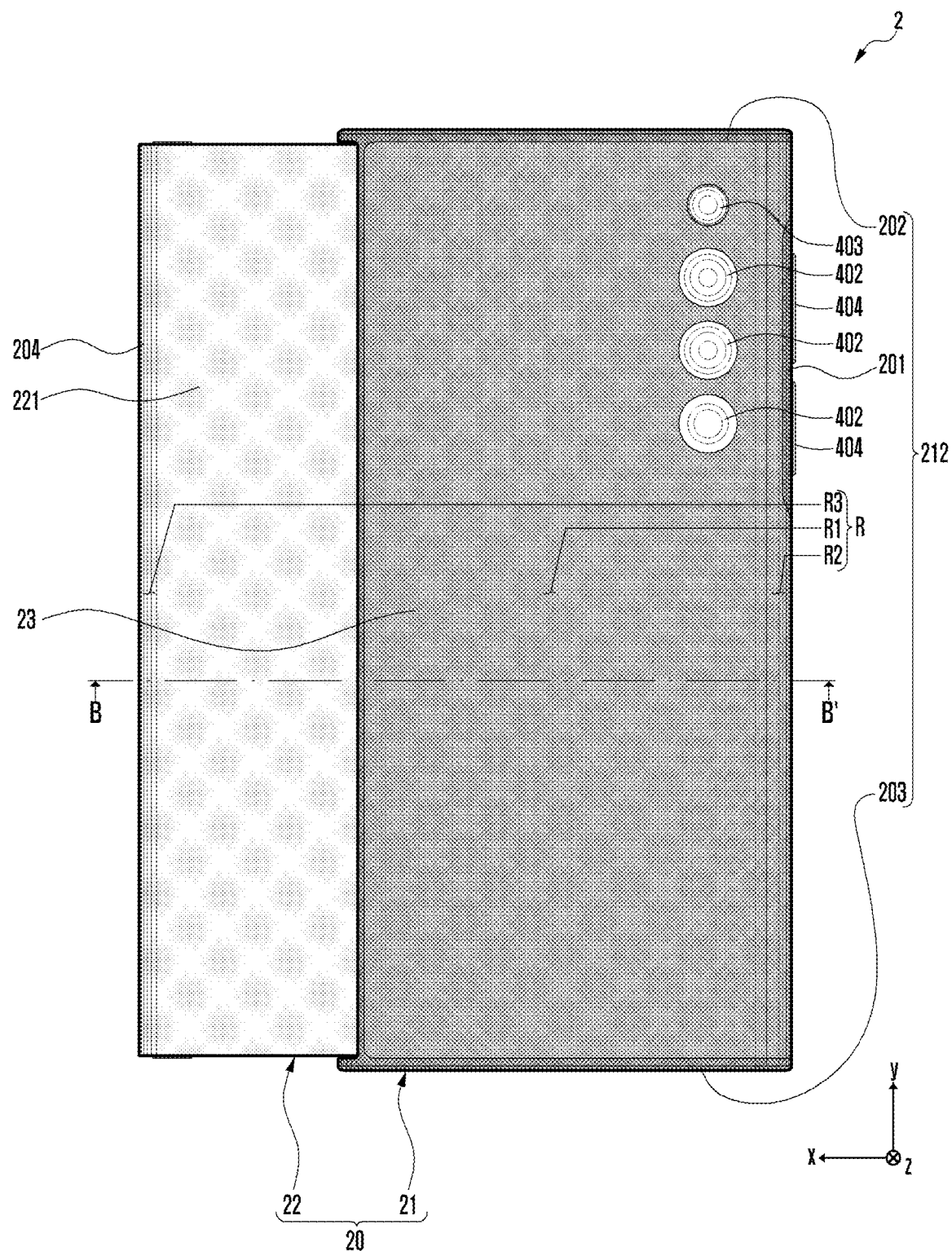
FIG. 5 is a rear view illustrating a slidable electronic device in an open state according to an embodiment.

FIG. 2 is a front view illustrating a slidable electronic device 2 in a closed state, according to an embodiment. FIG. 3 is a rear view illustrating the slidable electronic device 2 in the closed state, according to an embodiment. FIG. 4 is a front view illustrating the slidable electronic device 2 in an open state, according to an embodiment. FIG. 5 is a rear view illustrating the slidable electronic device 2 in the open state, according to an embodiment. In various embodiments of the disclosure, for convenience of description, the direction in which the screen S is visually exposed (e.g., the +z axis direction or out of the page from the x-y plane in FIG. 2) is interpreted and used as the front surface of the slidable electronic device 2, and the opposite direction (e.g., the −z axis direction or out of the page from the x-y plane in FIG. 3) is interpreted and used as the rear surface of the slidable electronic device 2.

With reference to FIGS. 2, 3, 4, and 5, the slidable electronic device 2 may include a housing (or a housing structure) 20 and a flexible display 30. The housing 20 may include a first housing (or a first housing part or a first housing structure) 21 and a second housing (or a second housing part or a second housing structure) 22. The second housing 22 may be slidable relative to the first housing 21. A sliding structure for sliding the second housing 22 may be provided between the first housing 21 and the second housing 22. The sliding structure may include, for example, a guide rail and a slide or roller that is guided and moved by or along the guide rail. The sliding structure may be implemented in a variety of other ways without departing from the scope of the present disclosure. The flexible display 30 may form a screen (or a display area or an active area) S that is visible to the outside of the slidable electronic device 2. The flexible display 30 may include a first display section ① corresponding to the first housing 21 and a second display section ② extending from the first display section ① and corresponding to the second housing 22. At least a portion of the second display section ② may be withdrawn from the slidable electronic device 2 or retracted into the slidable electronic device 2 according to the sliding of the second housing 22, so that the size of the screen S may vary. The second display section ② is a bent portion of the flexible display 30 in the state change of the slidable electronic device 2 (e.g., switching between a closed state and an open state), and may be, for example, referred to as other terms, such as a 'bendable area' or a 'bendable section'. FIG. 2 illustrates a front side of the slidable electronic device 2 in a state where the screen S is not expanded, and FIG. 4 illustrates the front side of the slidable electronic device 2 in a state where the screen S is expanded. The state in which the screen S is not extended is the state in which the second housing 22 is not moved in a first direction (e.g., the +x axis direction) with respect to the first housing 21, and may be referred to as the closed state of the slidable electronic device 2. The state in which the screen S is extended is the state in which the second housing 22 is moved to a maximum and does not move in the first direction any more, and may be referred to as the open state of the slidable electronic device 2. In some embodiments, the open state may include a fully open state (see, e.g., FIG. 4) or an intermediate state. The intermediate state may refer to a state between the closed state (see, e.g., FIG. 2) and the fully open state. In some embodiments, in the case that the second housing 22 is at least partially moved in the first direction with respect to the first housing 21, it may be referred to as "slide-out" of the second housing 22. In various embodiments, the second housing 22 may be a sliding a sliding plate or frame. In some embodiments, in the case that the second housing 22 is at least partially moved in a second direction opposite to the first direction (e.g., the −x axis direction) with respect to the first housing 21, it may be referred to as 'slide-in' of the second housing 22. Hereinafter, the first direction (+x direction) may be referred to as a 'slide-out direction', and the second direction (−x direction) may be referred to as a 'slide-in direction'. In the slidable electronic device 2 having an expandable screen S corresponding to the slide-out of the second housing 22, the flexible display 30 may be referred to as another term, such as an 'expandable display', 'slidable display', or a 'slide-out display'.

According to an embodiment, the flexible display 30 may include a touch sensor (e.g., a touch-sensitive circuit). In some embodiments, the flexible display 30 may include a pressure sensor configured to measure the intensity of the touch. In some embodiments, the flexible display 30 may include an electromagnetic induction panel (e.g., a digitizer) configured to detect a magnetic-field-type pen input device (e.g., an electronic pen or a stylus pen) or may be coupled to the electromagnetic induction panel. It will be appreciated that the flexible display 30 may be a touch screen type of screen surface which can receive input from a user, and any appropriate mechanism for detecting such input may be incorporated into the slidable electronic device 2 without departing from the scope of the present disclosure.

According to an embodiment, the screen S may include a first flat part S1, a first curved part S2, and a second curved part S3. The first flat part S1 may be interposed between the first curved part S2 and the second curved part S3. The first curved part S2 and the second curved part S3 may be curved from the first flat part S1 toward the rear surface R of the slidable electronic device 2 (i.e., curved toward the rear side of the slidable electronic device 2). For example, the first curved part S2 and the second curved part S3 may be substantially symmetrical, with the first flat part S1 interposed therebetween. The first flat part S1 may be expanded or contracted according to a state change (e.g., switching between the closed state and the open state) of the slidable electronic device 2. The portion forming the second curved part S3 of the second display section ② of the flexible display 30 may change according to the state change of the slidable electronic device 2, and the second curved part S3 may be provided in substantially the same shape even when the state of the slidable electronic device 2 is changed. The first curved part S2 may be positioned on the opposite side of the first flat part S1 relative to the second curved part S3 in the closed or open state of the slidable electronic device 2 to improve aesthetics of the screen S. In some embodiments, the first flat part S1 may be implemented in an expanded form without the first curved part S2. The housing 20 may form the rear surface R of the slidable electronic device 2 positioned opposite to the screen S on the slidable electronic device 2. The rear surface R of the slidable electronic device 2 may form, for example, a second flat part R1, a third curved part R2, and/or a fourth curved part R3. When viewed in the closed state of the slidable electronic device 2 (e.g., FIG. 3), the second flat part R1 may be positioned to correspond to the first flat part S1 of the screen S, and may be substantially parallel to the first flat part S1. The third curved part R2 may correspond to the first curved part S2 of the screen S, and may be a form curved from the second flat part R1 toward the first curved part S2. The fourth curved part R3 may correspond to the second curved part S3 of the screen S, and may be a form curved from the second flat part R1 toward the second curved part S3.

According to an embodiment, the first housing 21 may include a first plate (e.g., a first plate 211 in FIG. 6 or 7), a first sidewall structure 212 extending from the first plate, and/or a back cover 23. When viewed from above the screen S (e.g., viewed in the −z axis direction), the first plate may overlap the screen S. The first sidewall structure 212 may include a first sidewall 201, a second sidewall 202, and a third sidewall 203. The first sidewall 201 may be positioned to correspond to the first curved part S2 of the screen S. The second sidewall 202 extends from one end of the first sidewall 201 and may be positioned corresponding to one edge area connecting one end of the first curved part S2 and one end of the second curved part S3 of the screen S. The third sidewall 203 extends from the other end of the first sidewall 201 and may be positioned corresponding to the other edge area connecting the other end of the first curved part S2 and the other end of the second curved part S3 of the screen S. The first housing 21 may have a first space (e.g., a first space 214 in FIG. 6 or 7) formed or defined by the first plate and the first sidewall structure 212. The first plate, the first sidewall 201, the second sidewall 202, and the third sidewall 203 may be integrally formed as a single continuous or complete structure, for example, and may be formed from the same material (e.g., aluminum, stainless steel (STS), or a metal material such as magnesium, or a non-metal material such as a polymer). The back cover 23 may be disposed or coupled to the first plate to form a portion of the rear surface of the slidable electronic device 2.

According to one embodiment, the second housing 22 may include a second plate 221 and a second sidewall structure 222 extending from the second plate 221 (FIGS. 4-5). The second housing 22 may be positioned in a first space of the first housing 21 (e.g., a space formed by the first plate 211 (see FIG. 6 or 7) and the first sidewall structure 212). When viewed from above the screen S (e.g., viewed in the −z axis direction), the second plate 221 may overlap the screen S. When viewed from above the screen S, the area where the first plate 211 (see FIG. 6 or 7) and the second plate 221 overlap may decrease when sliding out, and increase when the second housing 22 slides in. The second sidewall structure 222, as shown in FIG. 4, may include a fourth sidewall 204, a fifth sidewall 205, and a sixth sidewall 206. The fourth sidewall 204 may be positioned to correspond to the second curved part S3 of the screen S. When viewed from above the screen S, the fourth sidewall 204 may be positioned by being spaced apart from the first sidewall 201 of the first housing 21 in a slide-out direction (e.g., +x axis direction). The fifth sidewall 205 extends from one end of the fourth sidewall 204 and may be positioned corresponding to one edge area connecting one end of the first curved part S2 and one end of the second curved part S3 of the screen S. When viewed in a direction orthogonal to the slide-out direction and orthogonal to the direction the screen S is oriented (e.g., the +z axis direction) (e.g., when viewed in the y axis direction), the fifth sidewall 205 may overlap the second sidewall 202 of the housing 21. The sixth side wall 206 extends from the other end of the fourth side wall 204 and may be positioned corresponding to the other edge area connecting the other end of the first curved part S2 and the other end of the second curved part S3 of the screen S. The sixth sidewall 206 may overlap the third sidewall 203 of the first housing 21 when viewed in a direction orthogonal to the slide-out direction and orthogonal to the direction the screen S is oriented. The second plate 221, the fourth sidewall 204, the fifth sidewall 205, and the sixth sidewall 206 may be integrally formed, for example, and may be formed of the same material (e.g., a metal material such as aluminum, stainless steel (STS), or magnesium, or a non-metal material such as a polymer). The second plate 221, the fifth sidewall 205, and the sixth sidewall 206 may not be substantially exposed to the outside in the state in which the slidable electronic device 2 is closed. The second plate 221, the fifth sidewall 205, and the sixth sidewall 206 may be externally visible in the state in which the slidable electronic device 2 is opened. The distance at which the fourth sidewall 204 is spaced apart from the first sidewall 201 in the slide-out direction may increase when the second housing 22 slides out and decrease when the second housing 22 slides in. When viewed in a direction orthogonal to the slide-out direction and orthogonal to the direction the screen S is oriented, an area where the second sidewall 202 and the fifth sidewall 205 overlap, and an area where the third sidewall 203 and the sixth sidewall 206 overlap may decrease when the second housing 22 slides out and increase when the second housing 22 slides in.

According to one embodiment, when viewed from above the screen S (e.g., when viewed in the −z axis direction), the first sidewall structure 212 of the first housing 21 and the sidewall structure 222 of the second housing 22 may form a bezel structure surrounding the screen S. The second housing 22 may have a second space (e.g., the second space 224 in FIG. 6 or 7) formed by the second plate 221 and the second sidewall structure 222. The housing 20 may have a recessed space due to the first housing 21 and the second housing 22. The recessed space of the housing 20 may increase when the second housing 22 slides out, and decrease when the second housing 22 slides in, according to the relative position between the first space of the first housing 21 and the second space of the second housing 22. The components accommodated in the recessed space of the housing 20, components accommodated in the first space of the first housing 21, and/or components accommodated in the second space of the second housing 22 may be positioned so as not to interfere with the sliding of the housing 22.

According to one embodiment, the housing 20 may be provided with a sliding structure that enables the second housing 22 to slide with respect to the first housing 21. The sliding structure may be formed between the first plate of the first housing 21 (e.g., the first plate 211 in FIG. 6 or 7) and the second plate 221 of the second housing 22, between the second sidewall 202 of the first housing 21 and the fifth sidewall 205 of the second housing 22, and/or between the third sidewall 203 of the first housing 21 and the sixth sidewall 206 of the second housing 22. The sliding structure may be implemented so that the second housing 22 can be stably moved without shaking in a slide-out direction or a slide-in direction while being not separated from the first housing 21. For example, the sliding structure may include a guide rail including a groove or recess corresponding to the sliding movement path of the second housing 22. In order to reduce the frictional force between the first housing 21 and the second housing 22, a lubricant (e.g., grease) may be interposed between the first housing 21 and the second housing 22, or a friction surface between the first housing 21 and the second housing 22 may be coated with a lubricant. As another example, in order to reduce the frictional force between the first housing 21 and the second housing 22, a rolling member such as a roller or a bearing may be interposed between the first housing 21 and the second housing 22. Various other mechanisms to provide a smooth and sturdy sliding operation may be incorporated without departing from the scope of the present disclosure.

According to an embodiment, the slidable electronic device 2 may include a first support member (e.g., a first support member 721 in FIG. 6 or 7) coupled to the first housing 21 or integrally formed at least partially with the first housing 21. The first display section ① of the flexible display 30 may be disposed on or coupled to the first support member. The slidable electronic device 2 may include a second support member (e.g., a second support member 722 in FIG. 6 or 7) coupled to the second housing 22 or integrally formed at least partially with the second housing part 22, corresponding to the second display section ② of the flexible display 30. When the second housing 22 slides, the second display section ② is supported by the second support member and may be withdrawn from the internal space of the housing 20 or retracted into the internal space of the housing 20. For example, in the slide-out of the second housing 22, due to a relative position between the first support member coupled to the first display section ① and the second support member corresponding to at least a portion of the second display section ②, at least a portion of the second display section ② may be withdrawn from the internal space of the housing 20 through a space between the fourth sidewall 204 and the second support member. For example, in the slide-in of the second housing 22, due to the relative position between the first support member coupled to the first display section ① and the second support member corresponding to at least a portion of the second display section ②, at least a portion of the second display section ② may be retracted into the internal space of the housing 20 through the space between the fourth sidewall 204 and the second support member. One surface of the first support member coupled to the first display section ① of the flexible display 30 may include, for example, a flat area and a curved area. The flat area of the first support member may serve to form the first flat part S1 of the screen S. The first flat part S1 of the screen S may be supported flat by the flat area of the first support member. The curved area of the first support member may serve to form the first curved part S2 of the screen S. The first curved part S2 of the screen S may be supported in a curved manner by the curved area of the first support member. The second curved part S3 of the screen S may be formed to correspond to the curved part of the second support member. In one embodiment, in the closed state of the slidable electronic device 2, the first flat part S1 of the screen S may include a first flat area S11 (FIG. 2), and in the open state of the slidable electronic device 2, the first flat part S1 of the screen S may include a first flat area S11 and a second flat area S12 (FIG. 4). The first flat area S11 may be supported by the first support member. The second flat area S12 may be supported by the second support member when the second housing 22 slides out.

According to some embodiments, in the state in which the second display section ② of the flexible display 30 is at least partially retracted into the internal space of the housing 20 (e.g., in the closed state of the slidable electronic device 2), at least a portion of the second display section ② can be seen from the outside through the back cover 23. In this case, at least a portion of the back cover 23 may be implemented as transparent or translucent. In some embodiments, in the case that there is a member positioned between the back cover 23 and at least a portion of the second display section ② in the closed state of the slidable electronic device 2, at least some areas of the member may include an opening or may be formed to be transparent or translucent.

According to an embodiment, in the slidable electronic device 2, the sliding structure related to the second housing 22 may include an elastic structure. For example, when the second housing 22 is moved by an external force to a configured distance, the sliding housing 22 may be switched from the closed state to the open state or from the open state to a closed state due to the elastic structure included in the sliding structure without any further external force (e.g., a semi-automatic slide operation). In some embodiments, when a signal is generated through an input module included in the slidable electronic device 2, the slidable electronic device 2 may be switched from the closed state to the open state or from the open state to the closed state due to a driving device, such as a motor connected to the second housing 22. For example, when a signal is generated through a hardware button or a software button provided through a screen S, the slidable electronic device 2 may be switched from the closed state to the open state or from the open state to the closed state. In some embodiments, when signals are generated from various sensors such as a pressure sensor, the slidable electronic device 2 may be switched from the closed state to the open state or from the open state to the closed state.

According to an embodiment, the slidable electronic device 2 may include various internal components, such as those shown and described above with respect to FIG. 1. For example, and without limitation and in any combination, the slidable electronic device 2 may include one or more audio modules (e.g., the audio module 170 in FIG. 1), one or more sensor modules (e.g., the sensor module 176 in FIG. 1), one or more camera modules (e.g., the camera module 180 in FIG. 1), one or more light emitting modules, one or more input modules (e.g., the input module 150 in FIG. 1), and/or one or more connection terminal modules (e.g., the interface 177 or the connection terminal 178 in FIG. 1). In some embodiments, at least one of the above-mentioned components may be omitted from the slidable electronic device 2 or other components may be additionally included in the slidable electronic device 2. The location or number of components may vary.

The audio modules may include, for example, a microphone positioned inside the slidable electronic device 2 and a microphone hole formed on the exterior of the slidable electronic device 2 to correspond to the microphone. Further, the audio modules may include, for example, a speaker (e.g., an external speaker or a receiver for a call) positioned inside the slidable electronic device 2, and a speaker hole formed on the exterior of the slidable electronic device 2 to correspond to the speaker. In some embodiments, the speaker may include a receiver for a call, in which case the speaker hole may be referred to as a receiver hole (e.g., see the audio module indicated by reference numeral 401 in FIG. 4). The audio module 401 including a receiver for a call may be positioned to correspond to the second sidewall 202 of the first housing 21, for example. The position or number of audio modules relative to the speaker or microphone may vary. In some embodiments, the microphone hole and the speaker hole may be implemented as a single hole. In some embodiment, the speaker-related audio module(s) may include a piezo speaker in which a speaker hole is omitted.

The sensor modules may be configured to generate electrical signals or data values corresponding to an internal operational state of the slidable electronic device 2 or an external environmental state. In one embodiment, any one of the at least one sensor modules may include an optical sensor positioned in the internal space of the housing 20, corresponding to the screen S. An optical sensor may include, for example, a proximity sensor or an illuminance sensor. The optical sensor may be aligned with an opening formed in the first display section ① of the flexible display 30. External light may reach the optical sensor through a transparent cover and the opening of the first display section ①. The transparent cover may serve to protect the flexible display 30 from the outside, and may be implemented as a flexible member, such as a plastic film (e.g., a polyimide film) or an ultra-thin glass (UTG). In some embodiments, the optical sensor may be positioned on the rear surface of the first display section ① or below or beneath the first display section ①, and may perform a related function in the state in which the position of the optical sensor is not visually distinguished (or exposed). In some embodiments, the optical sensor may be positioned in alignment with a recess formed on the rear surface of the first display section ①. The optical sensor may be disposed to overlap at least a portion of the screen S, and perform a sensing function without being exposed to the outside. In this case, a partial area of the first display section ① that at least partially overlaps the optical sensor may include a different pixel structure and/or a wiring structure different from those of other areas. For example, the partial area of the first display section ① that at least partially overlaps the optical sensor may have a pixel density different from that of other areas. In some embodiments, a plurality of pixels may not be disposed on the partial area of the first display section ① that is at least partially overlap the optical sensor. In some embodiments, the slidable electronic device 2 may include a biometric sensor (e.g., a fingerprint sensor) positioned on the rear surface of the first display section ① or below the first display section ①. The biometric sensor may be implemented in an optical scheme, an electrostatic scheme, or an ultrasonic scheme, and the position or number thereof may vary. The slidable electronic device 2 may include various other sensor modules, for example, at least one of a gesture sensor, a gyro sensor, an atmospheric pressure sensor, a magnetic sensor, an acceleration sensor, a grip sensor, a color sensor, an infrared (IR) sensor, a temperature sensor, and a humidity sensor.

The camera modules may include, for example, one or more lenses, an image sensor, and/or an image signal processor. The position or number of camera modules may vary. In one embodiment, the slidable electronic device 2 may include a plurality of rear camera modules 402 positioned to correspond to the back cover 23 (FIGS. 3 and 5). For example, the back cover 23 may include a plurality of openings formed corresponding to the plurality of rear camera modules 402, and the plurality of rear camera modules 402 may be exposed to the outside through the plurality of openings (hereinafter referred to as camera holes). In some embodiments, the back cover 23 may be formed to include a light transmission area corresponding to the plurality of rear camera modules 402 without camera holes. The plurality of rear camera modules 402 may have different properties (e.g., angle of view) or functions, and may include, for example, dual cameras, triple cameras, etc. The plurality of rear camera modules 402 may include a plurality of camera modules including lenses having different angles of view, and the slidable electronic device 2 may control the camera module to change the angle of view of the camera module operated in the slidable electronic device 2 based on a user's selection. The plurality of rear camera modules 402, for example, may include at least one of a wide-angle camera, a telephoto camera, a color camera, a monochrome camera, and/or an infrared (IR) camera (e.g., a time of flight (TOF) camera, or a structured light camera). In some embodiments, an IR camera may be operated as at least part of a sensor module. A light-emitting module 403 (e.g., a flash) may be exposed to the outside through an opening (hereinafter referred to as a flash hole) formed in the back cover 23. In some embodiments, the back cover 23 may be formed to include a light transmission area corresponding to the light-emitting module 403 without the flash hole. The light-emitting module 403 may include a light source for the plurality of rear camera modules 402. The light-emitting module 403 may include, for example, an LED or a xenon lamp.

According to some embodiments, the slidable electronic device 2 may include a front camera module positioned in the internal space of the housing 20 corresponding to the screen S. For example, the first display section ① of the flexible display 30 may include an opening aligned with the front camera module. External light may reach the front camera module through the transparent cover (e.g., a flexible member serving to protect the flexible display 30 from the outside) and the opening of the first display section ①. The opening of the first display section ① aligned with or overlapping the front camera module may be formed in the form of a through hole or a notch. In some embodiments, the front camera module may be positioned on the rear surface of the first display section ① or below or beneath the first display section ①, and the position of the front camera module is not visually distinguished (or exposed) and may perform a related function (e.g., image capture). The front camera module may include, for example, a hidden display rear camera (e.g., an under display camera (UDC)). In some embodiments, the front camera module may be positioned in alignment with a recess formed on the rear surface of the first display section ①. The front camera module may be disposed to overlap at least a portion of the screen S, so that an image of an external subject may be obtained without being visually exposed to the outside. In this case, a partial area of the first display section ① that at least partially overlaps the front camera module may include a different pixel structure and/or a wiring structure different from those of other areas. For example, the partial area of the first display section ① that at least partially overlaps the front camera module may have a pixel density different from that of other areas. A pixel structure and/or a wiring structure formed in a partial area of the first display section ① that at least partially overlaps the front camera module 306 may reduce light loss between the outside and the front camera module. In some embodiments, pixels may not be disposed on a partial area of the first display section ① that at least partially overlaps the front camera module. In some embodiments, the front camera module may be positioned corresponding to the second sidewall 202 of the first housing 21. The slidable electronic device 2 may include a light-emitting module (e.g., LED, IR LED, or xenon lamp) capable of providing state information of the slidable electronic device 2 in the form of light. In some embodiments, the light-emitting module may provide a light source interlocked with the operation of the front camera module.

The input modules may include, for example, one or more key input devices 404. A plurality of the key input devices 404 may be positioned on the first sidewall 201 of the first housing 21. In some embodiments, the slidable electronic device 2 may not include some or all of the key input devices, and key input devices not included or illustrated may be implemented as soft keys using the screen S. The position or number of the input modules may vary, and in some embodiments, the input module(s) may include at least one sensor module.

The connection terminal modules (or a connector module or an interface terminal module) may include, for example, a connector (or an interface terminal) positioned inside the slidable electronic device 2, and a connector hole formed on the exterior of the slidable electronic device 2 corresponding to the connector. The position or number of the connection terminal modules may vary. The slidable electronic device 2 may be configured to transmit and/or receive power and/or data with an external electronic device electrically connected to the connector. In one embodiment, the connector may include a universal serial bus (USB) connector or a high definition multimedia interface (HDMI) connector. In some embodiments, the slidable electronic device 2 may include a connection terminal module including an audio connector (e.g., a headphone connector or an earphone connector).

Figure 6:
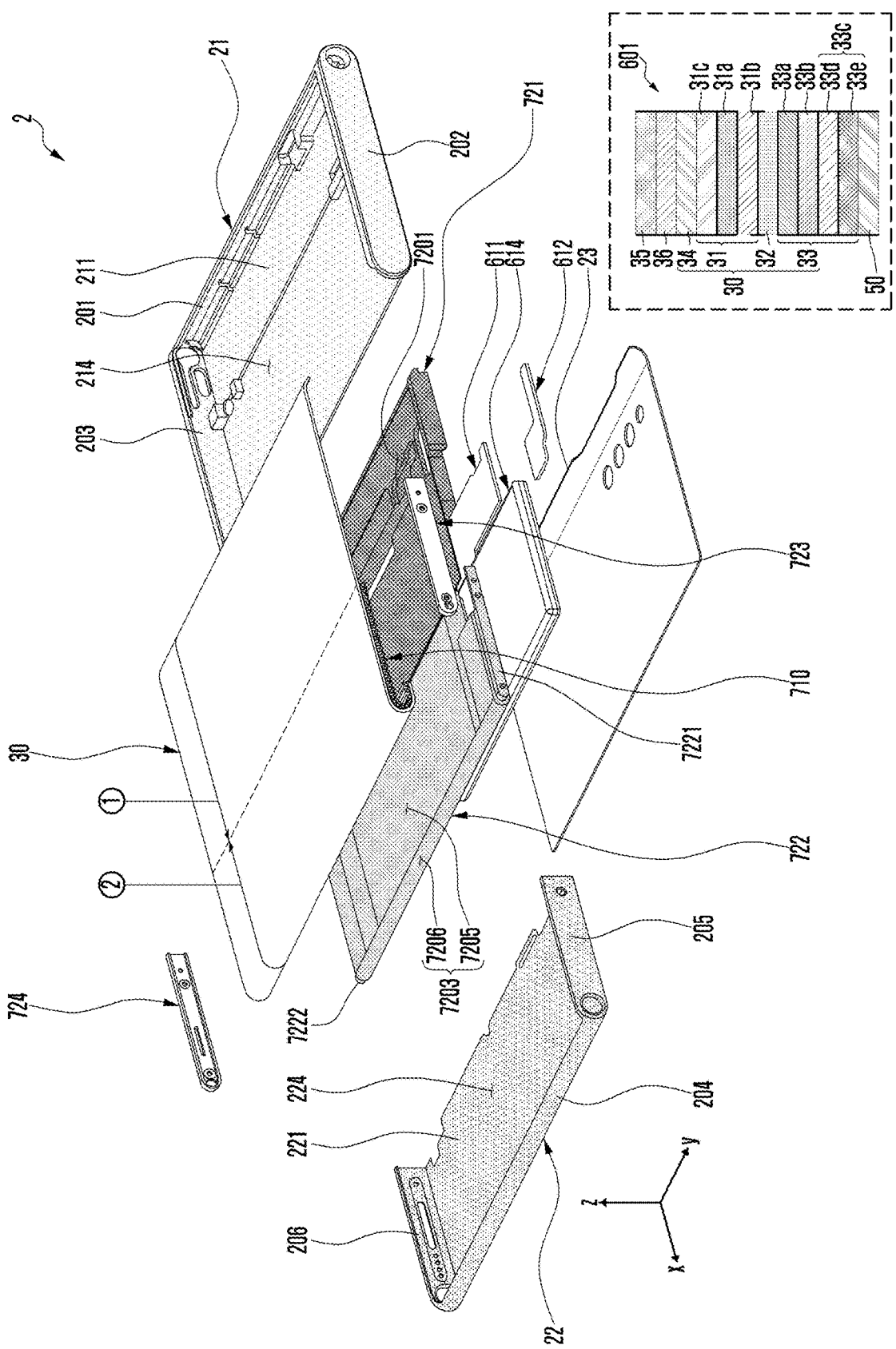
FIGS. 6 and 7 are exploded perspective views of a slidable electronic device according to an embodiment.
Figure 7:
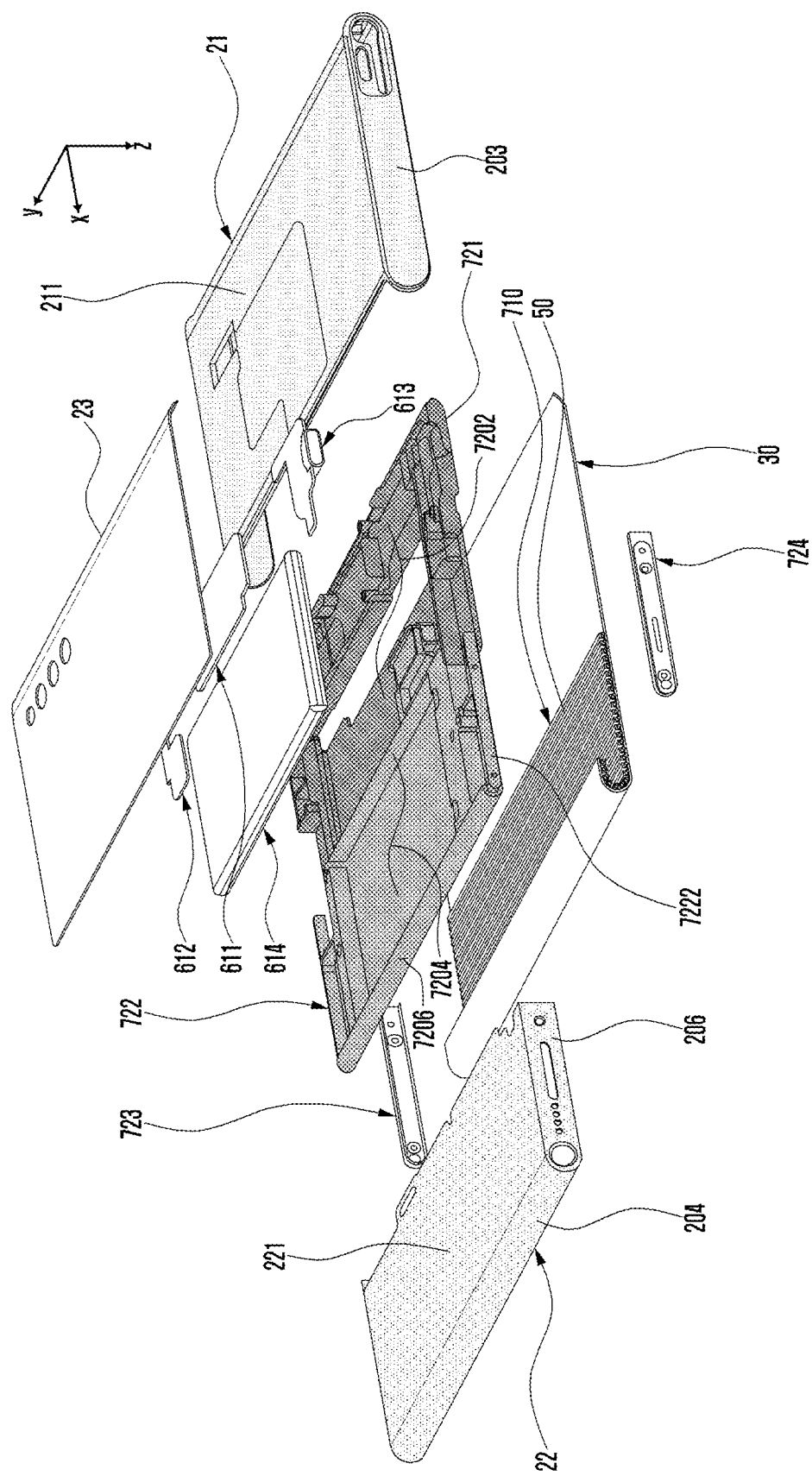
Figure 8:
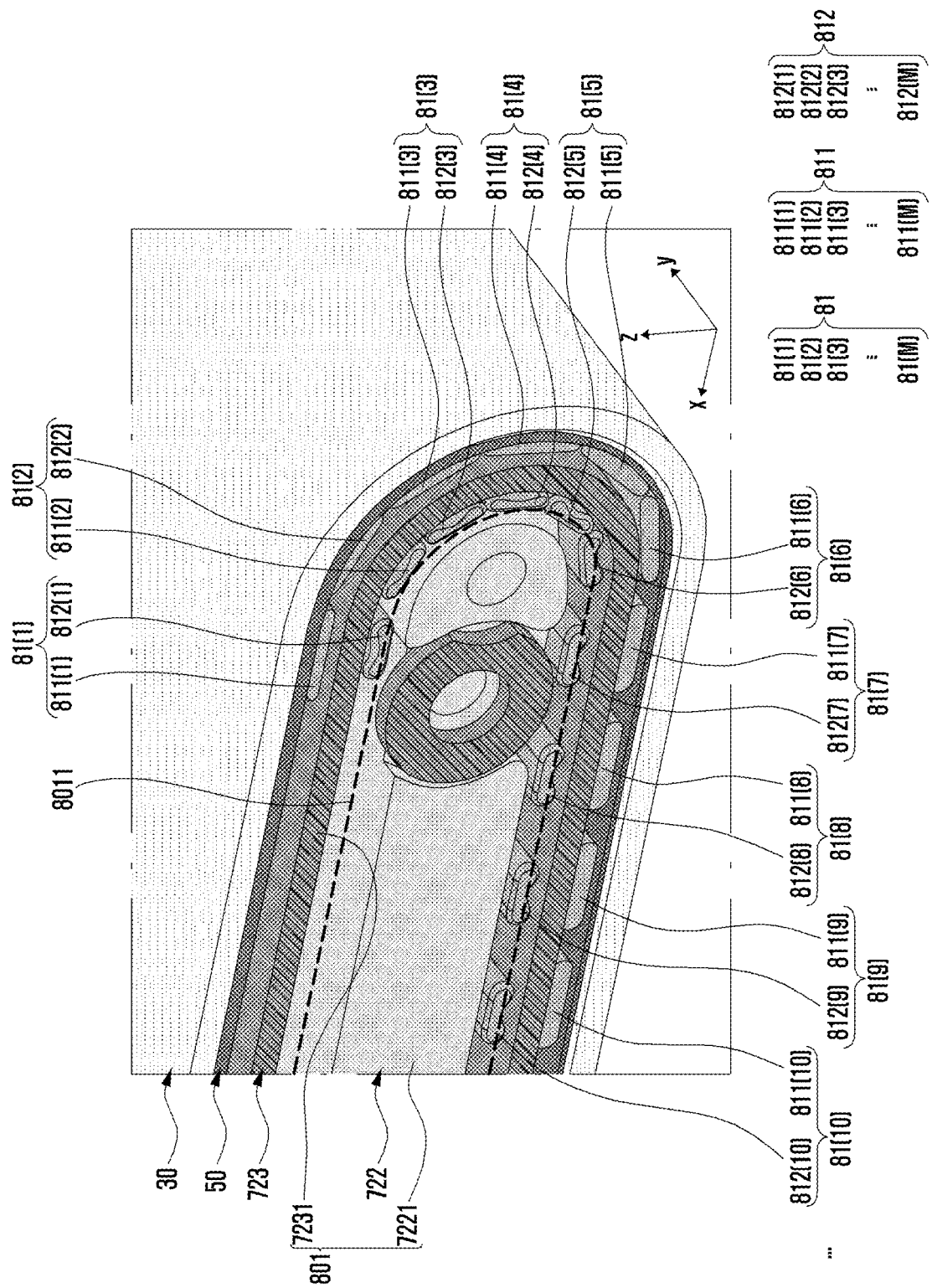
FIG. 8 is a partial cross-sectional view of a slidable electronic device according to an embodiment.

FIGS. 6 and 7 are exploded perspective views of the slidable electronic device 2 according to an embodiment. FIG. 8 is a partial cross-sectional view of the slidable electronic device 2, according to an embodiment.

With reference to FIGS. 6 and 7, the slidable electronic device 2 may include the first housing 21, the second housing 22, the flexible display 30, a first printed circuit board 611, a second printed circuit board 612, a third printed circuit board 613, a battery 614, a display support assembly 710, a first support member 721, a second support member 722, a third support member 723, and/or a fourth support member 724.

According to an embodiment, the first support member 721 may be positioned inside the slidable electronic device 2 corresponding to the first housing 21. The first support member 721 may be connected to the first housing 21 or at least a portion of the first support member 721 may be integrally formed with the first housing 21. The first housing 21 may include the first space 214 formed by the first plate 211, the first sidewall 201, the second sidewall 202, and the third sidewall 203. The first support member 721 may be positioned at least partially in the first space 214, and may be connected to the first plate 211, the first sidewall 201, the second sidewall 202, and/or the third sidewall 203 or formed integrally with at least a portion of one or more thereof. The first housing 21 may include a first mounting structure capable of stably positioning the first support member 721. The first mounting structure may include, for example, a fitting structure or a recess structure that enables the first support member 721 to be stably positioned in the first housing 21 without shaking. In one embodiment, the first support member 721 positioned on the first mounting structure may be coupled to the first housing 21 using a screw fastening or other mechanical fastener(s). In some embodiments, the first support member 721 may be coupled to the first housing 21 using a snap-fit fastening. The snap-fit fastening may be an assembly method used to couple two parts by pushing the two parts' interlocking components together by using elasticity. The snap-fit fastening may include a hook (or a hook structure)(e.g., cantilever snap or snap hook, or U-shaped snap or snap hook) and a hook fastening structure (or an engaging structure) capable of fastening the hook. For example, the hook may be formed on the first support member 721 and the hook fastening structure may be formed on the first housing 21. For another example, the hook may be formed on the first housing 21 and the hook fastening structure may be formed on the first support member 721. In some embodiments, the first mounting structure may be interpreted as including a structure for a screw fastening or a structure for a snap-fit fastening. In some embodiments, the first support member 721 may be coupled to the first housing 21 using bonding, such as by an adhesive material. The first housing 21 and the first support member 721 form a first frame (or a first frame structure or a first framework) capable of withstanding a load, or may serve to ensure the durability or rigidity of the slidable electronic device 2. Electronic components or various members related to the electronic components may be disposed on or supported by the first frame. The first support member 721 is a first inner structure positioned in the internal space of the slidable electronic device 2, corresponding to the first housing 21 and, in some embodiments, may be referred to as various terms, such as a 'first bracket' or a 'first support structure'. In some embodiments, the first support member 721 may be interpreted as a part of the first housing 21.

According to an embodiment, the second support member 722 may be positioned inside the slidable electronic device 2, corresponding to the second housing 22. The second support member 722 may be connected to the second housing 22 or at least a portion of the second support member 722 may be integrally formed with the second housing 22. The second housing 22 may include the second space 224 formed by the second plate 221, the fourth sidewall 204, the fifth sidewall 205, and the sixth sidewall 206. The second support member 722 may be positioned at least partially in the second space 224, and may be connected to the second plate 221, the fourth side wall 204, the fifth side wall 205, and/or the sixth side wall 206 or formed integrally with at least a portion of one or more thereof. The second housing 22 may include a second mounting structure capable of stably positioning the second support member 722. The second mounting structure may include, for example, a fitting structure or a recess structure that enables the second support member 722 to be stably positioned in the second housing 22 without shaking. In an embodiment, the second support member 722 positioned on the second mounting structure may be coupled to the second housing 22 using a screw fastening or other mechanical fastener(s). In some embodiments, the second support member 722 may be coupled to the second housing 22 using a snap-fit fastening. The snap-fit fastening may include a hook (or a hook structure) and a hook fastening structure (or an engaging structure) capable of fastening the hook. For example, the hook may be formed on the second support member 722 and the hook fastening structure may be formed on the second housing 22. For another example, the hook may be formed on the second housing 22 and the hook fastening structure may be formed on the second support member 722. In some embodiments, the second mounting structure may be interpreted as including a structure for a screw fastening or a structure for a snap-fit fastening. In some embodiments, the second support member 722 may be coupled to the second housing 22 using bonding, such as by an adhesive material. The second housing 22 and the second support member 722 form a second frame (or a second frame structure or a second framework) capable of withstanding a load, so that the slidable electronic device 2 may be configured to ensure or increase a durability or rigidity of the slidable electronic device 2. Electronic components or various members or parts of electronic components may be disposed on or supported by the second frame. The second support member 722 is a second inner structure positioned in the internal space of the slidable electronic device 2, corresponding to the second housing 22 and, in some embodiments, may be referred to by various other terms such as a 'second bracket' or a 'support structure'. In some embodiments, the second support member 722 may be interpreted as a part of the second housing 22.

According to an embodiment, the first support member 721 and/or the second support member 722 may be formed from a metal material. The first support member 721 and/or the second support member 722 may be formed from, for example, magnesium, a magnesium alloy, aluminum, an aluminum alloy, a zinc alloy, or a copper alloy. As another example, the first support member 721 and/or the second support member 722 may be formed from titanium, an amorphous alloy, a metal-ceramic composite material (e.g., cermet), or stainless steel. In some embodiments, the first support member 721 and the second support member 722 may be formed from the same metal material. In some embodiments, the first support member 721 may be formed from a first material, and the second support member 722 may be formed from a second material different from the first material. In some embodiments, the two different materials may be different metal materials, or different non-metal materials, or one may be a metal material and the other being a non-metal material. Such non-metal materials may include, without limitation, plastics, composites, and the like.

According to some embodiments, the first support member 721 and/or the second support member 722 may include a conductive structure including a metal material and a non-conductive structure including a non-metal material and connected to a first conductive structure.

According to some embodiments, the first support member 721 and/or the second support member 722 may include a first conductive structure including a metal material, and a second conductive structure including a metal material different from the first conductive structure and connected to the first conductive structure.

According to an embodiment, the first support member 721 may include a first support area 7201 (shown in FIG. 6) and a second support area 7202 (shown in FIG. 7) positioned opposite to the first support area 7201. The second support area 7202 may face the first plate 211 of the first housing 21. The first display section ① of the flexible display 30 may be disposed on the first support area 7201. The first display section ① of the flexible display 30 may be disposed on the first support member 721 using, for example, a thermally reactive adhesive material, a photoreactive adhesive material, a general adhesive, a double-sided tape, an organic adhesive material, or the like. The flat area included in the first support area 7201 may serve to form the first flat area S11 (see FIG. 2 or 4) of the screen S. The curved area included in the first support area 7201 may serve to form the first curved part S2 (see FIG. 2 or 4). In one embodiment, a mounting structure for positioning electronic components may be formed in the second support area 7202. For example, the first printed circuit board 611, the second printed circuit board 612, and the third printed circuit board 613 may not overlap each other when viewed above the second support area 7202 (e.g., in the −z axis direction), and the mounting structure may include a fitting structure or a recess structure that enables the first printed circuit board 611, the second printed circuit board 612, and the third printed circuit board 613 to be positioned on the first support member 721 without shaking. The first printed circuit board 611, the second printed circuit board 612, and the third printed circuit board 613 may be positioned on the mounting structure using a screw fastening or other mechanical fastening. In some embodiments, the mounting structure may include a hook structure for a snap-fit fastening to the first printed circuit board 611, the second printed circuit board 612, or the third printed circuit board 613. In one embodiment, the second printed circuit board 612 may be positioned closer to the second sidewall 202 than the third sidewall 203 of the first housing 21, and the third printed circuit board 613 may be positioned closer to the third side wall 203 than the second side wall 202 of the first housing 21. The first printed circuit board 611 may be positioned between the second printed circuit board 612 and the third printed circuit board 613. The first printed circuit board 611 may be electrically connected to the second printed circuit board 612 and the third printed circuit board 613 using an electrical path such as a flexible printed circuit board (FPCB), a cable, or other electrical connector/path. The first printed circuit board 611, the second printed circuit board 612, and/or the third printed circuit board 613 may include or be arranged as, for example, a printed circuit board (PCB), a flexible PCB (FPCB), or a rigid-flexible PCB (RFPCB). In some embodiments, in place of the first printed circuit board 611, the second printed circuit board 612, and the third printed circuit board 613, two printed circuit boards or an integrated (single) printed circuit board may be implemented. That is, the number and arrangement of printed circuit boards incorporated into slidable electronic devices of the present disclosure may be varied without departing from the scope of thereof.

According to an embodiment, the second support member 722 may include a third support area 7203 and a fourth support area 7204. The third support area 7203 may support the second display section ②of the flexible display 30. The fourth support area 7204 may face the second plate 221 of the second housing 22. When the second housing 22 slides, the second display section ② of the flexible display 30 is supported by the third support area 7203 of the second support member 722 and may be withdrawn from the internal space of the housing 20 or retracted into the internal space of the housing 20. In one embodiment, the third support area 7203 may include a flat area 7205 and a curved area 7206. The flat area 7205 of the third support area 7203 may support a portion including the second flat area S12 (see FIG. 4) of the screen S among the second display section ② of the flexible display 30, in the open state of the slidable electronic device 2 or in the sliding of the second housing 22. When the second housing 22 slides out, an area that is not covered by the first support member 721 and supports the flexible display 30 among the flat area 7205 of the third support area 7203 may increase. The curved area 7206 of the third support area 7203 may be positioned, corresponding to the fourth sidewall 204 of the second housing 22. When the second housing 22 slides out or slides in, the second display section ② of the flexible display 30 may be moved in the curved space between the curved area 7206 of the third support area 7203 and the fourth sidewall 204 of the second housing 22. The curved area 7206 of the third support area 7203 may support a portion including the second curved part S3 of the screen S among the second display section ② of the flexible display 30. The curved area 7206 of the third support area 7203 may serve to form the second curved part S3 of the screen S.

According to an embodiment, a mounting structure for positioning electronic components may be formed in the fourth support area 7204 of the second support member 722. For example, the battery 614 may be disposed on the second support member 722, and the mounting structure of the second support member 722 may include a fitting structure or a recess structure that enables the battery 614 to be positioned on the second support member 722 without shaking. The battery 614 may be a device for supplying power to at least one component of the slidable electronic device 2. In some embodiments, and without limitation, the battery 614 may include, for example, a primary cell which is not rechargeable, a secondary cell which is rechargeable, or a fuel cell. In some embodiments, the slidable electronic device 2 may further include an additional battery, and the additional battery may be disposed on the mounting structure of the first support member 721.

According to one embodiment, the display support assembly 710 may be disposed on or coupled to a rear surface of the flexible display 30. The rear surface of the flexible display 30 may refer to a surface positioned opposite to a surface from which light from a display panel including a plurality of pixels is emitted. The display support assembly 710 may serve to form a seamless screen S by reducing a lifting phenomenon of the screen S due to elasticity of the flexible display 30. The display support assembly 710 may ensure smooth movement of the flexible display 30 when the second housing 22 slides.

Reference numeral 601 (shown in FIG. 6) is a cross-sectional view of a display assembly. The display assembly may include, for example, the flexible display 30, a transparent cover 35, an optical transparent adhesive member 36, and/or a display support plate 50. The flexible display 30 may be coupled to the transparent cover 35 using the optical transparent adhesive member 36 (e.g., an optical clear adhesive (OCA), an optical clear resin (OCR), and/or a super view resin (SVR)). The transparent cover 35 (e.g., a window) may cover the flexible display 30 to protect the flexible display 30 from the outside. The transparent cover 35 may be implemented in the form of a thin film having flexibility (e.g., a thin film layer). For example, the transparent cover 35 may include a plastic film (e.g., polyimide film) or thin glass (e.g., ultra-thin glass). In some embodiments, the transparent cover 35 may include a plurality of layers. For example, the transparent cover 35 may have a form in which various coating layers are disposed on a plastic film or a thin-film glass. For example, the transparent cover 35 may have a form in which at least one protective layer or coating layer containing a polymer material (e.g., polyester (PET), polyimide (PI), or thermoplastic polyurethane (TPU)) is disposed on a plastic film or a thin-film glass. The flexible display 30 may include, for example, a display panel 31, a base film 32, a lower panel 33, and/or an optical layer 34. The display panel 31 may be positioned between the optical layer 34 and the base film 32. The base film 32 may be positioned between the display panel 31 and the lower panel 33. The optical layer 34 may be positioned between the optical transparent adhesive member 36 and the display panel 31. Between the display panel 31 and the base film 32, between the base film 32 and the lower panel 33, and/or between the display panel 31 and the optical layer 34, various polymer adhesive members (not illustrated) may be disposed. The display panel 31 may include a light-emitting layer 31a and a thin film transistor (TFT) film (or TFT substrate) 31b, and/or an encapsulation (e.g., thin-film encapsulation (TFE)) 31c. The light-emitting layer 31a may include, for example, a plurality of pixels implemented by light-emitting elements, such as OLEDs or micro LEDs. The light-emitting layer 31a may be disposed on the TFT film 31b through organic material evaporation. The TFT film 31b may be positioned between the light-emitting layer 31a and the base film 32. The TFT film 31b may refer to a structure in which at least one TFT is disposed on a flexible substrate (e.g., a PI film) through a series of processes, such as deposition, patterning, and etching. At least one TFT may control current to a light-emitting element of the light-emitting layer 31a to turn on or off a pixel or to adjust brightness of a pixel. At least one TFT may be implemented by, for example, an amorphous silicon (a-Si) TFT, a liquid crystalline polymer (LCP) TFT, a low-temperature polycrystalline oxide (LTPO) TFT, or a low-temperature polycrystalline silicon (LTPS) TFT. The display panel 31 may include a storage capacitor. The storage capacitor may maintain a voltage signal to a pixel, may maintain a voltage applied to a pixel within one frame, or may reduce a change in a gate voltage of the TFT due to leakage during a light emission time. By a routine for controlling at least one TFT (e.g., initialization or data write), the storage capacitor is configured to maintain the voltage applied to a pixel at regular time intervals. In one embodiment, the display panel 31 may be implemented based on an OLED, and the encapsulation layer 31c may cover the light-emitting layer 31a. An organic material and an electrode that emit light in an OLED react very sensitively with oxygen and/or moisture, and may lose their luminous properties. In order to prevent such loss, the encapsulation layer 31c may seal the light-emitting layer 31a such that oxygen and/or moisture do not penetrate into the OLED. The base film 32 may include a flexible film formed of a polymer, such as polyimide or polyester (PET) or a plastic. The base film 32 may support and protect the display panel 31. In some embodiments, the base film 42 may be referred to as a protective film, a back film, or a back plate. The lower panel 33 may include a plurality of layers for various functions. Various polymer adhesive members (not illustrated) may be disposed between the plurality of layers included in the lower panel 33. The lower panel 33 may include, for example, a light-blocking layer 33a, a buffer layer 33b, and/or a lower layer 33c. The light-blocking layer 33a may be positioned between the base film 32 and the buffer layer 33b. The buffer layer 33b may be positioned between the light-blocking layer 33a and the lower layer 33c. The light-blocking layer 33a may block at least some of light incident from the outside. For example, the light-blocking layer 33a may include an embo layer. The embo layer may be a black layer including an uneven pattern. The buffer layer 33b may alleviate an external impact applied to the flexible display 30. For example, the buffer layer 33b may include a sponge layer or a cushion layer. The lower layer 33c may diffuse, disperse, or dissipate heat generated from the flexible electronic device 2 or the flexible display 30. The lower layer 33c may absorb or block electromagnetic waves. The lower layer 33c may alleviate an external impact applied to the electronic device 2 or the flexible display 30. For example, the lower layer 33c may include a composite sheet 33d or a copper sheet 33e. In one embodiment, the composite sheet 33d may be a sheet obtained by combining layers or sheets having different properties. For example, the composite sheet 33d may include at least one of polyimide and graphite. The composite sheet 33d may also be replaced by a single sheet containing a single material (e.g., polyimide or graphite). The composite sheet 33d may be positioned between the buffer layer 33b and the copper sheet 33e. The copper sheet 33e may be replaced with a variety of other metal sheets. In some embodiments, at least a portion of the lower layer 33c is a conductive member (e.g., a metal plate), which may help reinforce the rigidity of the slidable electronic device 2, may be used in order to block ambient noise, and/or to dissipate heat emitted from surrounding heat-emitting components (e.g., a display-driving circuit (e.g., a DDI)). For example, the conductive layer may include at least one of copper (Cu), aluminum (Al), stainless steel (SUS), and a CLAD (e.g., a lamination member in which SUS and Al are alternately disposed). The lower layer 33c may include various layers for various other functions. According to various embodiments (not illustrated), at least one additional polymer layer (e.g., a layer including PI, PET, or TPU) may be further disposed on the rear surface of the display panel 31 in addition to the base film 32. According to various embodiments, at least one of the plurality of layers included in the lower panel 33 (e.g., the light-blocking layer 33a, the buffer layer 33b, the composite sheet 33d, and/or the copper sheet 33e) may be omitted. According to various embodiments, the arrangement order of the plurality of layers included in the lower panel 33 is not limited to the embodiment of FIG. 4, and may be variously changed. The optical layer 34 may include, for example, a polarizing layer (or a polarizer) and/or a retardation layer (or a retarder). The polarization layer and/or the retardation layer may improve outdoor visibility of a screen. For example, the optical layer 34 may selectively pass light generated from a light source of the display panel 31 and vibrate in a predetermined direction. In some embodiments, a single layer obtained by combining a polarizing layer and a retardation layer may be provided, and such a layer may be defined as a "circularly polarizing layer". The optical transparent adhesive member 36 may be positioned between the transparent cover 35 and the optical layer 34. In some embodiments, the polarizing layer (or circularly polarizing layer) may be omitted, and in this case, a black pixel define layer (PDL) and/or a color filter may be provided in place of the polarizing layer. The slidable electronic device 2 may include a touch-sensitive circuit (e.g., a touch sensor) (not illustrated). The touch-sensitive circuit may be implemented as a transparent conductive layer (or film) based on various conductive materials, such as indium tin oxide (ITO). In one embodiment, the touch-sensitive circuit may be positioned between the transparent cover 35 and the optical layer 34 (e.g., an add-on type). In another embodiment, the touch-sensitive circuit may be disposed between the optical layer 34 and the display panel 31 (e.g., an on-cell type). In another embodiment, the display panel 31 may include a touch-sensitive circuit or a touch-sensitive function (e.g., an in-cell type). In some embodiments, the display panel 31 may be based on an OLED, and may include an encapsulation layer 31c disposed between the light-emitting layer 31a and the optical layer 34. The encapsulation layer 31c may serve as a pixel protection layer for protecting a plurality of pixels of the light-emitting layer 31a. In one embodiment (not illustrated), the flexible display 30 may include a conductive pattern, such as a metal mesh (e.g., an aluminum metal mesh) as a touch-sensitive circuit disposed on the encapsulation layer 31c between the encapsulation layer 31c and the optical layer 34. For example, in response to the bending of the flexible display 30, the metal mesh may have greater durability than a transparent conductive layer made of ITO.

In some embodiments, the flexible display 30 may further include a pressure sensor (not illustrated) capable of measuring the intensity (pressure) of a touch. A plurality of layers included in the display panel 31 or the lower panel 31, or a laminating structure or laminating order thereof may vary. The flexible display 30 may be implemented by omitting some of the components or adding other components according to the form of provision thereof or the trend of convergence.

According to one embodiment, the display support plate 50 may be included in the display support assembly 710 and may be disposed on the rear surface of the flexible display 30. For example, the display support plate 50 may cover at least a portion of the lower panel 33 of the flexible display 30 and be attached to the rear surface of the lower panel 33. The display support plate 50 may be coupled to the flexible display 30 using an adhesive material. The adhesive material may include, for example, a thermally reactive adhesive material, a photoreactive adhesive material, a general adhesive, and/or a double-sided tape. As another example, the adhesive material may include various polymers such as triazine thiol, dithiopyrimitine, silane-based compounds, or organic adhesive materials such as sealants.

According to an embodiment, the display support plate 50 may support the flexible display 30 between the flexible display 30 and the third support area 7203 of the second support member 722. When the second housing 22 slides out, an area that is not covered by the first support member 721 among the flat area 7205 of the third support area 7203 included in the second support member 722 and supports the display support plate 50 may increase. When the second housing 22 slides out or slides in, the display support plate 50 may be moved while rubbing against the third support area 7203 of the second support member 722. When the second housing 22 slides out or slides in, the second support member 722 may move while rubbing against the display support plate 50. The display support plate 50 supports the second display section ② so that the second display section ② does not lift due to the elasticity of the flexible display 30, so that the display support plate 50 may serve to enable the second display section ② to maintain in a form seamlessly connected to the first display section ①. When the second housing 22 slides, the display support plate 50 may serve to enable the second display section ② to move while maintaining a form seamlessly connected to the first display section ①.

According to an embodiment, the display support plate 50 may serve to increase or provide a durability (e.g., rigidity reinforcement) of the flexible display 30. The display support plate 50 may reduce the effect of load or stress that may occur when the second housing 22 slides on the flexible display 30. The display support plate 50 may serve to prevent the flexible display 30 from being damaged by the force transmitted therefrom when the second housing 22 slides. The display support plate 50 may be referred to as various other terms such as a 'display support member' or a 'display support structure'.

According to an embodiment, the display support plate 50 may be formed from a metal material. For example, the display support plate 50 may be formed from stainless steel. In other embodiments, the display support plate 50 may include or be formed from various other metal materials. Further still, in some embodiments, the display support sheet 50 may be formed from a non-metal or non-metallic material, including, without limitation, an engineering plastic.

According to an embodiment, the slidable electronic device 2 may include a rail part (or a guide rail) for guiding movement of the display support assembly 710. The third support member (or a third support structure) 723 may be positioned in the second space 224 of the second housing 22 and connected to the fifth sidewall 205 of the second housing 22. The fourth support member (or a fourth support structure) 724 may be positioned in the second space 224 of the second housing 22 and connected to the sixth sidewall 206 of the second housing 22. In one embodiment, the slidable electronic device 2 may include a first guide rail 801 (see FIG. 8) on which one side of the display support assembly 710 is positioned to guide its movement, and a second guide rail (not illustrated) on which the other side of the display support assembly 710 is positioned to guide its movement. The second guide rail may be substantially similar in structure as the first guide rail 801. The first guide rail 801 and the second guide rail may be formed symmetrically based on a center line of the slidable electronic device 2 (e.g., a line serving as a reference for symmetry with respect to the screen S) extending in the slide-out or slide-in direction (e.g., the x-axis direction) of the second housing 22. In one embodiment, the first guide rail 801 (see FIG. 8) may be formed by the second support member 722 and the third support member 723, and the second guide rail (not illustrated) may be formed by the second support member 722 and the fourth support member 724. With reference to FIG. 8, the second support member 722 may include a first insert structure 7221 inserted into a first recess structure 7231 included in the third support member 723. The first recess structure 7231 may include, for example, a first recess in a shape of a cut in a third direction (e.g., the +y axis direction) orthogonal to the slide-out direction of the second housing 22 and orthogonal to the direction in which the screen S (see FIG. 2 or 4) is oriented. FIG. 8 illustrates a cross-sectional structure of the first recess structure 7231, and although not illustrated, the first recess structure 7231 may include a portion that is positioned between the first insert structure 7221 of the second support member 722 and the fifth sidewall 205 of the second housing 22 and is connected or fastened to the first insert structure 7221 and the fifth sidewall 205. The first insert structure 7221 may include, for example, a first insert that protrudes in a third direction (e.g., the +y axis direction) and is inserted into the first recess. The first guide rail 801 may include the first insert structure 7221 and the first recess structure 7231. The first guide rail 801 may include a first space (hereinafter referred to as a 'first rail part') in the form of a rail formed between the first insert of the first insert structure 7221 and the first recess of the first recess structure 7231, corresponding to a designated movement path of the display support assembly 710 (e.g., see dotted line indicated by reference number '8011'). One side of the display support assembly 710 may be positioned on the first rail part of the first guide rail 801. The second guide rail may include the second insert structure 7222 of the second support member 722 (FIG. 7) and the second recess structure (not illustrated) of the fourth support member 724, in substantially the same manner as the first guide rail 801. The second recess structure may include, for example, a second recess having a shape of a cut in a fourth direction opposite to the third direction (e.g., the −y axis direction). The second insert structure may include, for example, a second insert that protrudes in the fourth direction and is inserted into the second recess. The second guide rail may include a second space (hereinafter referred to as a 'second rail part') in the form of a rail formed between the second insert of the second insert structure 7222 and the second recess of the second recess structure, corresponding to a designated movement path of the display support assembly 710. The other side of the display support assembly 710 may be positioned on the second rail part of the second guide rail. When the second housing 22 slides, the display support assembly 710 may be guided and moved by the first guide rail 801 and the second guide rail. In some embodiments, the first guide rail 801 may be formed by the fifth sidewall 205 of the second housing 22 and the third support member 723 may be omitted. In some embodiments, the second guide rail may be formed by the sixth sidewall 206 of the second housing 22 and the fourth support member 724 may be omitted.

According to an embodiment, the display support assembly 710 may include a first guide pin structure part 81 corresponding to the first guide rail 801 and a second guide pin structure part (not illustrated) corresponding to the second guide rail, with the second guide pin structure part being substantially similar to the first guide pin structure part 81. The first guide pin structure 81 may include a plurality of first guide pin structures 81(1), 81(2), 81(3), . . . , and 81(M). The first guide pin structures 81 will be described with respect to, for example, a first guide pin structure 81(M), with each first guide pin structure 81 being substantially similar to each other. Looking at the first guide pin structure 81(M), the first guide pin structure 81(M) may include, for example, a first fixing part (or a first support part) 811(M) and a first guide pin 812(M). The first guide pin 812(M) may extend from the first fixing part 811(M) or be connected to the first fixing part 811(M). In one embodiment, the first guide pin structure 81(M) may be an integral metal member including the first fixing part 811(M) and the first guide pin 812(M). In some embodiments, the first guide pin structure 81(M) may include or be formed from a non-metal material, such as an engineering plastic. In some embodiments, the first fixing part 811(M) and the first guide pin 812(M) may include or be formed from different materials. For example, the first fixing part 811(M) may include or be formed from a metal material, and the first guide pin 812(M) may include or be formed from a non-metal material (e.g., polymer). For another example, the first fixing part 811(M) may include or be formed from a non-metal material, and the first guide pin 812(M) may include or be formed from a metal material. For another example, the first fixing part 811(M) and the first guide pin 812(M) may include or be formed from different metal materials or different non-metal materials. The first guide pin 812(M) may be coupled to the first fixing part 811(M) using a scheme such as a mechanical fastening (e.g., screw or snap) or bonding (e.g., adhesive), or other coupling means or mechanism. The first guide pin 812(M) may be formed using various polymers such as POM (e.g., poly oxymetaylene acetal) and coupled to the first fixing part 811(M). For another example, the first guide pin 812(M) may be implemented in a form coupled to the first fixing part 811(M) by using insert injection molding. The remaining first guide pin structures 81(1), 81(2), . . . , and 81(M−1) may be formed in substantially the same shape and form as the first guide pin structure 81(M) described above. The plurality of first fixing parts 811(1), 811(2), 811(3), . . . , and 811(M) may be coupled to the display support plate 50 using various methods such as bonding or welding. The plurality of first fixing parts 811(1), 811(2), 811(3), . . . , and 811(M) may be at least partially interposed between the display support plate 50 and the third support member 723. A plurality of first guide pins 812(1), 812(2), 812(3), . . . , and 812(M) may be inserted or positioned on the first guide rail 801. The second guide pin structure may include a plurality of second guide pin structures. The second guide pin structure may be formed substantially the same as the first guide pin structure 81(M). The second guide pin structure may include, for example, a second fixing part (or a second support part) connected to the support plate, and a second guide pin extending from or connected to the second fixing part to be inserted or positioned in the second guide rail. In one embodiment, the plurality of first guide pin structures 81(1), 81(2), 81(3), . . . , and 81(M) and the plurality of second guide pin structures may be symmetrically formed based on a center line of the slidable electronic device 2 (e.g., a line serving as a reference for symmetry with respect to the screen S). The shape of the guide pin structures is not limited to the illustrated example and may be formed in various other shapes corresponding to the guide rail. When the second housing 22 slides, the first guide rail 801 may guide the plurality of first guide pins 812(1), 812(2), 812(3), . . . , and 812(M) of the plurality of first guide pin structures 81(1), 81(2), 81(3), . . . , and 81(M) to be moved along the designated movement path without departing from the designated movement path. When the second housing 22 slides, the second guide rail may guide the plurality of second guide pins of the plurality of second guide pin structures to be moved along the designated movement path without departing from the designated movement path.

According to some embodiments, the plurality of first guide pin structures 81(1), 81(2), 81(3), . . . , and 81(M) and the plurality of second guide pin structures may be integrally formed with the display support plate 50, and may include the same material (e.g., metal material) as the display support plate 50.

According to an embodiment, in order to reduce the friction force between the plurality of first guide pins 812(1), 812(2), 812(3), . . . , and 812(M) of the plurality of first guide pin structures 81(1), 81(2), 81(3), . . . , and 81(M) and the first guide rail 801, and the friction force between the plurality of second guide pins of the plurality of second guide pin structures and the second guide rail, a lubricant (e.g., grease) may be placed (or applied) to the first guide rail 801 and the second guide rail. In some embodiments, the surfaces of the plurality of first guide pins 812(1), 812(2), 812(3), . . . , and 812(M) and the surfaces of the plurality of second guide pins, or the surface of the first guide rail 801 and the surface of the second guide rail may be formed with a lubricating coating. For example, the surfaces of the plurality of first guide pins 812(1), 812(2), 812(3), . . . , and 812(M) and the surfaces of the plurality of second guide pins, or the surface of the first guide rail 801 and the surface of the second guide rail may be formed with coatings of various lubricating materials such as a tetrafluoroethylene material (e.g., polytetrafluoroethylene (PTFE), also known as Teflon) coating.

According to some embodiments, at least some of the plurality of first guide pins 812(1), 812(2), 812(3), . . . , and 812(M) of the plurality of first guide pin structures 81(1), 81(2), 81(3), . . . , and 81(M) may be implemented by being modified in a form including a first rotation member such as a roller and a shaft on which the first rotation member is rotatably positioned. At least some of the plurality of second guide pins of the plurality of second guide pin structures may be implemented by being modified into a form including a second rotation member such as a roller and a shaft on which the second rotation member is rotatably positioned. When the second housing 22 slides, one or more first rotation members positioned on the plurality of first guide pin structures 81(1), 81(2), 81(3), . . . , and 81(M) are guided by the first guide rail 801 to be moved and positioned, and may be rotated due to friction with the first guide rail 801.

When the second housing 22 slides, one or more second rotation members positioned on the plurality of second guide pin structures are guided by the second guide rail to be moved and positioned, and may be rotated due to friction with the second guide rail.

Figure 9:
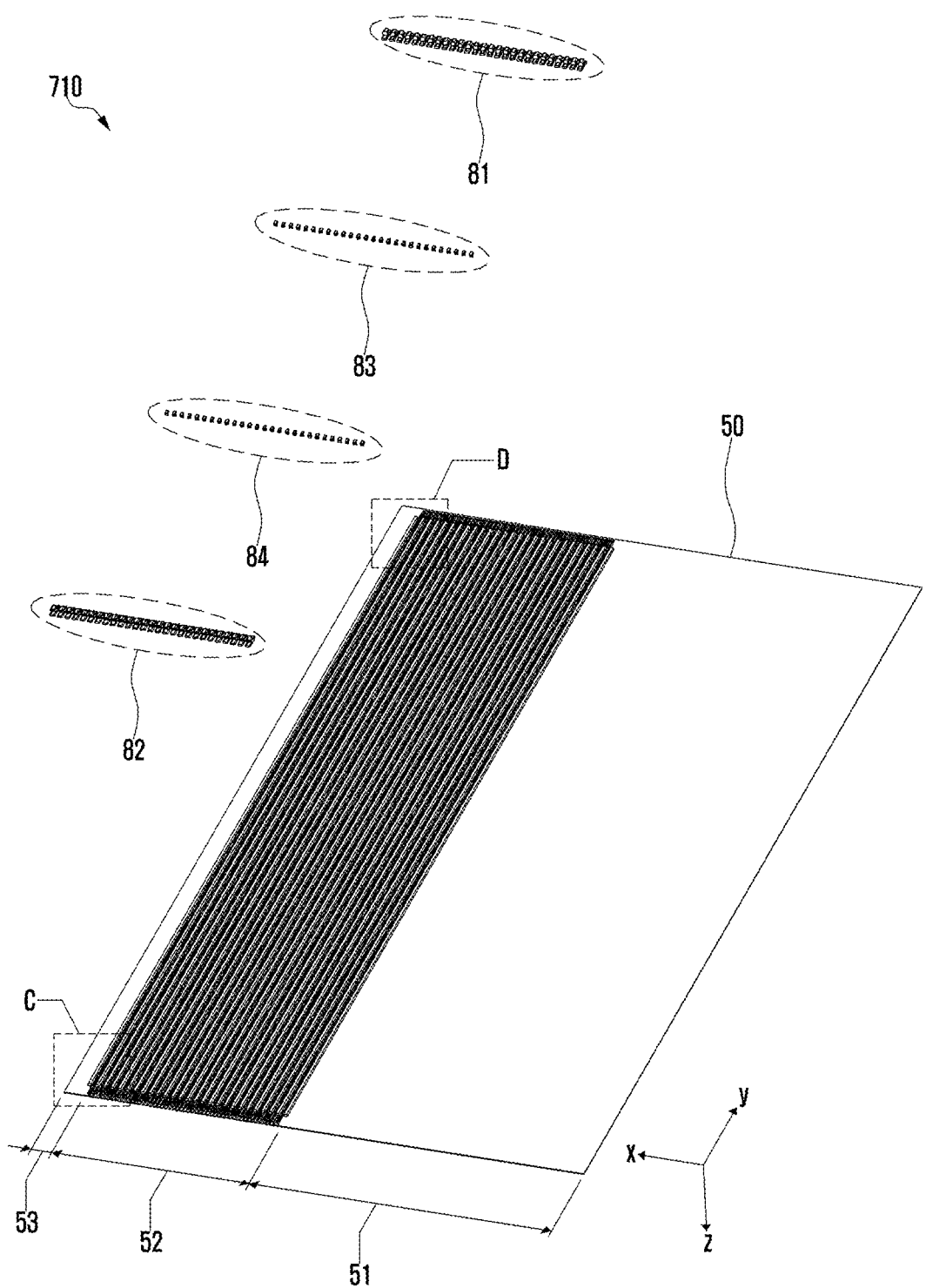
FIG. 9 is an exploded perspective view of the display support assembly of FIG. 7 according to one embodiment.
Figure 10:
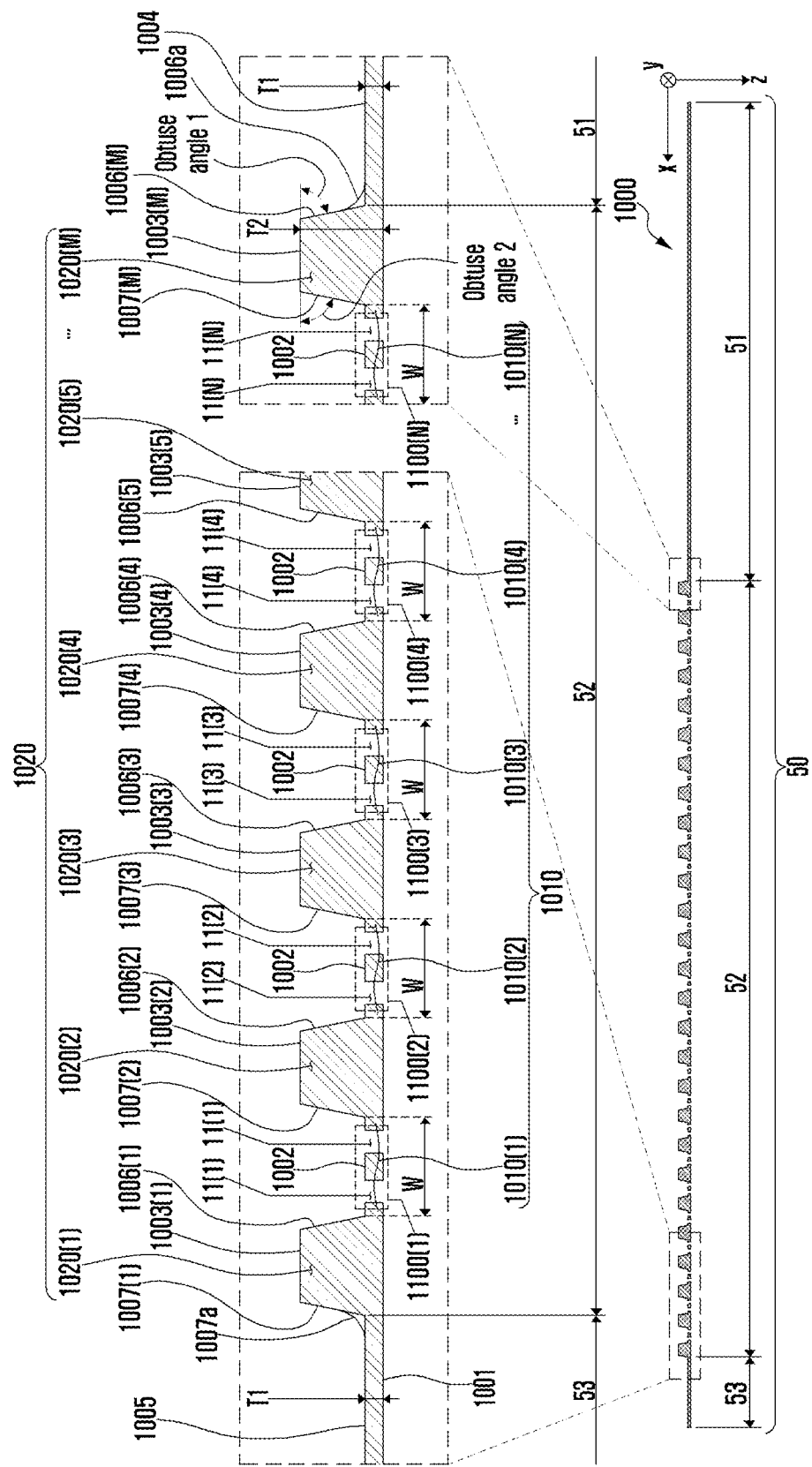
FIG. 10 is a cross-sectional view of the display support plate of FIG. 9 according to one embodiment.
Figure 11:
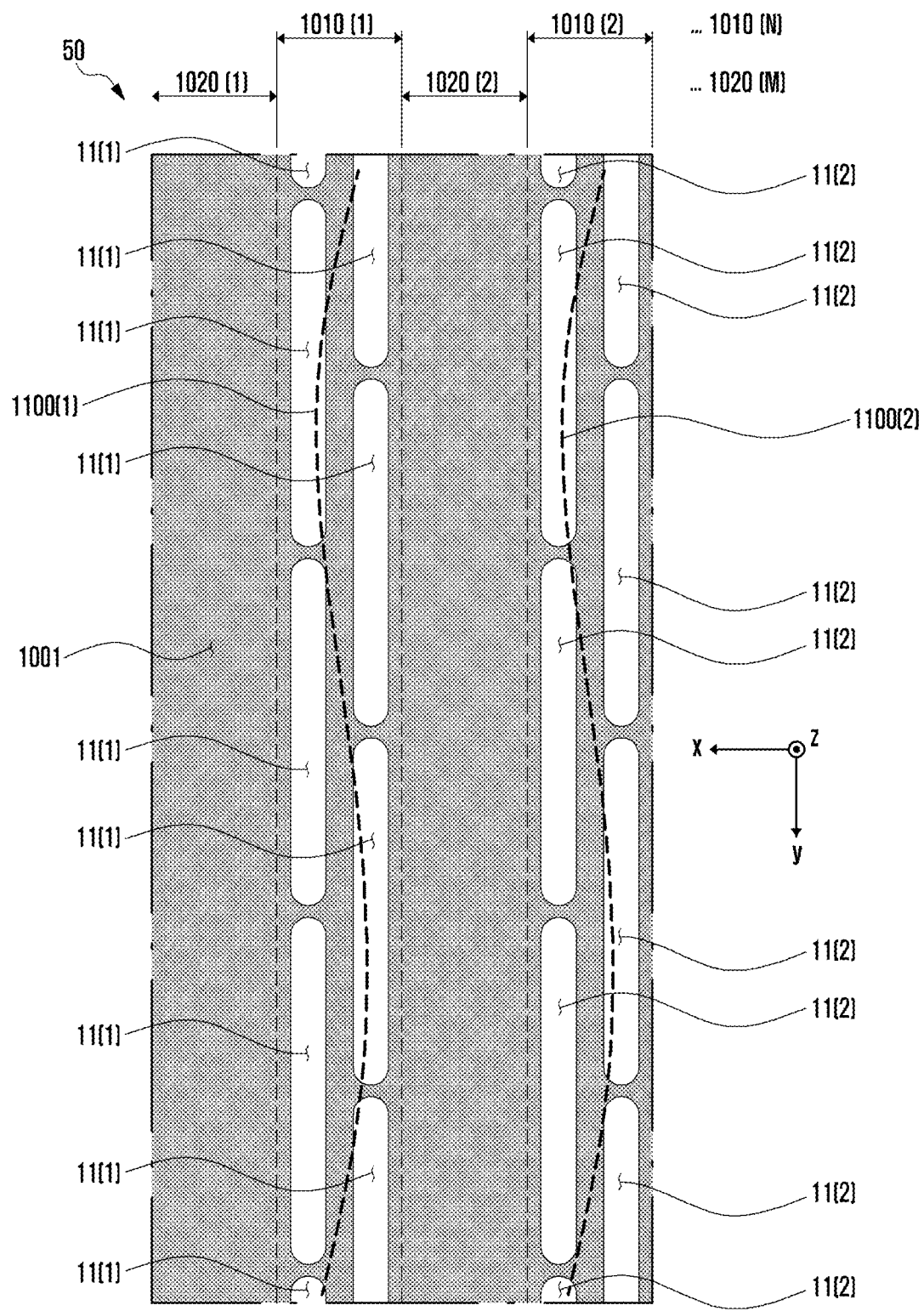
FIG. 11 is a view illustrating a display support plate according to an embodiment.
Figure 12:
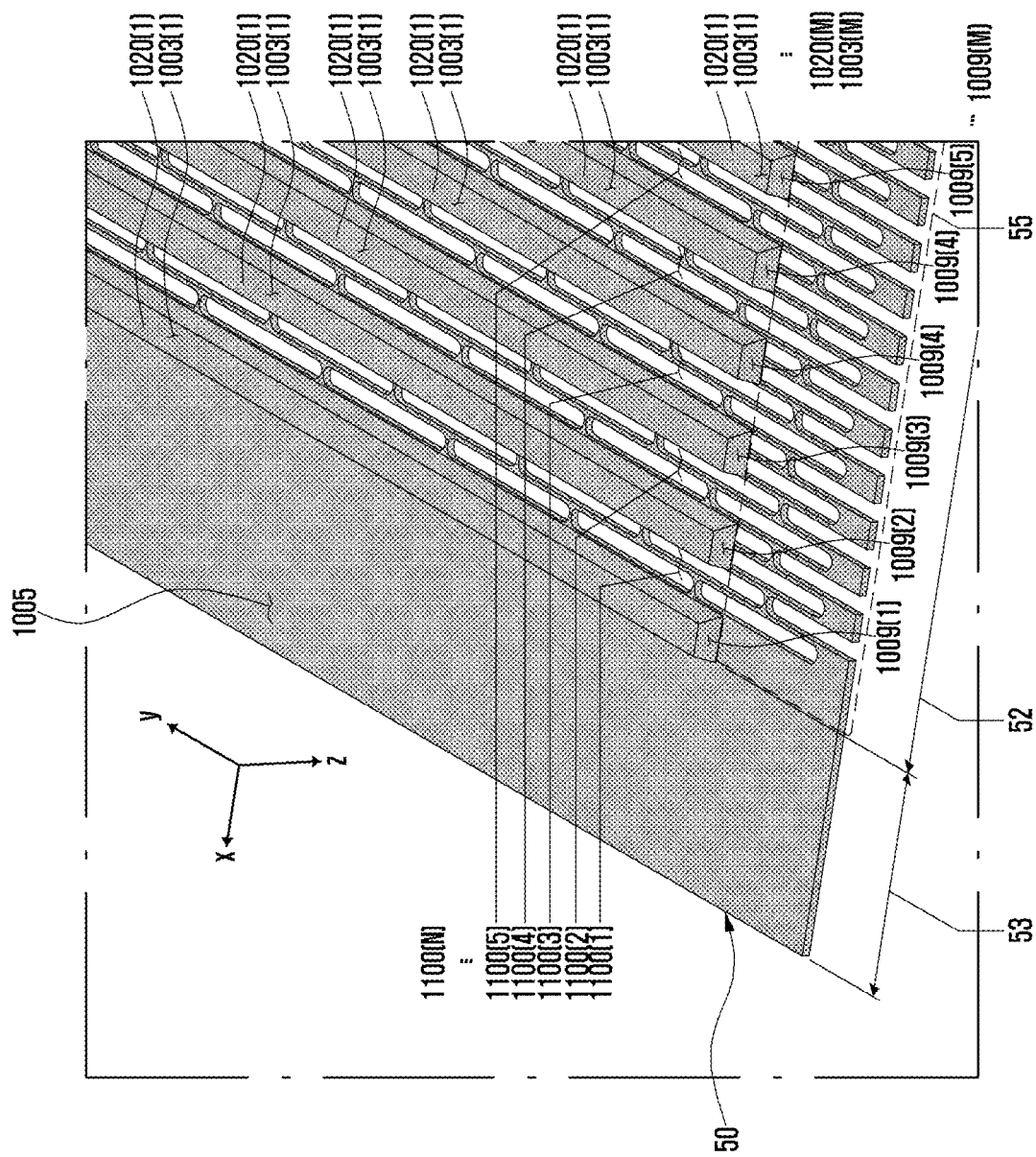
FIG. 12 is an enlarged view of a portion indicated by reference numeral 'C' in the display support plate of FIG. 9 according to an embodiment.
Figure 13:
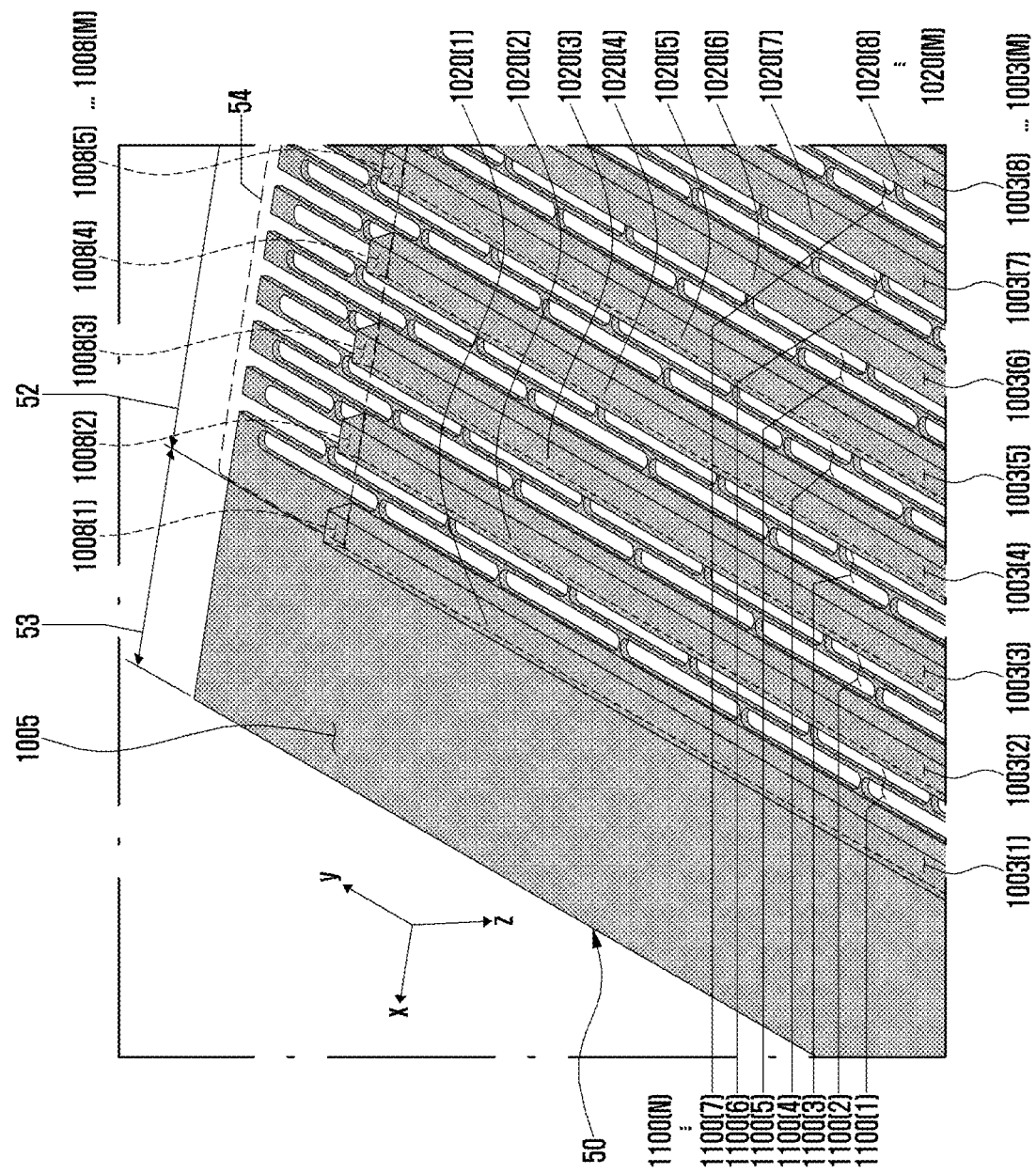
FIG. 13 is an enlarged view of a portion indicated by reference numeral 'D' in the plate of FIG. 9 according to an embodiment.
Figure 14:
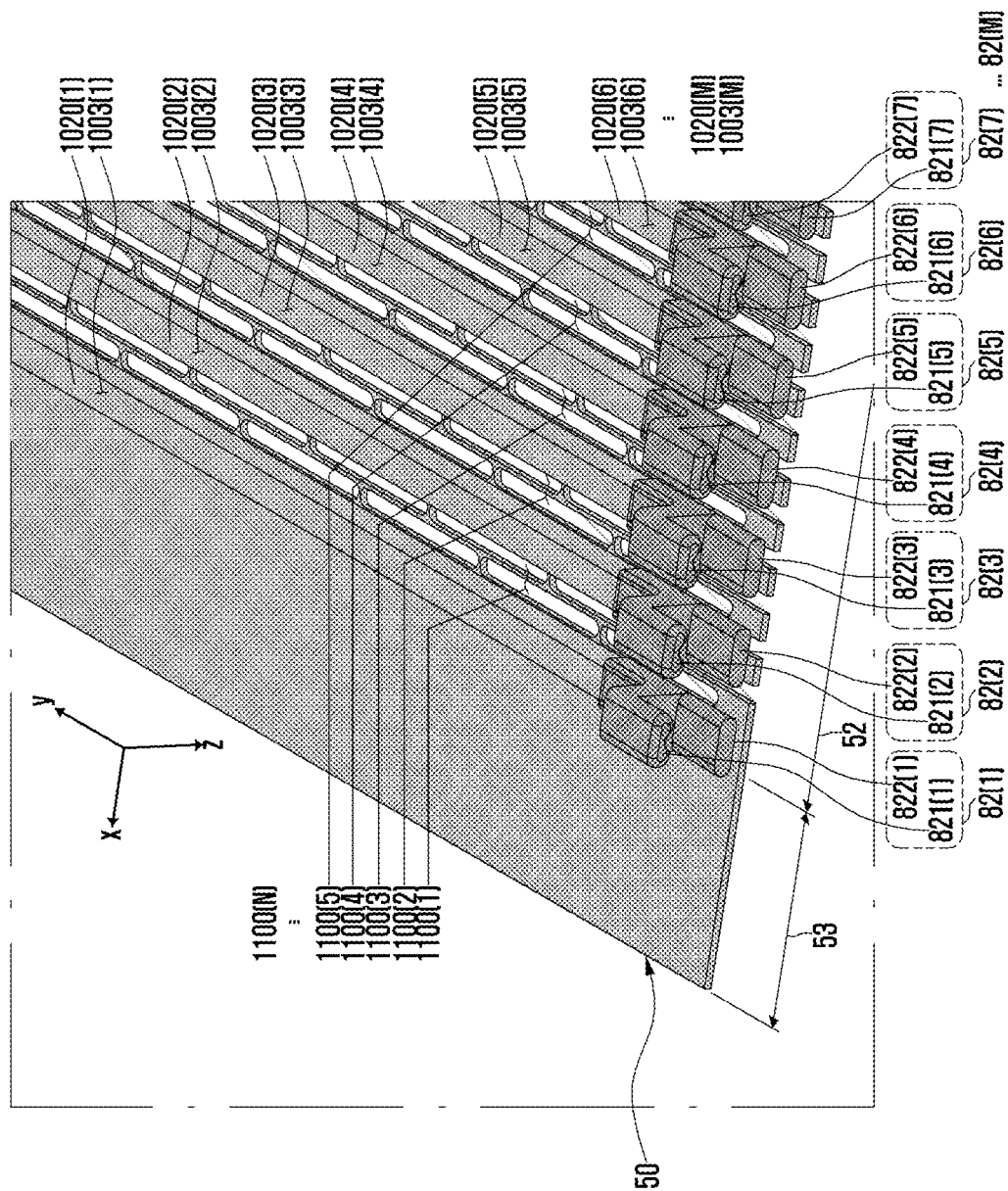
FIGS. 14, 15, and 16 are perspective views of a display support assembly, according to one embodiment.
Figure 15:
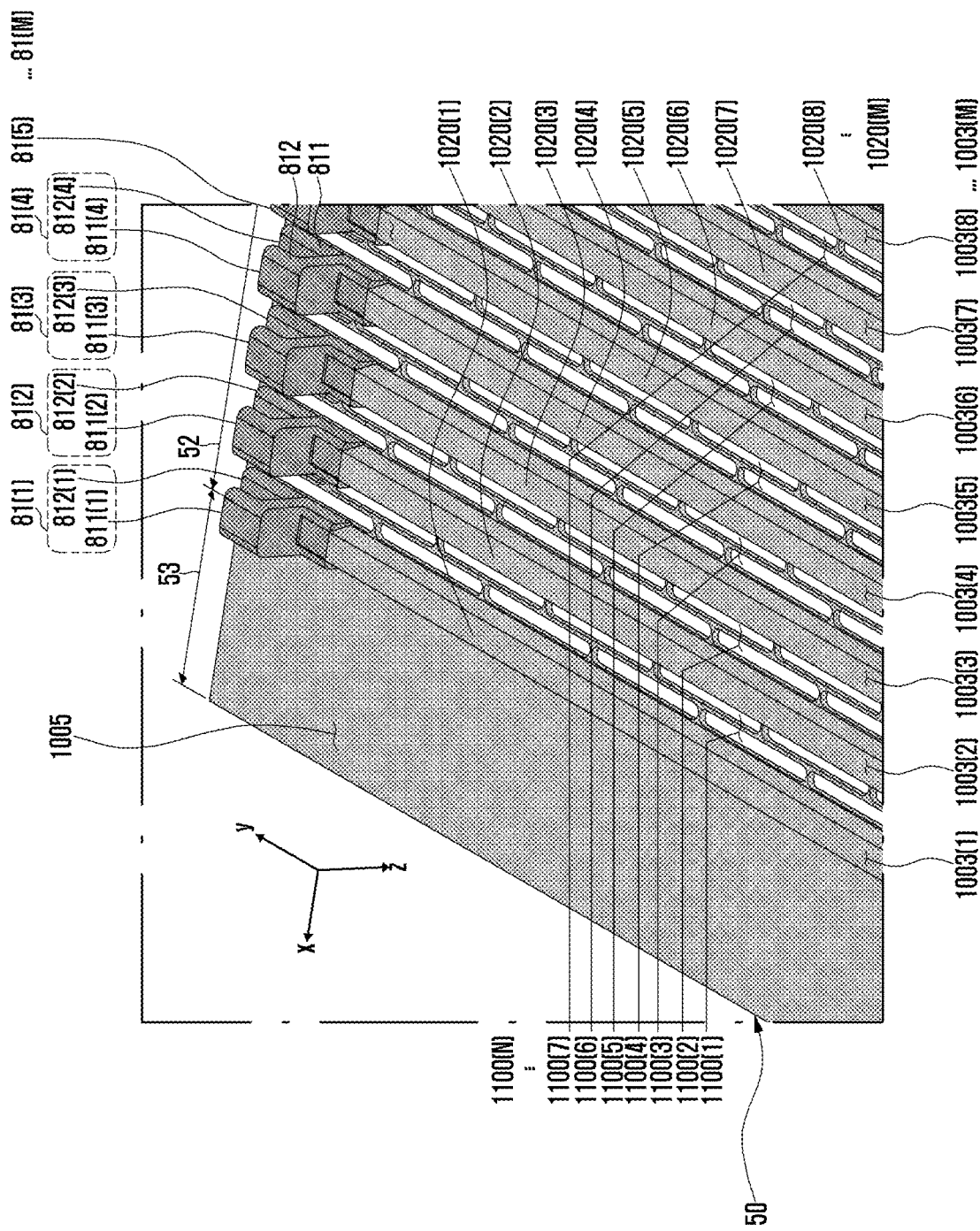
Figure 16:
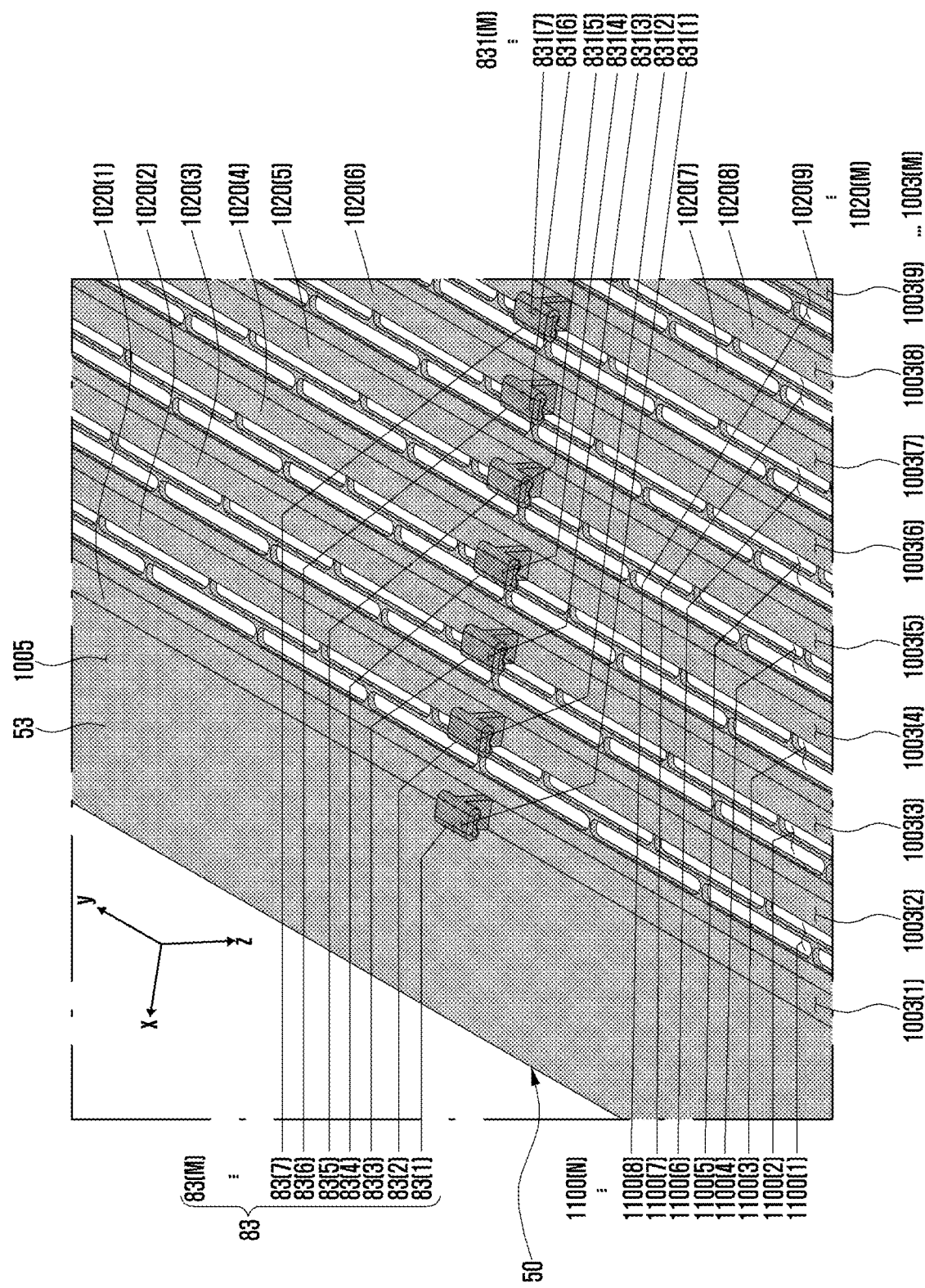

FIG. 9 is an exploded perspective view of the display support assembly 710 of FIG. 7 according to an embodiment. FIG. 10 is a cross-sectional view 1000 of the display support plate 50 of FIG. 9 according to an embodiment. FIG. 11 is a view illustrating the display support plate 50 according to an embodiment. FIG. 12 illustrates an enlarged view of a portion indicated by reference numeral 'C' in the display support plate 50 of FIG. 9 according to an embodiment. FIG. 13 illustrates an enlarged view of a portion indicated by reference numeral 'D' in the plate 50 of FIG. 9 according to an embodiment. FIGS. 14, 15, and 16 are perspective views of the display support assembly 710, according to an embodiment.

With reference to FIGS. 9, 10, 11, 12, 13, 14, 15, and 16, in one embodiment, the display support assembly 710 may include the display support plate 50, the first guide pin structure 81 (FIG. 15), a second guide pin structure 82 (FIG. 14), a third guide pin structure 83 (FIG. 16), and/or a fourth guide pin structure 84. FIGS. 9 and 10 illustrate the unfolded state of the display support plate 50, and the z coordinate axis may correspond to the thickness direction of the display support plate 50.

According to an embodiment, the display support plate 50 may include a first area 51, a second area 52, and/or a third area 53. The second area 52 may be an area between the first area 51 and the third area 53 of the display support plate 50. The first area 51 may overlap and be combined with the first display section ① of the flexible display 30 (see FIG. 3, 5, or 6). The second area 52 may overlap and be combined with the second display section ② of the flexible display 30 (see FIG. 3, 5, or 6). The third area 53 may overlap and be combined with the second display section ② of the flexible display 30. In some embodiments, the third area 53 may protrude and extend with respect to the second display area ② without overlapping with the second display area ② of the flexible display 30. In one embodiment, the display support plate 50 may be formed with an integral metal plate (e.g., a plate including stainless steel) including the first area 51, the second area 52, and the third area 53. In some embodiments, the display support plate 50 may be formed with an integral non-metal plate (e.g., a plate including an engineering plastic) including the first area 51, the second area 52, and the third area 53. In some embodiments, the second area 51 may be formed separately from the first area 52 and connected to the first area 52 using an adhesive material. In some embodiments, the second area 51 may be formed separately from the third area 53 and connected to the third area 53 using an adhesive material. In some embodiments, the first area 51, the second area 52, and the third area 53 are formed separately, and the second area 52 may be connected to the first area 51 and the third area 53 using an adhesive material that is part of the second area 52 or separate therefrom. In some embodiments, the second area 52 and the third area 53 are integrally formed and formed separately from the first area 51, so that the second area 52 may be connected to the first area 51 by using an adhesive material. In some embodiments, the first area 51 and the second area 53 are integrally formed and formed separately from the third area 53, so that the second area 52 may be connected to the third area 53 by using an adhesive material. In some embodiments, the third area 53 of the display support plate 50 may be omitted.

According to an embodiment, the second area 52 of the display support plate 50 may have a form in which first and second portions having different thicknesses are repeatedly arranged. The first portion and the second portion may define a repeating pattern. As shown in FIG. 10, the second area 52 may include, for example, a first thickness part 1010 which includes a plurality of first portions 1010(1), 1010(2), 1010(3), . . . , and 1010(N) having a first thickness T1. The second area 52 may also include a second thickness part 1020 which includes a plurality of second portions 1020(1), 1020(2), 1020(3), . . . , and 1020(M) having a second thickness T2. The second area 52 may be formed in an integral shape including the first thickness part 1010 and the second thickness part 1020, and the first thickness part 1010 and the second thickness part 1020 may be formed from the same material. In some embodiments, and as shown in FIG. 10, the second area 52 may be formed having elements of the first thickness part 1010 (e.g., first portions 1010(1) . . . 1010(N)) and the second thickness part 1020 (e.g., second portions 1020(1) . . . 1020(M)) arranged in an alternating pattern. The display support plate 50 may include a first surface 1001 connected to a rear surface (e.g., the rear surface of the copper sheet 33e in FIG. 6) facing opposite to a surface of the flexible display 30 that is visually exposed through the transparent cover 35 (see FIG. 6). The illustrated x-axis coordinate axis and y-axis coordinate axis may correspond to the first surface 1001 disposed substantially flat in a state in which the display support plate 50 is unfolded (i.e., in a plane defined by the x-axis and the y-axis). The plurality of first portions 1010(1), 1010(2), 1010(3), . . . , and 1010(N) may have the first thickness T1 relative to the first surface 1001. The plurality of second portions 1020(1), 1020(2), 1020(3), . . . , and 1020(M) may have the second thickness T2 relative to the first surface 1001. The second area 52 may include a second surface 1002 and a plurality of third surfaces 1003(1), 1003(2), 1003(3), . . . , and 1003(M), positioned opposite to the first surface 1001. The second surface 1002 may be formed by the first thickness part 1010 (e.g., a plurality of first portions 1010(1), 1010(2), 1010(3), . . . , and 1010(N)), and may be positioned spaced apart from the first surface 1001 with a first height corresponding to the first thickness T1. The plurality of third surfaces 1003(1), 1003(2), 1003(3), . . . , and 1003(M) may be formed by the plurality of second portions 1020(1), 1020(2), 1020(3), . . . , and 1020(M), and may be positioned spaced apart from the first surface 1001 with a second height corresponding to the second thickness T2. In one embodiment, at least some of the plurality of third surfaces 1003(1), 1003(2), 1003(3), . . . , and 1003(M) face the third support area 7203 (see FIG. 6) of the second support member 722 (see FIG. 6), and may be supported by the third support area 7203. The first thickness T1 may be, for example, a value of between about 0.05 mm and about 0.3 mm. The second thickness T2 may be, for example, a value of between about 0.5 mm and about 1 mm. In one embodiment, the second area 52 of the display support plate 50 may have a multi-bar structure due to the height difference between the plurality of first portions 1010(1), 1010 (2), 1010(3), . . . , and 1010(N) and the plurality of second portions 1020(1), 1020 (2), 1020(3), . . . , and 1020(M). The multi-bar structure may have, for example, a shape in which a plurality of support bars (or multi-bar) extend in directions (e.g., +y axis direction, −y axis direction) orthogonal to the direction of slide-out (e.g., +x axis direction) is protruded and arranged with respect to the second surface 1002. The plurality of support bars may refer to, for example, the protruded portions of the plurality of second portions 1020(1), 1020

(2), 1020(3), . . . , and 1020(M) with respect to the second surface 1002. The first thickness part 1010 may have a relatively thin thickness compared to the second thickness part 1020, and may serve to ensure the flexibility of the second area 52 of the display support plate 50.

In one embodiment, looking at one second portion 1020 (M), the second portion 1020(M) may include, when viewed in cross section, a third surface 1003(M), a first side surface 1006(M) extending from one edge of the surface 1003(M) to the second surface 1002, and a second side surface 1007M extending from the other edge of the third surface 1003(M) to the second surface 1002. The third surface 1003(M) may include a substantially flat surface. The third surface 1003 (M) may be substantially parallel to the first surface 1001 and/or the second surface 1002 in the state in which the display support plate 50 is unfolded (i.e., uncurved). The first side surface 1006(M) and the second side surface 1007(M) may be symmetrically disposed on opposite sides of the third surface 1003(M). In one embodiment, the second portion 1020(M) may have a cross-sectional shape narrowing in a direction from the first surface 1001 to the third surface 1003(M). For example, a portion of the second portion 1020(M) that protrudes with respect to the second surface 1002 and includes the third surface 1003(M), the first side surface 1006(M), and the second side surface 1007(M) may have an isosceles trapezoid cross-sectional shape. For example, the first side surface 1006(M) and the second side surface 1007(M) may be angled at the same (but opposite) obtuse angle with respect to the third surface 1003(M). Referring to FIG. 10, an obtuse angle 1 between the first side surface 1006(M) and the third surface 1003(M) may be substantially the same as an obtuse angle 2 between the second side surface 1007(M) and the third surface 1003(M). In some embodiments, although not illustrated, a portion of the second portion 1020M that protrudes with respect to the second surface 1002 and includes the third surface 1003(M), the first side surface 1006(M), and the second side surface 1007(M) may have a rectangular cross-sectional shape. For example, the first side surface 1006(M) and the second side surface 1007(M) may be substantially perpendicular to the third surface 1003(M) (i.e., no tapering shape). Although not illustrated, a portion of the second portion 1020(M) that protrudes with respect to the second surface 1002 and includes the third surface 1003(M), the first side surface 1006(M), and the second side surface 1007 is not limited to an isosceles trapezoidal cross-sectional shape or a rectangular cross-sectional shape, and may be formed in various cross-sectional shapes. In some embodiments, although not illustrated, a boundary part to which the third surface 1003(M) and the first side surface 1006(M) are connected, and a boundary part to which the third surface 1003(M) and the second side surface 1007(M) are connected may be formed in a curved surface shape or an inclined surface shape. In some embodiments, although not illustrated, the first side surface 1006(M) and the second side surface 1007(M) may be formed as convex or concave curved surfaces. In some embodiments, although not illustrated, the third surface 1003(M) may be formed as a convex or concave curved surface. The remaining second portions 1020(1), 1020(2), 1020(3), . . . , and (1020(M−1)) may have substantially the same or similar shape as the second portion 1020(M) described above. In the illustrated embodiment, the narrowing cross-sectional shape of the plurality of second portions 1020(1), 1020(2), 1020(3), . . . , and 1020(M) may serve to reduce the radius of curvature to which the second area 52 of the display support plate 50 is bent.

According to an embodiment, the boundary parts to which the second surface 1002 and the plurality of first side surfaces 1006(1), 1006(2), 1006(3), . . . , and 1006(M−1) are connected, and the boundary parts to which the second surface 1002 and the plurality of second side surfaces 1007(2), 1007(3), . . . , and 1007(M) are connected may be formed in a corner shape. In some embodiments, although not illustrated, the boundary parts to which the second surface 1002 and the plurality of first side surfaces 1006(1), 1006(2), 1006(3), . . . , and 1006(M−1) are connected, and/or the boundary parts to which the second surface 1002 and the plurality of second side surfaces 1007(2), 1007(3), . . . , and 1007(M) are connected may be formed in a curved shape or an inclined surface shape.

According to an embodiment, the plurality of second portions 1020(1), 1020(2), 1020(3), . . . , and 1020(M) may be arranged at a constant spaced distance W. The distance W at which the plurality of second portions 1020(1), 1020(2), 1020(3), . . . , and 1020(M) is arranged may be, for example, one value of between about 0.8 mm to about 1.5 mm but is not limited thereto. In some embodiments, some of the plurality of second portions 1020(1), 1020(2), 1020(3), . . . , and 1020(M) may be arranged with a first spaced distance, and other portions of the plurality of second portions 1020(1), 1020(2), 1020(3), . . . , and 1020(M) may be arranged with a second spaced distance different from the first spaced distance. That is, in some embodiments, the plurality of second portions 1020(1), 1020(2), 1020(3), . . . , and 1020(M) may be equally distributed in the x-axis direction or may be distributed with a non-equal spacing in the x-axis direction.

According to an embodiment, the first thickness part 1010 may include a plurality of opening patterns 1100(1), 1100 (2), 1100(3), . . . , and 1100(N) formed corresponding to the plurality of first portions (1010(1), 1010(2), 1010(3), . . . , and 1010(N)). Looking at one first portion 1010(1), the first portion 1010(1) may include a plurality of openings (or slits) 11(1) periodically formed in a regular pattern. The remaining first portions 1010(2), 1010(3), . . . , and 1010(N) may be formed in substantially the same manner as the first portion 1010(1) including similar opening patterns similar to the opening pattern 1100(1). The plurality of opening patterns 1100(1), 1100(2), 1100(3), . . . , and 1100(N) may be formed in various other shapes without being limited to the illustrated example. The plurality of opening patterns 1100 (1), 1100(2), 1100(3), . . . , and 1100(N), compared to the comparison example not including the opening pattern, may serve to ensure the flexibility of the plurality of first portions 1010(1), 1010(2), 1010(3), . . . , and 1010(N). The plurality of opening patterns 1100(1), 1100(2), 1100(3), . . . , and 1100(N) may reduce the bending stress on the second area 52 of the display support plate 50 and may serve to ensure the smooth bending of the second area 52. In some embodiments, the opening pattern including the plurality of openings may be referred to as a 'lattice structure' or 'lattice pattern'.

According to an embodiment, the plurality of opening patterns 1100(1), 1100(2), 1100(3), . . . , and 1100(N) may reduce an area of the plurality of first portions 1010(1), 1010(2), 1010(3), . . . , and 1010(N) connected to the rear surface of the flexible display 30 (e.g., the rear surface of the copper sheet 33e in FIG. 6). This may reduce bending stress on the display assembly including the flexible display 30 and the display support plate 50, and may serve to ensure the smooth bending of the display assembly.

According to an embodiment, the plurality of opening patterns 1100(1), 1100(2), 1100(3), . . . , and 1100(N) may be formed in substantially the same pattern shape. In some embodiments, any two of the plurality of opening patterns 1100(1), 1100(2), 1100(3), . . . , and 1100(N) may be formed in different patterns. In some embodiments, the first portion 1010(1), 1010(2), 1010(3), . . . , or 1010(N) may include a recess pattern (not illustrated) including a plurality of recesses, in place of the opening pattern. For example, the plurality of recesses may include a groove in the form of a cut in the first surface (1001) or the second surface (1002), corresponding to the first portion 1010(1), 1010(2), 1010(3), . . . , or 1010(N). In the disclosure, the 'lattice structure' is understood or interpreted to include an opening pattern including a plurality of openings, a recess pattern including a plurality of recesses, or a combination of an opening pattern and a recess pattern.

According to an embodiment, the first area 51 of the display support plate 50 may have the first thickness T1. For example, the first area 51 may include a fourth surface 1004 positioned opposite to the first surface 1001. The fourth surface 1004 may be positioned spaced apart from the first surface 1001 with a first height corresponding to the first thickness T1. In some embodiments, the first area 51 may have a thickness different from the first thickness T1. For example, the first area 51 may have a thickness smaller than the first thickness T1. In other embodiments, the first area 51 may have a thickness that is greater than the first thickness. For example, the first area 51 may have a thickness equal to the second thickness T2 or may have a thickness that is thicker than the first thickness T1 and thinner than the second thickness T2. In some embodiments, the first area 51 may not include a lattice structure. In some embodiments, although not illustrated, at least a portion of the first area 51 may include a lattice structure. The lattice structure included in at least a portion of the first area 51 may be formed in substantially the same shape as, for example, the lattice structure included in the second area 52 (e.g., the plurality of opening patterns 1100(1), 1100(2), 1100 (3), . . . , and 1100 (N)), but there is no limitation thereto.

According to an embodiment, the third area 53 of the display support plate 50 may have the first thickness T1. For example, the third area 53 may include a fifth surface 1005 positioned opposite to the first surface 1001. The fifth surface 1005 may be positioned spaced apart from the first surface 1001 with the first height corresponding to the first thickness T1. In some embodiments, the third area 53 may have a thickness different from the first thickness T1. For example, the third area 53 may have a thickness thinner than the first thickness T1. For another example, the third area 53 may have a thickness greater than the first thickness T1, such as equal to the second thickness T2 or may have a thickness that is thicker than the first thickness T1 and thinner than the second thickness T2. In some embodiments, the third area 53 may not include a lattice structure. In some embodiments, although not illustrated, at least a portion of the third area 53 may include a lattice structure. The lattice structure included in at least a portion of the third area 53 may be formed in substantially the same pattern shapes as, for example, the lattice structure included in the second area 52 (e.g., the plurality of opening patterns 1100(1), 1100(2), 1100 (3), . . . , and 1100 (N)), but there is no limitation thereto.

According to an embodiment, one second portion 1020 (M) of the plurality of second portions 1020(1), 1020(2), 1020(3), . . . , and 1020(M) included in the second area 52 of the display support plate 50 may be connected to the first area 51. A boundary part where the first side surface 1006 (M) of the second portion 1020(M) and the fourth surface 1004 of the first area 51 are connected may be formed in a corner shape. In some embodiments, the boundary part where the first side surface 1006(M) of the second portion 1020(M) and the fourth surface 1004 of the first area 51 are connected may be formed in a curved shape as indicated by reference numeral '1006a' (e.g., a chamfered corner). In some embodiments, although not illustrated, the boundary part where the first side surface 1006(M) of the second portion 1020(M) and the fourth surface 1004 of the first area 51 are connected may be formed in an inclined surface shape. The curved shape or inclined surface shape of the boundary part where the first side surface 1006(M) of the second portion 1020(M) and the fourth surface 1004 of the first area 51 are connected may prevent bending stresses, for example, when bending the display support plate 50, from being concentrated on the boundary part (e.g., rigidity reinforcement).

According to an embodiment, one second portion 1020(1) of the plurality of second portions 1020(1), 1020(2), 1020 (3), . . . , and 1020(M) included in the second area 52 of the display support plate 50 may be connected to the third area 53. A boundary part where the first side surface 1007(1) of the second portion 1020(1) and the fifth surface 1005 of the third area 53 are connected may be formed in a corner shape. In some embodiments, the boundary part where the second side surface 1007(1) of the second portion 1020(1) and the fifth surface 1005 of the third area 53 are connected may be formed in a curved shape as indicated by reference numeral '1007a' (e.g., a chamfered corner). In some embodiments, although not illustrated, the boundary part where the second side surface 1007(1) of the second portion 1020(1) and the fifth surface 1005 of the third area 51 are connected may be formed in an inclined surface shape. The curved shape or inclined surface shape of the boundary part where the second side surface 1007(1) of the second portion 1020(1) and the fifth surface 1005 of the third area 53 are connected may prevent the bending stress, for example, when bending the display support plate 50, from being concentrated on the boundary part (e.g., rigidity reinforcement).

According to an embodiment, the plurality of first guide pin structures 81(1), 81(2), 81(3), . . . , and 81(M) (shown in FIG. 8) may be positioned on one side of the plurality of second portions 1020(1), 1020(2), 1020(3), . . . , and 1020(M) (e.g., multi-bar), and the plurality of second guide pin structures 82(1), 82(2), 82(3), . . . , and 82(M) may be positioned on the other side of the plurality of second portions 1020(1), 1020(2), 1020(3), . . . , and 1020(M). For example, the plurality of first guide pin structures 81(1), 81(2), 81(3), . . . , and 81(M) and the plurality of second guide pin structures 82(1), 82(2), 82(3), . . . , and 82(M) may be positioned in a one-to-one correspondence with the plurality of second portions 1020(1), 1020(2), 1020(3), . . . , and 1020(M). With reference to FIGS. 10, 12, and 13, and referring to one second portion 1020(1), the second portion 1020(1) may include a third side surface 1008(1) and a fourth side surface 1009(1). The third side surface 1008(1) and the fourth side surface 1009(1) may be positioned at opposite ends of the respective second portion 1020(1), for example, in a direction (e.g., y-axis direction) orthogonal to the slide-out direction (e.g., +x-axis direction). The third side surface 1008(1) may face the third support member 723 (see FIG. 6 or 7). The fourth side surface 1009(1) may face the fourth support member 724 (see FIG. 6 or 7). The first fixing part 811(1) included in the first guide pin structure 81(1) corresponding to the second portion 1020(1) may be connected to the third side surface 1008(1) using a scheme or method such as bonding or welding. The second fixing part 821(1) included in the second guide pin structure 82(1) corresponding to the second portion 1020(1) may be connected to the fourth side surface 1009(1) using a scheme or method such as bonding or welding. In some embodiments, although not illustrated, the first fixing part 811(1) of the first guide pin structure 81(1) and/or the second fixing part 821(1) of the second guide pin structure 821(1) may be connected to the second portion 1020(1) using a fitting structure, a hook fastening structure, or a mechanical fastening structure (e.g., a screw). The remaining second portions 1020(2), 1020(3), . . . , and 1020(M) may be formed in substantially the same shape as one second portion 1020(1). The remaining first guide pin structures 81(2), 81(3), . . . , and 81(M) and the remaining second guide pin structures 82(2), 82(3), . . . , and 82(M) may be coupled to the remaining second portions 1020(2), 1020(3), . . . , and 1020(M) in the substantially same manner as the coupling of the first guide pin structure 81(1) and the second guide pin structure 82(1) to the second portion 1020(1). In some embodiments, the plurality of first guide pin structures 81(1), 81(2), 81(3), . . . , and 81(M) and the plurality of second guide pin structures 82(1), 82(2), 82(3), . . . , and 82(M) may be formed in a form combined with the plurality of second portions 1020(1), 1020(2), 1020(3), . . . , and 1020(M) using an insert injection molding.

According to an embodiment, the second area 52 of the display support plate 50 may include a fourth area 54 (FIG. 13) and a fifth area 55 (FIG. 12). The fourth area 54 and the fifth area 55 may be positioned on one side and the other side of a portion of the second area 52 including the plurality of second portions 1020(1), 1020(2), 1020(3), . . . , and 1020(M). In one embodiment, the fourth area 54 and the fifth area 55 may be of a form that extends from the first thickness part 1010 of the second area 52, the first area 51, and the third area 53, and may have the same first thickness (T1) as the first thickness part (1010). In some embodiments, the fourth area 54 and the fifth area 55 may be interpreted as a part of the first thickness part 1010. The second surface 1002 may include, for example, an area by the first thickness part 1010, an area by the fourth area 54, and an area by the fifth area 55. In one embodiment, the plurality of first guide pin structures 81(1), 81(2), 81(3), . . . , and 81(M) may be positioned corresponding to the fourth area 54, and the plurality of second guide pin structures 82(1), 82(2), 82(3), . . . , and 82(M) may be positioned corresponding to the fifth area 55. When viewed from above, and the second surface 1002 is in the unfolded state of the illustrated display support plate 50, the fourth area 54 may overlap the plurality of first guide pin structures 81(1), 81(2), 81(3), . . . , and 81(M) at least partially, and the fifth area 55 may overlap the plurality of second guide pin structures 82(1), 82(2), 82(3), . . . , and 82(M) at least partially. The plurality of second portions 1020(1), 1020(2), 1020(3), . . . , and 1020(M) may be positioned between the plurality of first guide pin structures 81(1), 81(2), 81(3), . . . , and 81(M) and the plurality of second guide pin structures 82(2), 82(2), 82(3), . . . , and 82(M).

According to an embodiment, the lattice structure included in the plurality of first portions 1010(1), 1010(2), 1010(3), . . . , and 1010(N) (e.g., a plurality of opening patterns 1100(1), 1100(2), 1100(3), . . . , and 1100(N)) may be extended to the fourth area 54 and the fifth area 55 for the flexibility of the second area 52 (as shown in FIGS. 11-13).

According to some embodiments, the plurality of first fixing parts 811(1), 811(2), 811(3), . . . , and 811(M) of the plurality of first guide pin structures 81(1), 81(2), 81(3), . . . , 81(M) may be connected to the fourth area 54 using a method such as bonding or welding. In some embodiments, the plurality of second fixing parts 821(1), 821(2), 821(3), . . . , and 821(M) of the plurality of second guide pin structures 82(1), 82(2), 82(3), . . . , and 82(M) may be connected to the fifth area 55 using a method such as bonding or welding.

According to some embodiments, the positions or numbers of the plurality of first guide pin structures 81(1), 81(2), 81(3), . . . , and 81(M) and/or the plurality of second guide pin structures 82(1), 82(2), 82(3), . . . , and 82(M) may vary, unlike the illustrated example. For example, the first guide pin structure and/or the second guide pin structure may be positioned corresponding to any one of the plurality of second portions 1020(1), 1020(2), 1020(3), . . . , and 1020(M), and may not be positioned with respect to another second portion adjacent to it.

According to an embodiment, a third guide pin structure 83 (FIG. 16) may include a plurality of third guide pin structures 83(1), 83(2), 83(3), . . . , and 83(M). The plurality of third guide pin structures 83(1), 83(2), 83(3), . . . , and 83(M) may be positioned on the plurality of second portions 1020(1), 1020(2), 1020(3), . . . , and 1020(M), for example, in a one-to-one correspondence relationship with the plurality of second portions 1020(1), 1020(2), 1020(3), . . . , and 1020(M). In one embodiment, the plurality of third guide pin structures 83(1), 83(2), 83(3), . . . , and 83(M) may be disposed on a plurality of third surfaces 1003(1), 1003(2), 1003(3), . . . , and 1003(M) of the plurality of second portions 1020(1), 1020(2), 1020(3), . . . , and 1020(M) using a method such as bonding or welding. Looking at one third guide pin structure 83(1), the third guide pin structure 83(1) may include the third guide pin 831(1) in the form of a hook structure positioned spaced apart from the third surface 1003(1). The remaining third guide pin structures 83(2), 83(3), . . . , and 83(M) may be formed in substantially the same shape as the one third guide pin structure 83(1). The fourth guide pin structure 84 may include a plurality of fourth guide pin structures (not illustrated). Although not illustrated, the plurality of fourth guide pin structures may be formed in substantially the same shape as the plurality of third guide pin structures 83(1), 83(2), 83(3), . . . , and 83(M), may be disposed on the plurality of second portions 1020(1), 1020(2), 1020(3), . . . , and 1020(M), and may include a plurality of fourth guide pins. The third guide pin structure 83 may be positioned closer to the first guide pin structure 81 than the second guide pin structure 82. The fourth guide pin structure 84 may be positioned closer to the second guide pin structure 82 than to the first guide pin structure 81. The second support member 722 (see FIG. 6) may include a third guide rail (or a third guide rail structure) (not illustrated) formed or positioned on the third support area 7203, and the plurality of third guide pins 831(1), 831(2), 831(3), and 831(M) of the plurality of third guide pin structures 83(1), 83(2), 83(3), . . . , and 83(M) may be positioned on the third guide rail. The second support member 722 (see FIG. 6) may include a fourth guide rail (or a fourth guide rail structure) (not illustrated) formed or positioned on the third support area 7203, and the plurality of fourth guide pins of the plurality of fourth guide pin structures may be positioned on the fourth guide rail. The third guide rail and the fourth guide rail may be formed to correspond to a designated movement path of the display support assembly 710. When the second housing 22 (see FIG. 6 or 7) slides, the plurality of third guide pins 831(1), 831(2), 831(3), . . . , and 831(M) of the plurality of third guide pin structures 83(1), 83(2), 83(3), . . . , and 83(M) may be guided by the third guide rail to be positioned and moved, and the plurality of fourth guide pins of the plurality of fourth guide pin structures may be guided by the fourth guide rail to be positioned and moved. The third guide rail may include an engaging structure corresponding to the plurality of third guide pins 831(1), 831(2), 831(3), . . . , and 831(M) in the form of a hook structure included in the plurality of third guide pin structures 83(1), 83(2), 83(3), . . . , and 83(M). The fourth guide rail may include an engaging structure corresponding to the plurality of fourth guide pins in the form of a hook structure included in the plurality of fourth guide pin structures. The plurality of third guide pins 831(1), 831(2), 831(3), . . . , and 831(M) in the form of the hook structure and the engaging structure of the third guide rail, and the fourth guide pins in the form of the hook structure and the engaging structure of the fourth guide rail may serve to prevent the second display section ② of the flexible display 30 (see FIG. 6) from being lifted with respect to the third support area 7203 of the second support member 732, due to the elasticity of the flexible display 30 and/or the elasticity of the display support plate 50.

According to an embodiment, a lubricant (e.g., grease) may be interposed between the plurality of third guide pins 831(1), 831(2), 831(3), . . . , and 831(M) of the plurality of third guide pin structures 83(1), 83(2), 83(3), . . . , and 83(M), and between the plurality of fourth guide pins of the plurality of fourth guide pin structures and the fourth guide rail. In some embodiments, the surface of the plurality of third guide pins 831(1), 831(2), 831(3), . . . , and 831(M) and the surface of the plurality of fourth guide pins, or the surface of the third guide rail and the surface of the fourth guide rail may be coated with a lubricant. For example, the surface of the plurality of third guide pins 831(1), 831(2), 831(3), . . . , and 831(M) and the surface of the plurality of fourth guide pins, or the surface of the third guide rail and the surface of the fourth guide rail may be formed with a coating of various lubricating materials such as a tetrafluoroethylene material (e.g., polytetrafluoroethylene (PTFE), also known as Teflon) coating. In some embodiments, the plurality of third guide pins 831(1), 831(2), 831(3), . . . , and 831(M), and the plurality of fourth guide pins may be implemented by being modified in a form including a roller and a rotation member.

Figure 17:
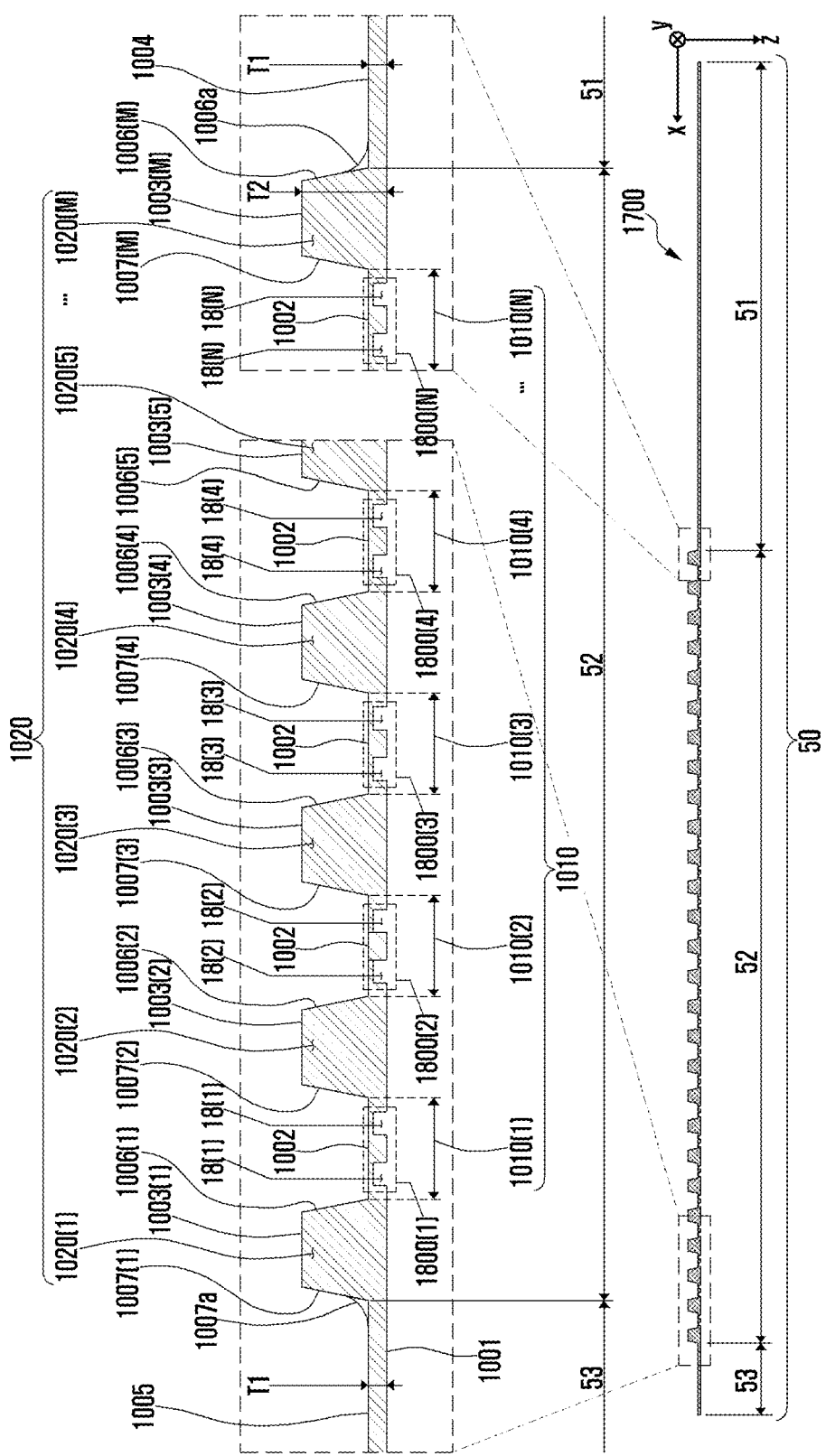
FIG. 17 is a cross-sectional view of a display support plate modified from the embodiment of FIG. 10 according to an embodiment.
Figure 18:
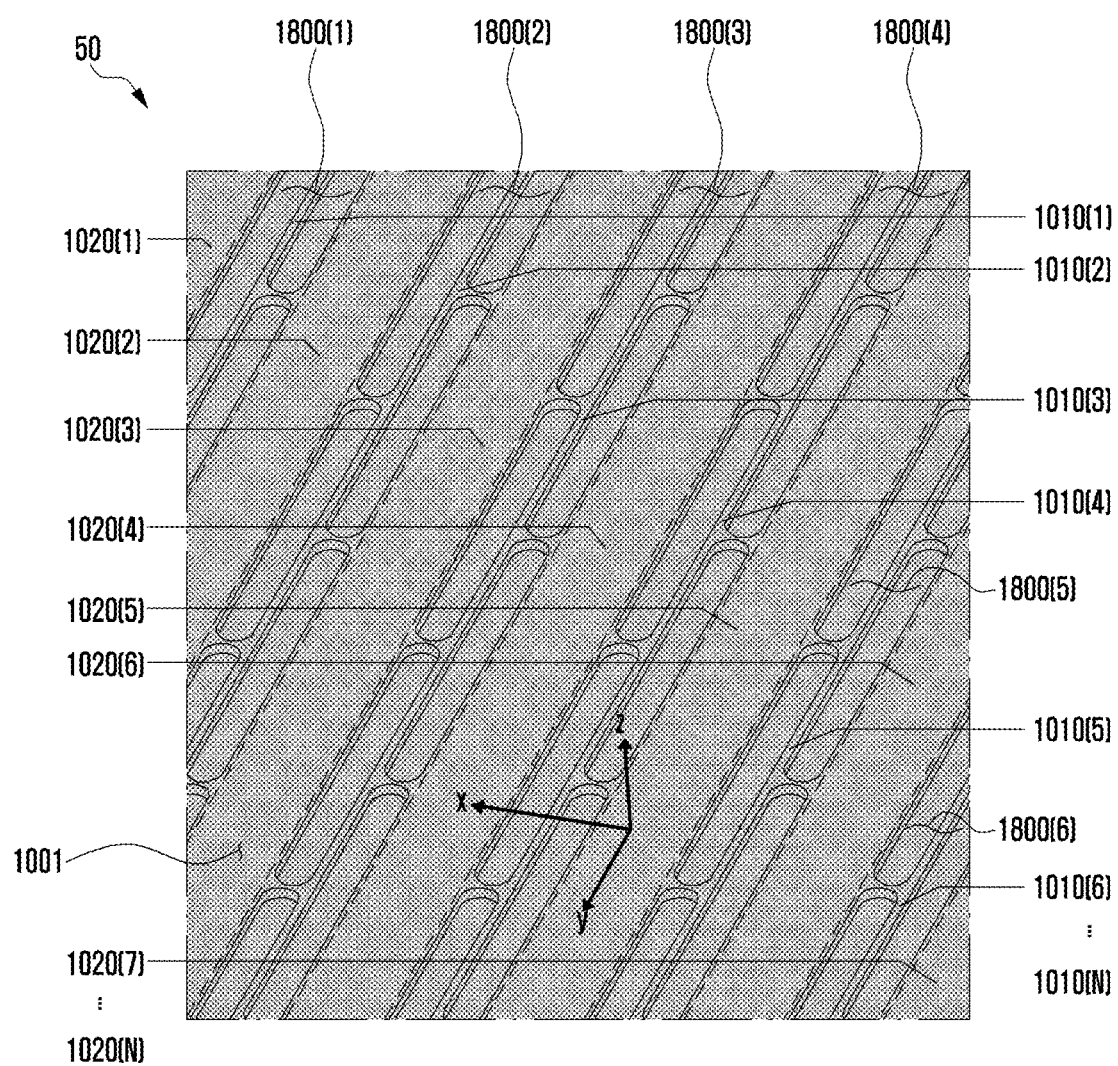
FIG. 18 is a perspective view of the display support plate of FIG. 17 according to one embodiment.
Figure 19:
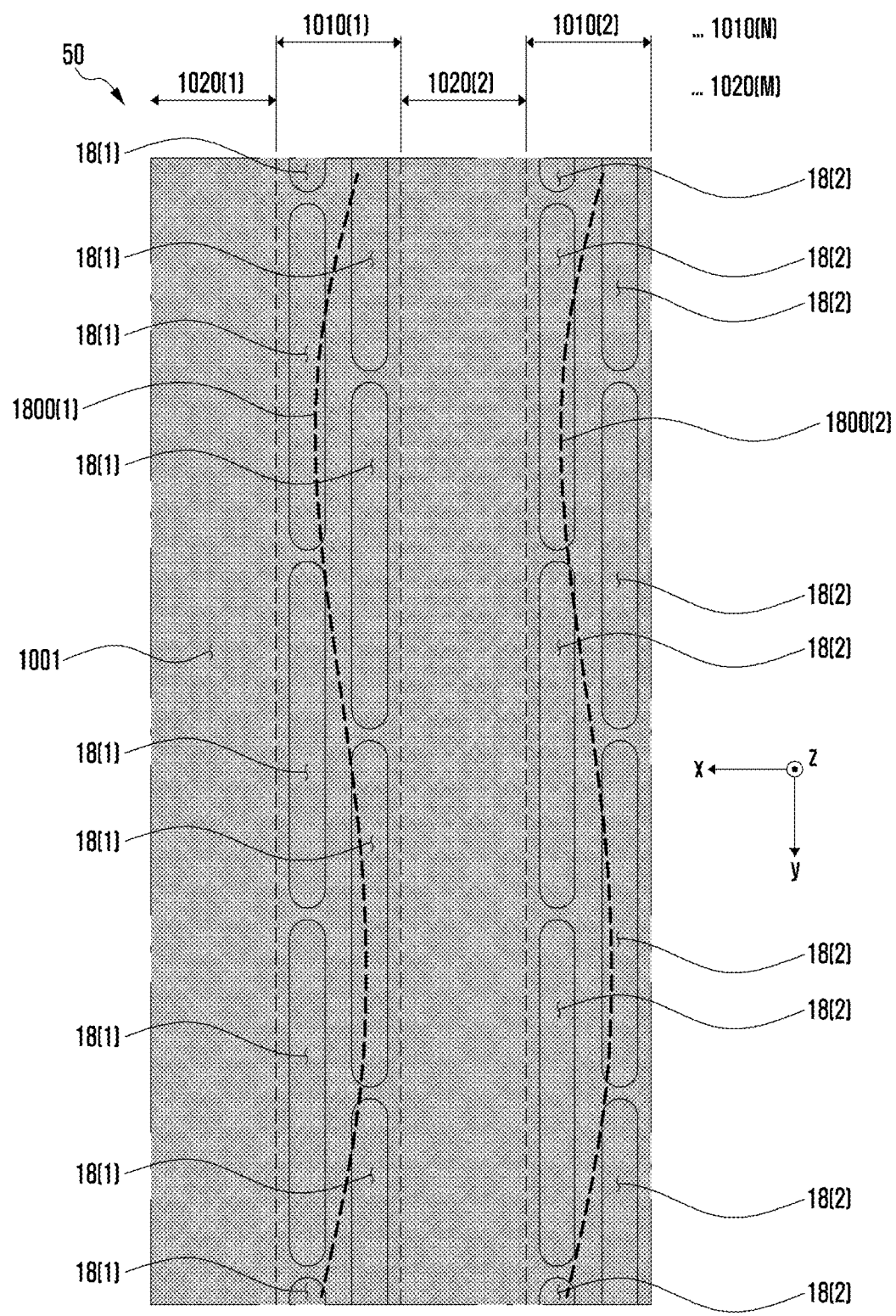
FIG. 19 is a view illustrating the display support plate of FIG. 17 according to an embodiment.

FIG. 17 is a cross-sectional view 1700 of the display support plate 50 modified from the embodiment of FIG. 10 according to an embodiment. FIG. 18 is a perspective view of the display support plate 50 of FIG. 17 according to an embodiment. FIG. 19 is a view illustrating the display support plate 50 of FIG. 17 according to an embodiment. Features that are the same between the various embodiments are labeled with the same reference numerals for simplicity of discussion.

With reference to FIGS. 17, 18, and 19, the display support plate 50 may include a plurality of recess patterns 1800(1), 1800(2), 1800(3), . . . , and 1800(N), in place of the plurality of opening patterns 1100(1), 1100(2), 1100(3), 1100(N) according to the embodiment of FIG. 9. Looking at one first portion 1010(1), shown in FIG. 17, the first portion 1010(1) may include a recess pattern 1800(1) including a plurality of recesses 18(1) periodically formed in a regular pattern. The recess pattern 1800(1) may be formed on an area of the first surface 1001 corresponding to the first portion 1010(1). The remaining first portions 1010(2), 1010(3), . . . , and 1010(N) may be formed in substantially the same manner as the one first portion 1010(1), including respective recess patterns 1800(2), . . . 1800(N). The plurality of recess patterns 1800(1), 1800(2), 1800(3), . . . , and 1800(N), may serve to ensure the flexibility of the plurality of first portions 1010(1), 1010(2), 1010(3), . . . , and 1010(N), compared to a comparison example not including such recess pattern. The plurality of recess patterns 1800(1), 1800(2), 1800(3), . . . , and 1800(N) may reduce bending stress on the second area 52 of the display support plate 50, and may serve to ensure the smooth bending of the second area 52.

According to an embodiment, the plurality of recess patterns 1800(1), 1800(2), 1800(3), . . . , and 1800(N) may reduce the area of the plurality of first portions 1010(1), 1010(2), 1010(3), . . . , and 1010(N) connected to the rear surface of the flexible display 30 (e.g., the rear surface of the copper sheet 33e in FIG. 6). This may reduce bending stress on the display assembly including the flexible display 30 and the display support plate 50, and thus, may serve to ensure the smooth bending of the display assembly. Although not illustrated, the lattice structure including the plurality of recess patterns 1800(1), 1800(2), 1800(3), . . . , and 1800(N) may be extended to the fourth area 54 and/or the fifth area 55 by modifying the embodiment of FIGS. 12 and 13. In some embodiments, although not illustrated, the lattice structure including the plurality of recess patterns 1800(1), 1800(2), 1800(3), . . . , and 1800(N) may be extended to the first area 51 and/or the third area 53.

According to an embodiment, the plurality of recess patterns 1800(1), 1800(2), 1800(3), . . . , and 1800(N) may be formed in substantially the same pattern, but there is no limitation thereto. In some embodiments, any two of the plurality of recess patterns 1800(1), 1800(2), 1800(3), . . . , and 1800(N) may be formed in different pattern shapes.

Figure 20:
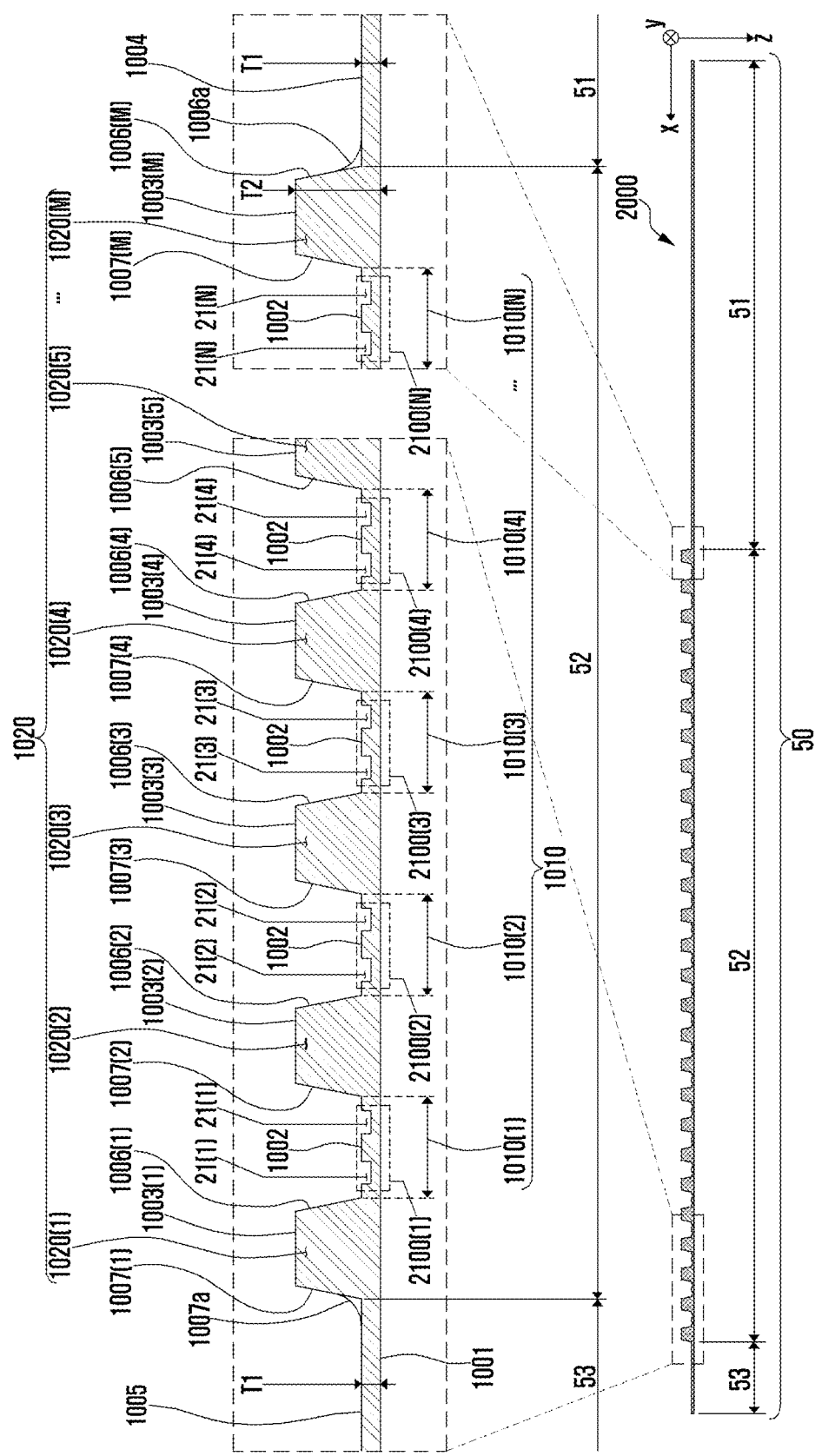
FIG. 20 is a cross-sectional view of a display support plate modified from the embodiment of FIG. 10 according to an embodiment.
Figure 21:
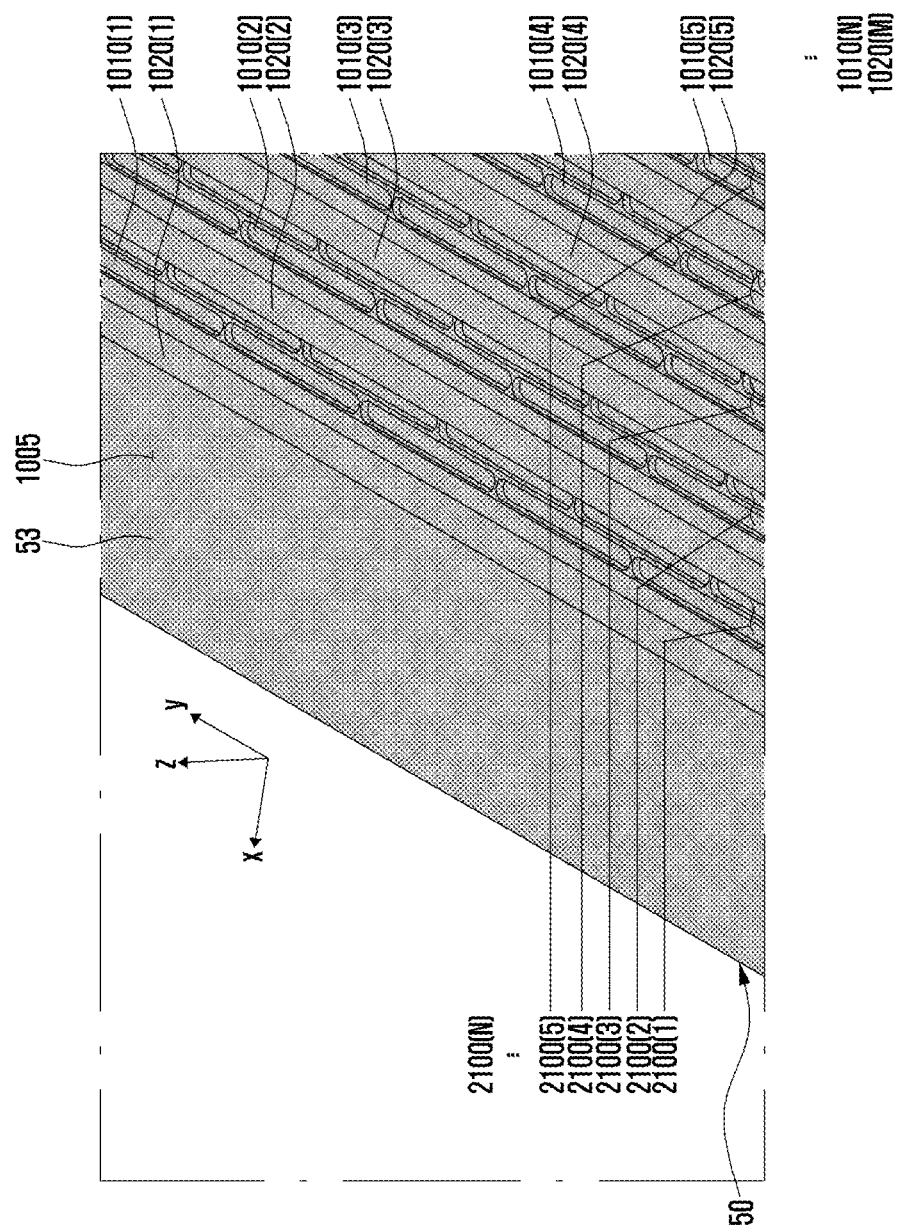
FIG. 21 is a perspective view of the display support plate of the embodiment of FIG. 20, according to one embodiment.

FIG. 20 is a cross-sectional view 2000 of the display support plate 50 modified from the embodiment of FIG. 10 according to an embodiment. FIG. 21 is a perspective view of the display support plate 50 of the embodiment of FIG. 20 according to one embodiment.

With reference to FIGS. 20 and 21, the display support plate 50 may include a plurality of recess patterns 2100(1), 2100(2), 2100(3), . . . , and 2100(N) in place of the plurality of opening patterns 1100(1), 1100(2), 1100(3), . . . , 1100(N). Looking at one first portion 1010(1), the first portion 1010(1) may include a recess pattern 2100(1) including a plurality of recesses 21(1) periodically formed in a regular pattern. The recess pattern 2100(1) may be formed on an area of the second surface 1002 corresponding to the first portion 1010(1). The remaining first portions 1010(2), 1010(3), . . . , and 1010(N) may be formed in the substantially same manner as the one first portion 1010(1) including the respective recess patterns 2100(2) . . . 2100(N). The plurality of recess patterns 2100(1), 2100(2), 2100(3), . . . , and 2100(N) may serve to ensure the flexibility of the plurality of first portions 1010(1), 1010(2), 1010(3), . . . , and 1010(N), compared to a comparison example not including the recess pattern. The plurality of recess patterns 2100(1), 2100(2), 2100(3), . . . , and 2100(N) may reduce bending stress on the second area 52 of the display support plate 50, and may serve to ensure the smooth bending of the second area 52. Although not illustrated, the lattice structure including the plurality of recess patterns 2100(1), 2100(2), 2100(3), . . . , and 2100(N) may be extended to the fourth area 54 and/or the fifth area 55 by modifying the embodiments of FIGS. 12 and 13. In some embodiments, although not illustrated, the lattice structure including the plurality of recess patterns 2100(1), 2100(2), 2100(3), . . . , and 2100(N) may be extended to the first area 51 and/or the third area 53.

According to an embodiment, the plurality of recess patterns 2100(1), 2100(2), 2100(3), . . . , and 2100(N) may be formed in substantially the same pattern, but there is no limitation thereto. In some embodiments, any two of the plurality of recess patterns 2100(1), 2100(2), 2100(3), . . . , and 2100(N) may be formed in different pattern shapes.

According to some embodiments, although not illustrated, by modifying the embodiments of FIG. 10, FIG. 17, and FIG. 20, the first portion 1010(1), 1010(2), 1010(3), . . . , or 1010(N) may form a lattice structure in a form in which an opening pattern including a plurality of openings and a recess pattern including a plurality of recesses are combined. That is, both openings and recesses may be implemented in a single configuration, with recesses and openings arranged along different first portions 1010 or a mixture of both openings and recesses may be implemented within a single first portion 1010.

For example, according to some embodiments, although not illustrated, a lattice structure may be formed in a form in which one of the plurality of first portions 1010(1), 1010(2), 1010(3), . . . , and 1010(N) has an opening pattern and another first portion adjacent thereto has a recess pattern.

Further, for example, according to some embodiments, although not illustrated, a lattice structure may be formed in a form in which any one of the plurality of first portions 1010(1), 1010(2), 1010(3), . . . , and 1010(N) has a recess pattern formed on the first surface 1001 and another first portion adjacent thereto has a recess pattern formed on the second surface 1002.

Figure 22:
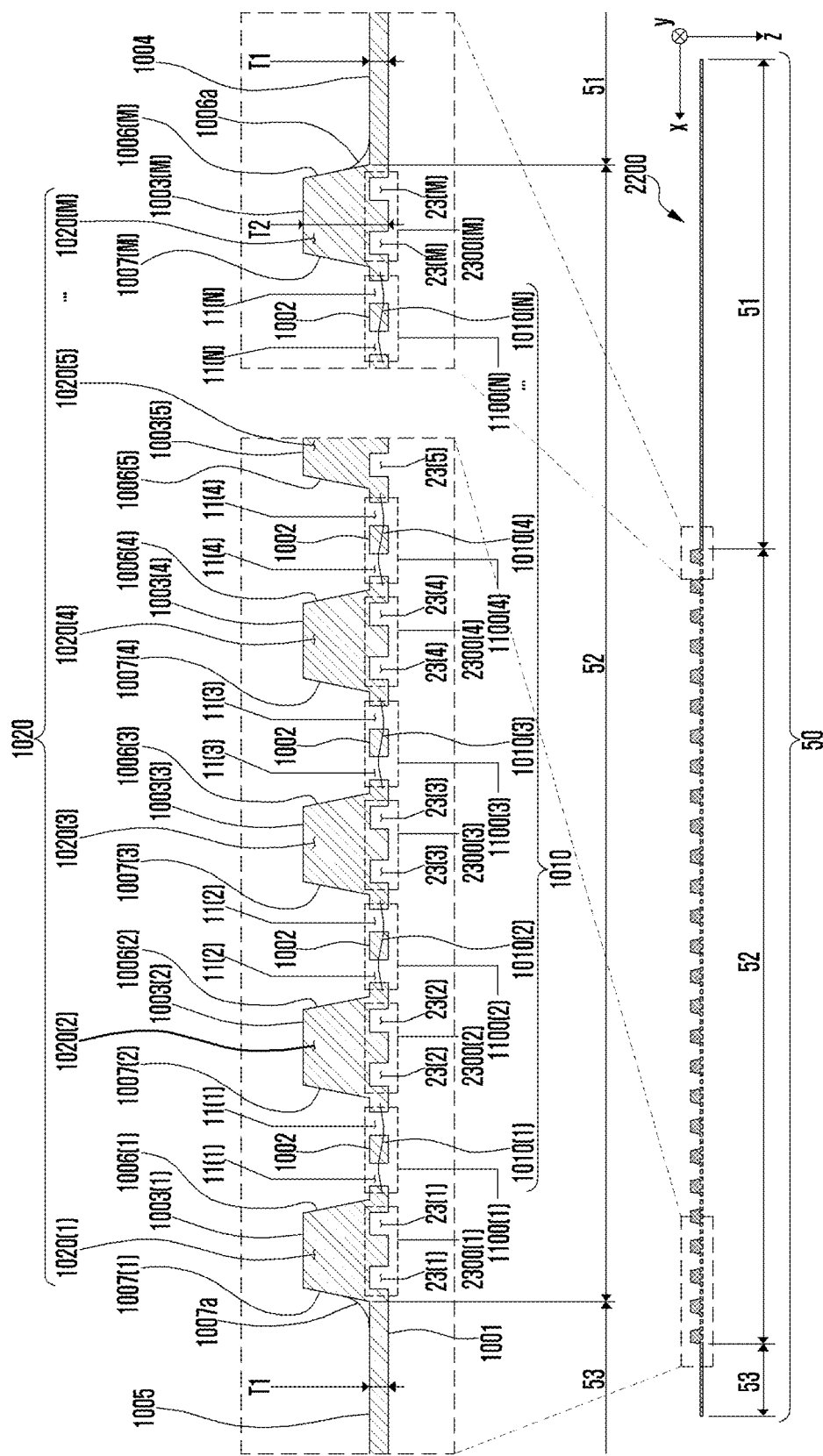
FIG. 22 is a cross-sectional view of a display support plate modified from the embodiment of FIG. 10 according to an embodiment.
Figure 23:
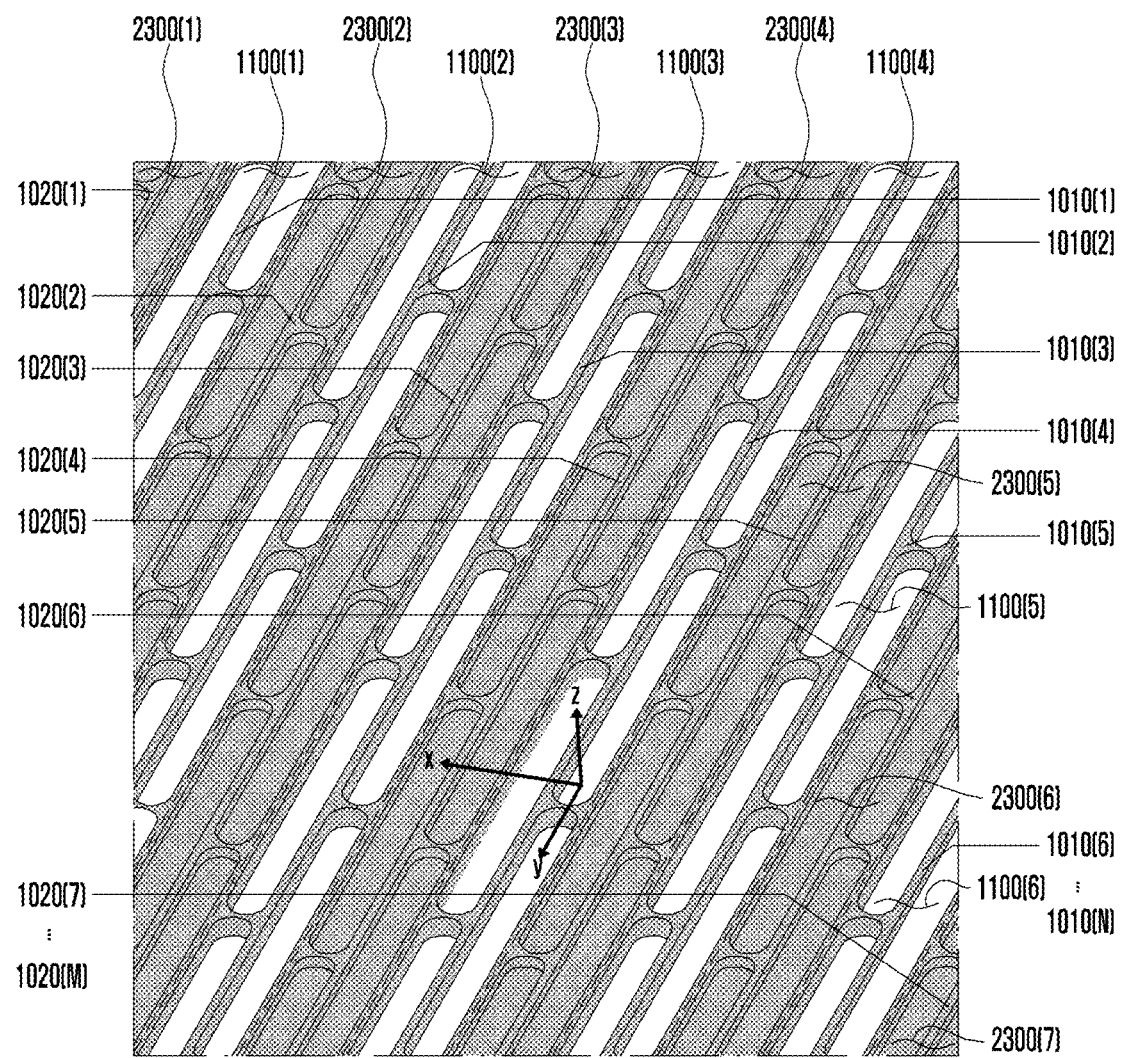
FIG. 23 is a perspective view of the display support plate of FIG. 22 according to one embodiment.
Figure 24:
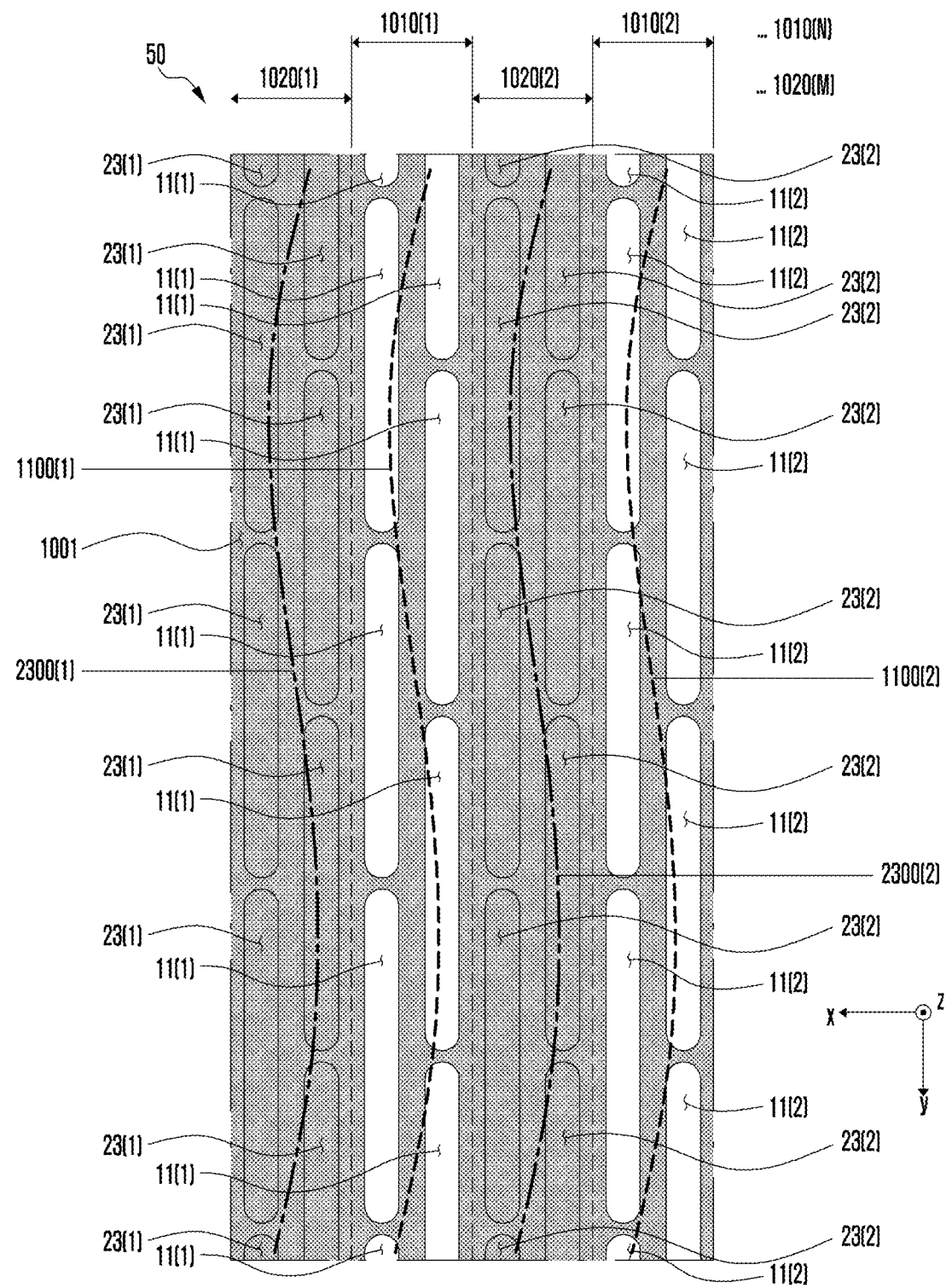
FIG. 24 is a view illustrating the display support plate of FIG. 22 according to an embodiment.

FIG. 22 is a cross-sectional view 2200 of the display support plate 50 modified from the embodiment of FIG. 10 according to an embodiment. FIG. 23 is a perspective view of the display support plate 50 of FIG. 22 according to one embodiment. FIG. 24 is a view illustrating the display support plate 50 of FIG. 22 according to one embodiment.

With reference to FIGS. 22, 23, and 24, the first thickness part 1010 of the display support plate 50 may include the plurality of opening patterns 1100(1), 1100(2), 1100(3), . . . , and 1100(N) formed corresponding to the plurality of first portions 1010(1), 1010(2), and 1010(3), . . . , and 1010(N). The second thickness part 1020 of the display support plate 50 may include the plurality of recess patterns 2300(1), 2300(2), 2300(3), . . . , and 2300(M) formed on the first surface (1001), corresponding to the plurality of second portions 1020(1), 1020(2), 1020(3), . . . , and 1020 (M). Looking at one second portion 1020(1) in FIGS. 22-24, the second portion 1020(1) may include a recess pattern 2300(1) including a plurality of recesses 23(1) periodically formed in a regular pattern. The remaining second portions 1020(2), 1020(3), . . . , and 1020(M) may be formed in substantially the same manner as the one second portion 1020(1) including respective recess patterns 2300(2) . . . 2300(M). In one embodiment, the lattice structure included in the display support plate 50 may be in a form in which the plurality of opening patterns 1100(1), 1100(2), 1100(3), . . . , and 1100(N) and the plurality of recess patterns 2300(1), 2300(2), 2300(3), . . . , and 2300(M) are formed or arranged in substantially the same pattern, but there is no limitation thereon.

According to an embodiment, the rear surface (e.g., the rear surface of the copper sheet 33e in FIG. 6) facing opposite to the surface of the flexible display 30 that is visually exposed through the transparent cover 35 (see FIG. 6) may be connected to the first surface 1001 of the display support plate 50. An area of the first surface 1001 corresponding to the first thickness part 1010 may include the plurality of opening patterns 1100(1), 1100(2), 1100(3), . . . , and 1100(N), and may be connected to a first rear area (not illustrated) of the rear surface of the flexible display 30 to support the first rear area. An area of the first surface 1001 corresponding to the second thickness part 1020 may include the plurality of recess patterns 2300(1), 2300(2), 2300(3), . . . , and 2300(M), and may be connected to a second rear area (not illustrated) of the rear surface of the flexible display 30 to support the second rear area. The first thickness part 1010 including the plurality of opening patterns 1100(1), 1100(2), 1100(3), . . . , and 1100(N) may support a first display area (or a first screen area) of the flexible display 30 corresponding to the first rear area. The second thickness part 1020 including the plurality of recess patterns 2300(1), 2300(2), 2300(3), . . . , and 2300(M) may support a second display area (or a second screen area) of the flexible display 30 corresponding to a second rear area. In one embodiment, when viewing a screen (e.g., see the screen S in FIG. 4), the plurality of recess patterns 2300(1), 2300(2), 2300(3), . . . , and 2300(M) may reduce a phenomenon in which visual patterns corresponding to the plurality of opening patterns 1100(1), 1100(2), 1100(3), . . . , and 1100(N) are highlighted through the first display area. The plurality of opening patterns 1100(1), 1100(2), 1100(3), . . . , and 1100(N) and the plurality of recess patterns 2300(1), 2300(2), 2300(3)), . . . , and 2300(M) are formed or arranged in substantially the same pattern, so that when viewing the screen, the phenomenon in which the visual pattern caused by the plurality of opening patterns 1100(1), 1100(2), 1100(3), . . . , and 1100(N) seen through the first display area and the visual pattern caused by the plurality of recess patterns 2300(1), 2300(2), 2300(3), . . . , and 2300(M) seen through the second display area are visually separated may be reduced. In one embodiment, the plurality of opening patterns 1100(1), 1100(2), 1100(3), . . . , and 1100(N) and the plurality of recess patterns 2300(1), 2300(2), 2300(3), . . . , and 2300(M) may be formed in substantially the same pattern, so the difference between the effect (e.g., pressure) of the first thickness part 1010 on the first display area of 1020 and the effect (e.g., pressure) of the second thickness part 1020 on the second display area is reduced, which can ensure images or display of even visual quality displayed through the screen. The plurality of opening patterns 1100(1), 1100(2), 1100(3), . . . , and 1100(N) and the plurality of recess patterns 2300(1), 2300(2), 2300(3), . . . , and 2300(M) may be formed in substantially the same pattern, so that the difference between a structure in which the first thickness part 1010 supports (or pressurizes) the first display area and a structure in which the second thickness part 1020 supports (or pressurizes) the second display area is reduced, which can reduce a difference in image output characteristics (e.g., pixel color) between the first display area and the second display area.

According to an embodiment, the lattice structure including the plurality of opening patterns 1100(1), 1100(2), 1100(3), . . . , and 1100(N) and the plurality of recess patterns 2300(1), 2300(2), 2300(3), . . . , and 2300(M) may reduce an area of the plurality of second portions 1020(1), 1020(2), 1020(3), . . . , and 1020(M) connected to the rear surface of the flexible display 30 (e.g., the rear surface of the copper sheet 33e in FIG. 6). This can reduce the bending stress on the display assembly including the flexible display 30 and the display support plate 50, which can serve to ensure a smooth bending of the display assembly. According to some embodiments, the plurality of opening patterns 1100(1), 1100(2), 1100(3), . . . , and 1100(N) in the embodiment of FIG. 22 may be replaced with the plurality of recess patterns 1800(1), 1800(2), 1800(3), . . . , and 1800(N) according to the embodiment of FIG. 17.

Figure 25:
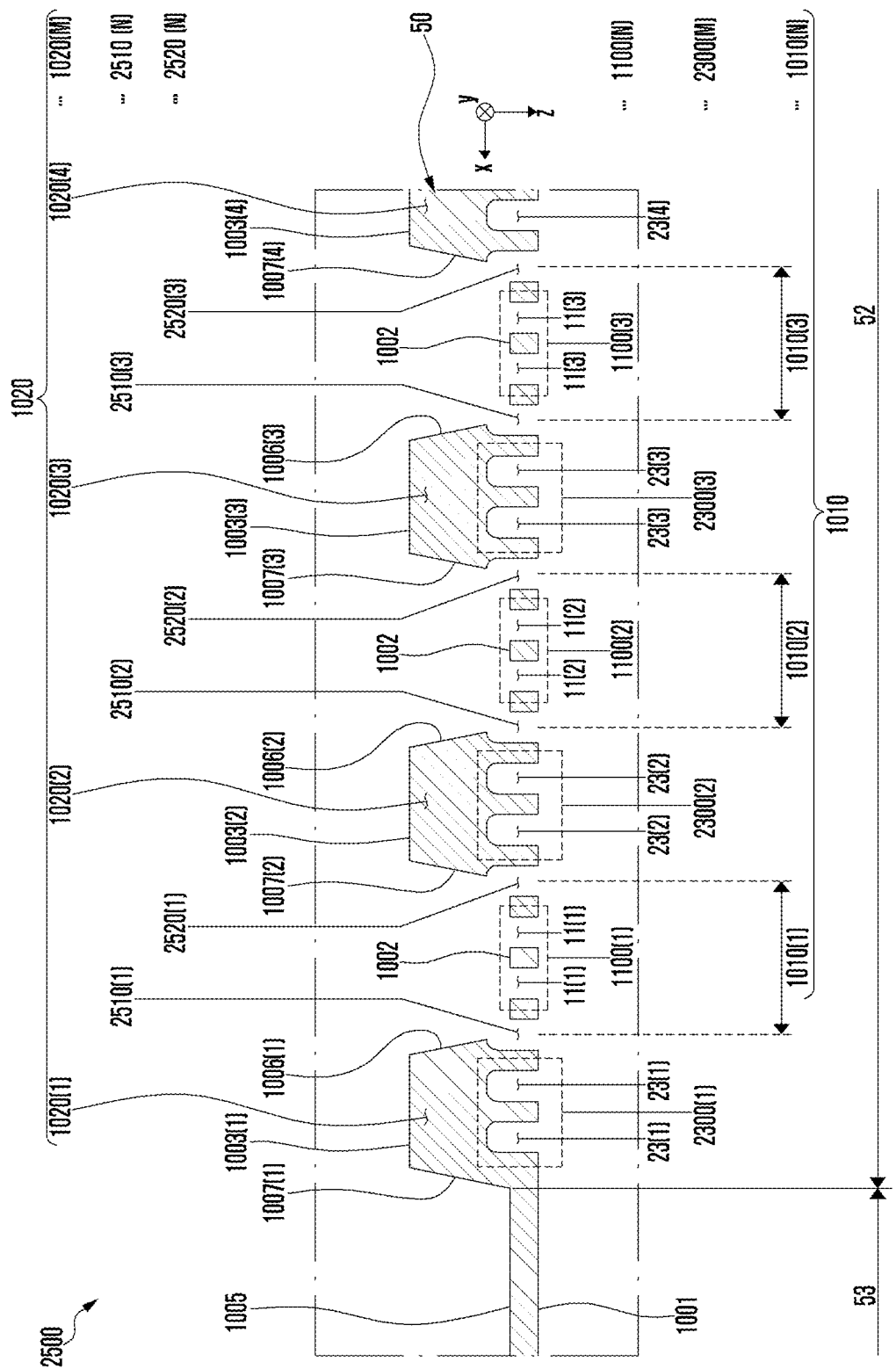
FIG. 25 is a cross-sectional view of a display support plate modified from the embodiment of FIG. 10 according to an embodiment.

FIG. 25 is a cross-sectional view 2500 of the display support plate 50 modified from the embodiment of FIG. 10 according to one embodiment.

With reference to FIG. 25, the second area 52 of the display support plate 50 may include the plurality of opening patterns 1100(1), 1100(2), 1100(3), . . . , and 1100(N), the plurality of recess patterns 2300(1), 2300(2), 2300(3), . . . , and 2300(M), a plurality of first openings 2510(1), 2510(2), 2510(3), . . . , and 2510(N), and/or a plurality of second openings 2520(1), 2520(2), 2520(3), . . . , and 2520(N). The plurality of opening patterns 1100(1), 1100(2), 1100(3), . . . , and 1100(N) may be formed in the first thickness part 1010. The plurality of recess patterns 2300(1), 2300(2), 2300(3), . . . , and 2300(M) may be formed in the second thickness part 1020. In one embodiment, the plurality of first openings 2510(1), 2510(2), 2510(3), . . . , and 2510(N) and the plurality of second openings 2520(1), 2520(2), 2520(3), . . . , and 2520(N) may be positioned, corresponding to a boundary part between the plurality of first portions 1010(1), 1010(2), 1010(3), . . . , and 1010(N) and the plurality of second portions 1020(1), 1020(2), 1020 (3), . . . , and 1020(M). For example, looking at one first opening 2510(1), between the recess pattern 2300(1) of the second portion 1020(1) and the opening pattern 1100(1) of the first portion 1010(1), the first opening 2510(1) may be positioned, corresponding to a boundary part between the first side surface 1006(1) and the second surface 1002. The remaining first openings 2510(2), 2510(3), . . . , and 2510(N) may be formed in substantially the same manner as the one first opening 2510(1). For example, looking at one second opening 2520(1), between the opening pattern 1100(1) of the first portion 1010(1) and the recess patterns 2300(2) of the second portion 1020(2), the second opening 2520(1) may be positioned, corresponding to a boundary part between the second side surface 1007(1) and the second surface 1002. The remaining second openings 2520(2), 2520(3), . . . , and 2520(N) may be formed in substantially the same manner as the one second opening 2520(1). In one embodiment, in the lattice structure included in the display support plate 50, the plurality of opening patterns 1100(1), 1100(2), 1100(3), . . . , and 1100(N), the plurality of recess patterns 2300(1), 2300(2), 2300(3), . . . , and 2300(M), the plurality of first openings 2510(1), 2510(2), 2510(3), . . . , and 2510(N), and the plurality of second openings 2520(1), 2520(2), 2520(3), . . . , and 2520(N) may be formed in substantially the same pattern, but there is no limitation thereto.

According to an embodiment, the plurality of first openings 2510(1), 2510(2), 2510(3), . . . , and 2510(N) and the plurality of second openings 2520(1), 2520(2), 2520(3), . . . , and 2520(N) may reduce the bending stress on a boundary part between the plurality of first portions 1010(1), 1010(2), 1010 (3), . . . , and 1010(N) and the plurality of second portions 1020(1), 1020(2), 1020(3), . . . , and 1020(M) of the second area 52 of the display support plate 50, which can serve to ensure the smooth bending of the second area 52.

According to an embodiment, the lattice structure including the plurality of opening patterns 1100(1), 1100(2), 1100(3), . . . , and 1100(N), the plurality of recess patterns 2300(1), 2300(2), 2300(3), . . . , and 2300(M), the plurality of first openings 2510(1), 2510(2), 2510(3), . . . , and 2510(N), and the plurality of second openings 2520(1), 2520(2), 2520(3), . . . , and 2520(N) may reduce an area of the plurality of second portions 1020(1), 1020(2), 1020(3), . . . , and 1020(M) connected to the rear surface of the flexible display 30 (e.g., the rear surface of the copper sheet 33e in FIG. 6). This can reduce the bending stress on the display assembly including the flexible display 30 and the display support plate 50, which can serve to ensure the smooth bending of the display assembly.

According to some embodiments, although not illustrated, the plurality of first openings 2510(1), 2510(2), 2510(3), . . . , and 2510(N) and/or the plurality of second openings 2520(1), 2520(2), 2520(3), . . . , and 2520(N) may be modified into a recess shape formed in the first surface 1001.

According to some embodiments, although not illustrated, the plurality of recess patterns 2300(1), 2300(2), 2300(3), . . . , and 2300(M) in the embodiment of FIG. 25 may be omitted.

Figure 26:
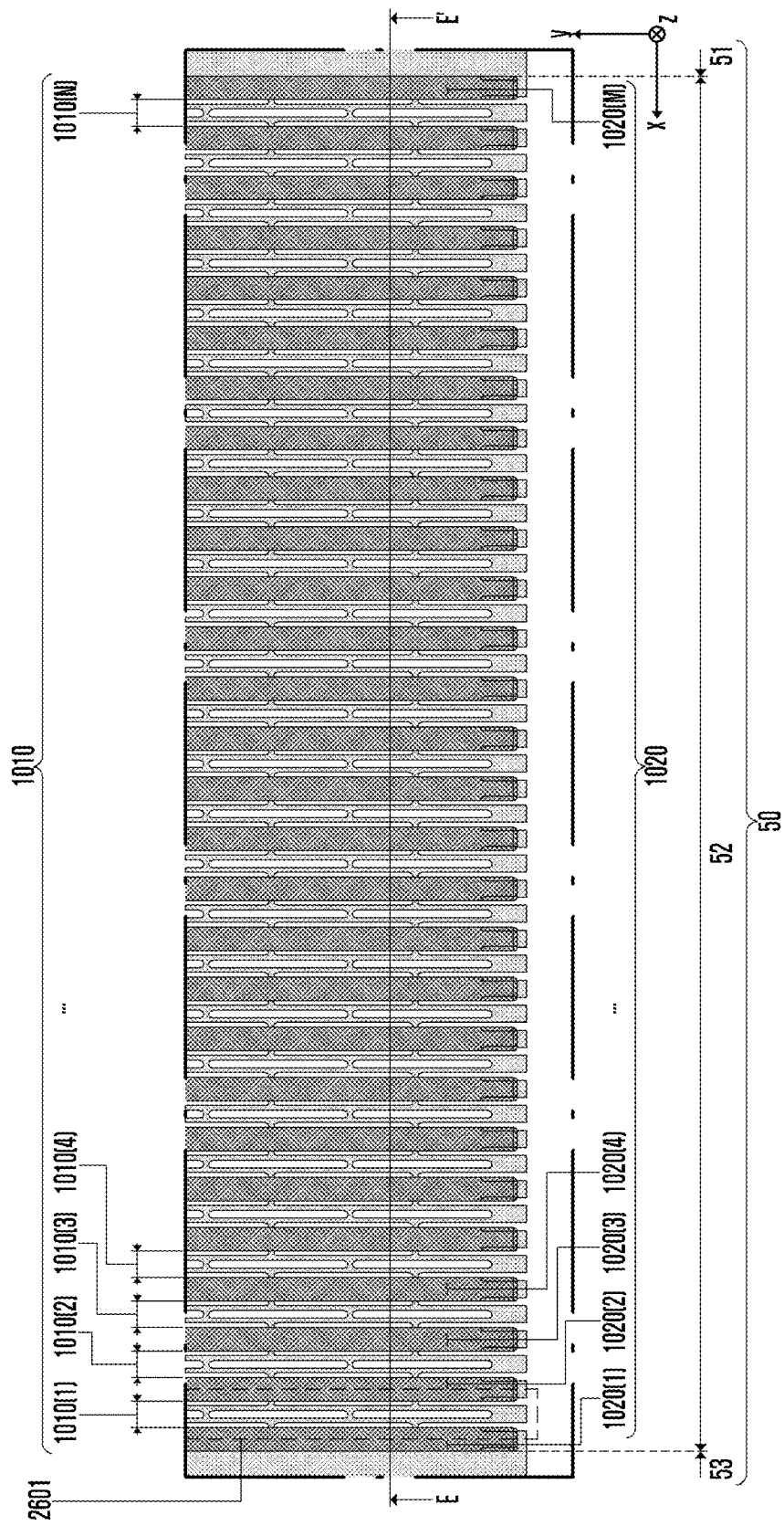
FIGS. 26 and 27 are views illustrating a display support plate according to another embodiment.
Figure 27:
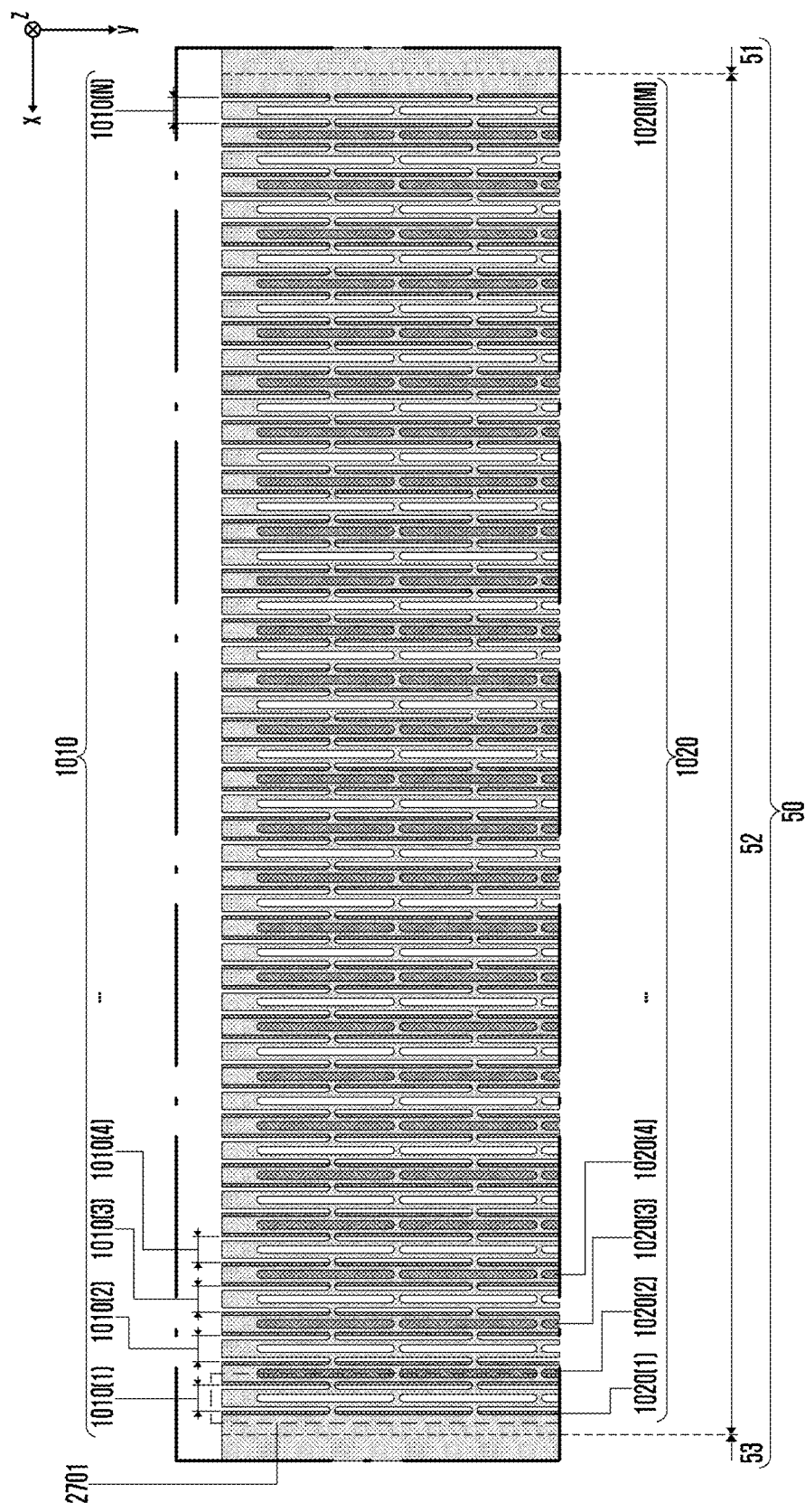
Figure 28:
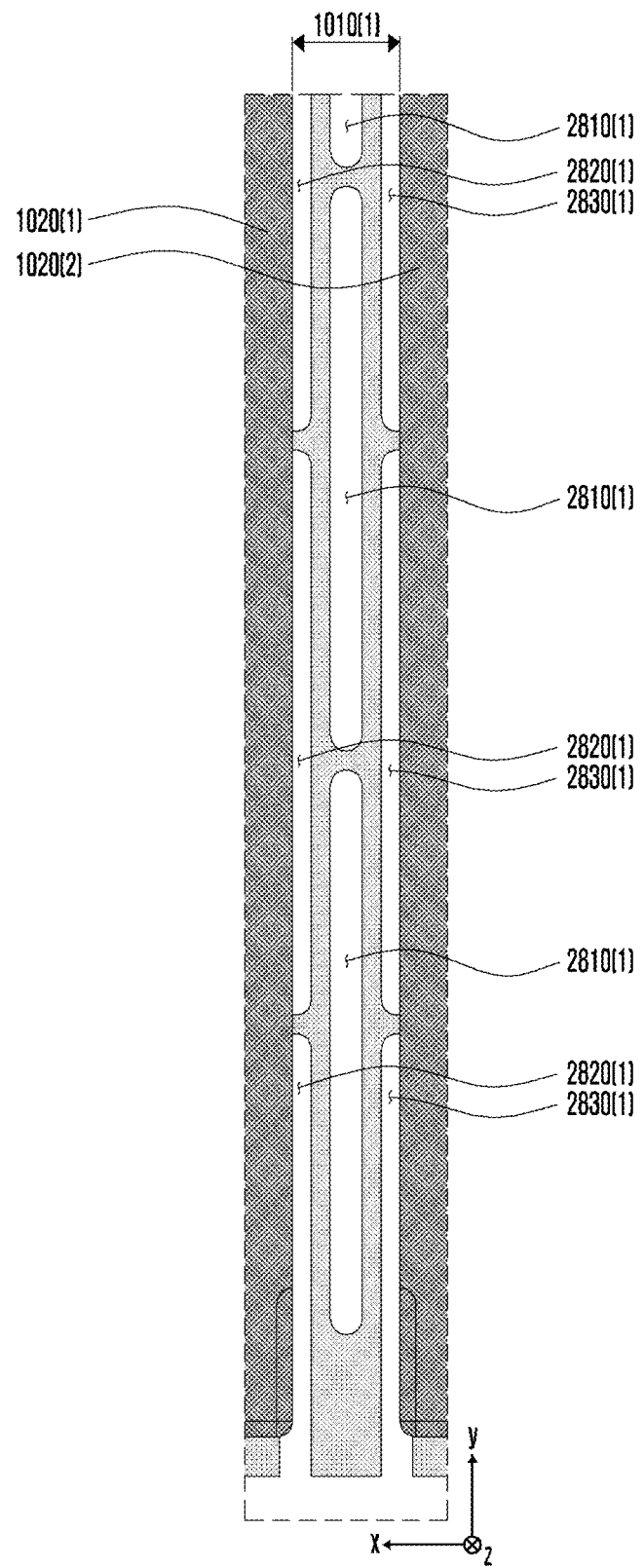
FIG. 28 is an enlarged view of a portion indicated by reference numeral '2601' in FIG. 26 according to an embodiment.
Figure 29:
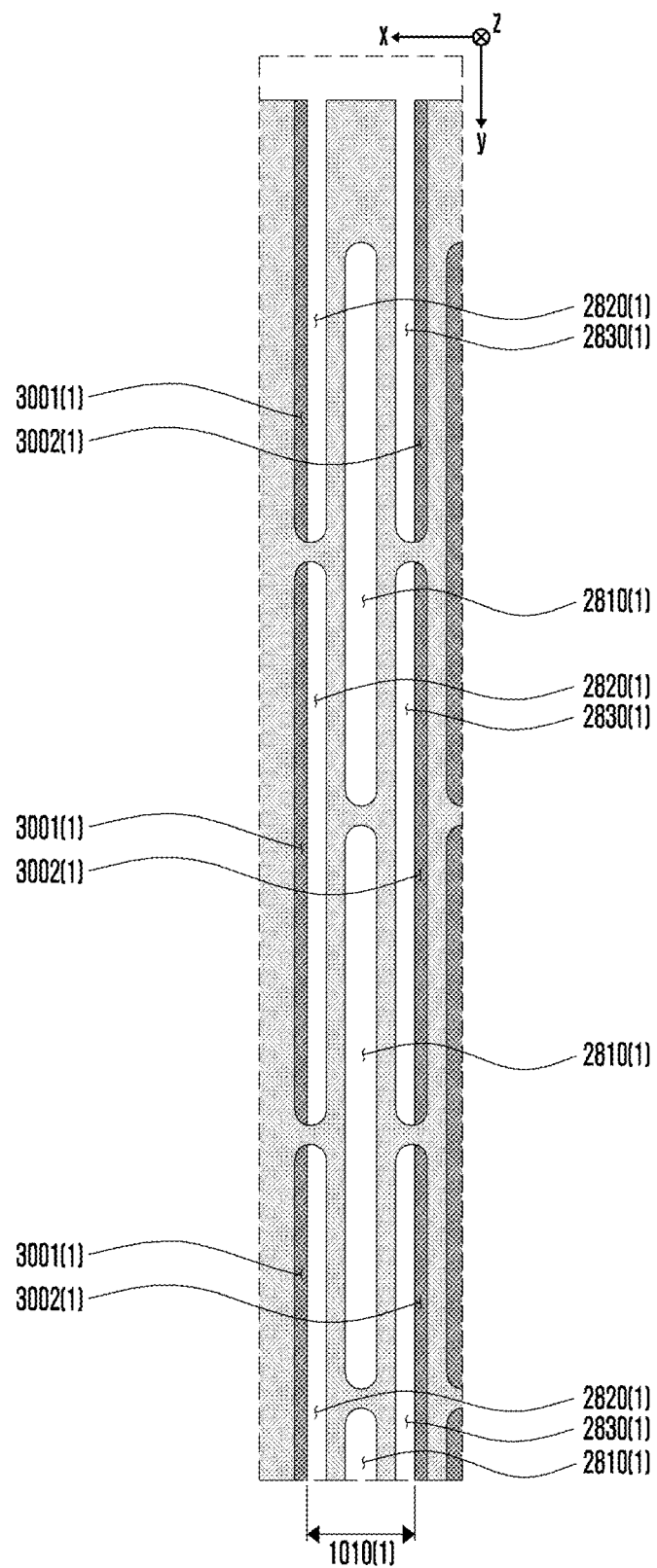
FIG. 29 is an enlarged view of a portion indicated by reference numeral '2701' in FIG. 27 according to an embodiment.
Figure 30:
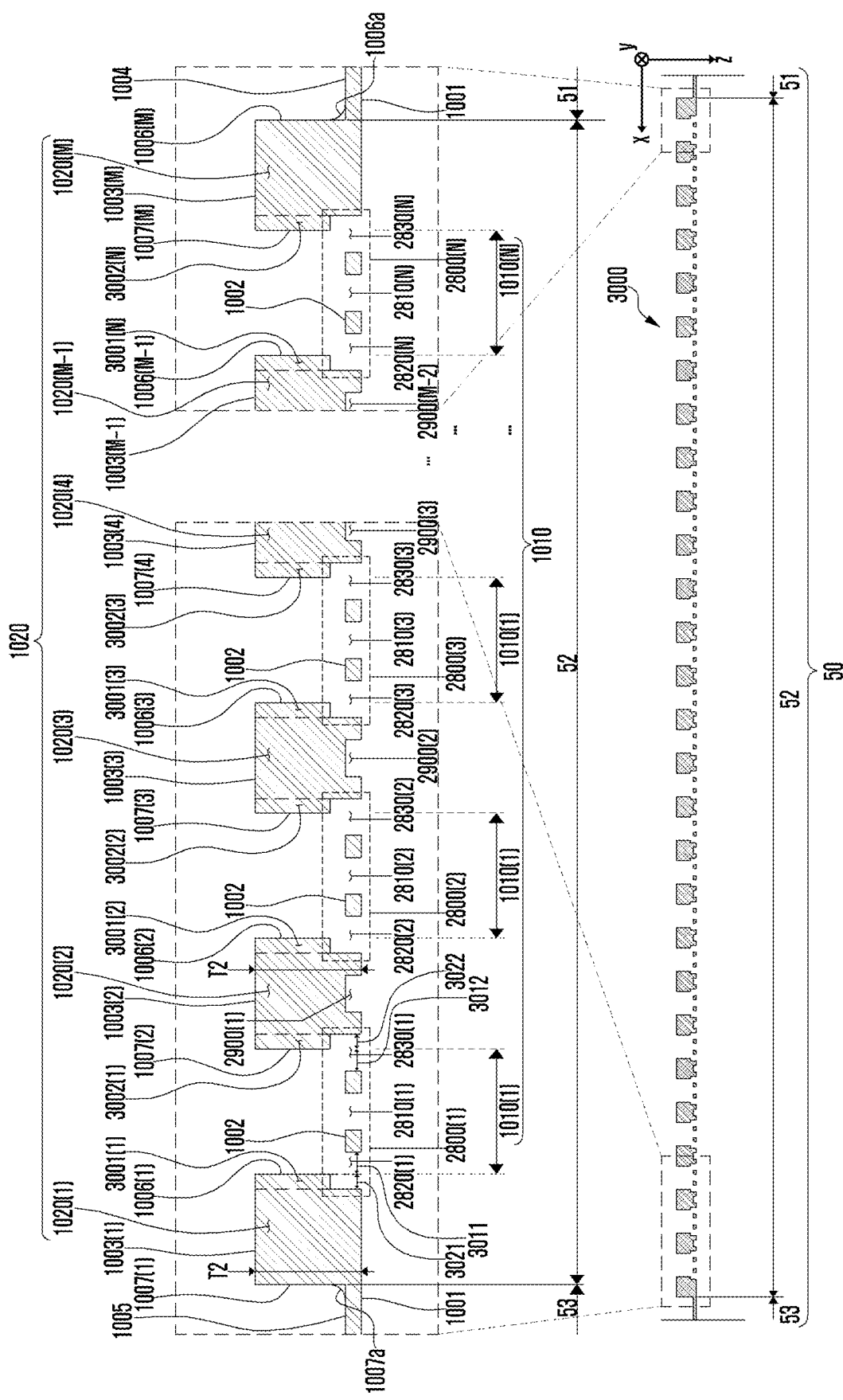
FIG. 30 is a cross-sectional view of the display support plate taken along line E-E' in FIG. 26 according to an embodiment.

FIGS. 26 and 27 are views illustrating the display support plate 50 according to another embodiment. FIG. 28 illustrates an enlarged view of a portion indicated by reference numeral '2601' in FIG. 26 according to an embodiment. FIG. 29 illustrates an enlarged view of a portion indicated by reference numeral '2701' in FIG. 27 according to an embodiment. FIG. 30 is a cross-sectional view 3000 of the display support plate 50 taken along line E-E' in FIG. 26 according to an embodiment. FIGS. 26 and 27 illustrate the unfolded state of the display support plate 50, and the z coordinate axis may correspond to the thickness direction of the display support plate 50.

With reference to FIGS. 26, 27, 28, 29, and 30, the display support plate 50 may include the plurality of opening patterns 2800(1), 2800(2), and 2800(3), . . . , and 2800(N) formed in the second area 52. The plurality of opening patterns 2800(1), 2800(2), 2800(3), . . . , and 2800(N) may be positioned, corresponding to the plurality of first portions 1010(1), 1010(2), 1010(3), . . . , and 1010(N) and arranged at intervals. In one embodiment, looking at one opening pattern 2800(1), the one opening pattern 2800(1) may include a plurality of first openings (or a plurality of first slits) 2810(1), a plurality of second openings (or a plurality of second slits) 2820(1), and/or a plurality of third openings (or a plurality of third slits) 2830(1). The plurality of first openings 2810(1) may be formed in the first portion 1010(1). The plurality of first openings 2810(1) may be disposed between the plurality of second openings 2820(1) and the plurality of third openings 2830(1). The plurality of second openings 2820(1) may be positioned corresponding to a boundary part between the first portion 1010(1) and the second portion 1020(1) adjacent to the first portion 1010(1). For example, the plurality of second openings 2820(1) may be positioned corresponding to a boundary part between the first side surface 1006(1) and the second surface 1002, between the first portion 1010(1) and the second portion 1020(1) adjacent to each other. Each of the plurality of second openings 2820(1) may have a hollow including one side space 3011 included in the first portion 1010(1) and another side space 3021 connected to the one side space 3011 and included in the second portion 1020(1). The second portion 1020(1) may include a portion having the second thickness T2, and a portion 3001(1) having a thickness thinner than the second thickness T2, corresponding to the plurality of second openings 2820(1) (hereinafter referred to as a 'third thickness part'). When viewed from above the first surface 1001 (e.g., when viewed in the −z axis direction), the third thickness part 3001(1) may be visible through the plurality of second openings 2820(1). The plurality of third openings 2830(1) may be positioned corresponding to a boundary part between the first portion 1010(1) and the second portion 1020(2) adjacent to the first portion 1010(1). For example, the plurality of third openings 2830(1) may be positioned corresponding to a boundary part between the second side surface 1007(2) and the second surface 1002, between the first portion 1010(1) and the second portion 1020(2) adjacent to each other. Each of the plurality of third openings 2830(1) may include a hollow including one side space 3012 included in the first portion 1010(1) and another side space 3022 connected to the one side space 3012, and included in the second portion 1020(2). The second portion 1020(2) may include a portion having the second thickness T2 and a portion 3002(1) having a thickness thinner than the second thickness T2, corresponding to the plurality of third openings 2820(1) (hereinafter referred to as a 'fourth thickness part'). When viewed from above the first surface 1001, the fourth thickness part 3002(1) may be visible through the plurality of third openings 2830(1). The other opening patterns 2800(2), 2800(3), 2800(4), . . . , and 2800(N) may be formed in substantially the same manner as the one opening pattern 2800(1). The lattice structure included in the display support plate 50 may be a form in which the plurality of opening patterns 2800(1), 2800(2), 2800(3), . . . , and 2800(N) is formed in substantially the same pattern, but there is no limitation thereon.

According to an embodiment, the plurality of second openings 2820(1), 2820(2), 2820(3), . . . , and 2820(N) and the plurality of third openings 2830(1), 2830(2), 2830(3), . . . , and 2830(N) of the plurality of opening patterns 2800(1), 2800(2), 2800(3), . . . , and 2800(N) may reduce the bending stress on a boundary part between the plurality of first portions 1010(1), 1010(2), 1010(3), . . . , and 1010(N) and the plurality of second portions 1020(1), 1020(2), 1020(3), . . . , and 1020(M) of the second area 52 of the display support plate 50, which can serve to ensure a smooth bending of the second area 52.

As shown in FIG. 30, according to an embodiment, the second thickness part 1020 of the display support plate 50 may include a plurality of recess patterns 2900(1), 2900(2), 2900(3), . . . , and 2900(M−2) formed on the first surface 1001, corresponding to the plurality of second portions 1020(2), 1020(3), 1020(4), . . . , and 1020(M−1). Without being limited to the illustrated example, a recess pattern may be formed in the first surface 1001, corresponding to the one second portion 1020(1) connected to the third area 53. Further, without being limited to the illustrated example, a recess pattern may be formed in the first surface 1001, corresponding to the one second portion 1020(M) connected to the first area 51. In one embodiment, the lattice structure included in the display support plate 50 may be a form in which the plurality of opening patterns 2800(1), 2800(2), 2800(3), . . . , and 2800(N) and the plurality of recess patterns 2900(1), 2900(2), 2900(3), . . . , and 2900(M−2) are formed or arranged in substantially the same pattern, but there is no limitation thereon.

According to an embodiment, the rear surface (e.g., the rear surface of the copper sheet 33e in FIG. 6) facing opposite to a surface of the flexible display 30 that is visually exposed through the transparent cover 35 (see FIG. 6) may be connected to the first surface 1001 of the display support plate 50. An area of the first surface 1001 corresponding to the first thickness part 1010 includes the plurality of opening patterns 2800(1), 2800(2), 2800(3), . . . , and 2800(N), and may be connected to the first rear area (not illustrated) of the rear surface of the flexible display 30 to support the first rear area. An area of the first surface 1001 corresponding to the second thickness part 1020 may include the plurality of recess patterns 2900(1), 2900(2), 2900(3), . . . , and 2900(M−2), and may be connected to the second rear area (not illustrated) of the rear surface of the flexible display 30 to support the second rear area. The first thickness part 1010 including the plurality of opening patterns 2800(1), 2800(2), 2800(3), . . . , and 2800(N) may support the first display area (or the first screen area) of the flexible display 30 including the first rear area. The second thickness part 1020 including the plurality of recess patterns 2900(1), 2900(2), 2900(3), . . . , and 2900(M−2) may support the second display area (or the second screen area) of the flexible display 30 corresponding to the second rear area. In one embodiment, when viewing a screen (e.g., the screen S in FIG. 4), the plurality of recess patterns 2900(1), 2900(2), 2900(3), . . . , and 2900(M−2) may reduce a phenomenon in which visual patterns corresponding to the plurality of opening patterns 2800(1), 2800(2), 2800(3), . . . , and 2800(N) are highlighted through the first display area. The plurality of opening patterns 2800(1), 2800(2), 2800(3), . . . , and 2800(N) and the plurality of recess patterns 2900(1), 2900(2), 2900(3), . . . , and 2900(M−2) are formed or arranged in substantially the same pattern, so that when viewing the screen, a phenomenon in which the visual pattern caused by the plurality of opening patterns 2800(1), 2800(2), 2800(3), . . . , and 2800(N) visible through the first display area and the visual pattern caused by the plurality of recess patterns 2900(1), 2900(2), 2900(3), . . . , and 2900(M−2) visible through the second display area are visually separated can be reduced. In one embodiment, the plurality of opening patterns 2800(1), 2800(2), 2800(3), . . . , and 2800(N) and the plurality of recess patterns 2900(1), 2900(2), 2900(3), . . . , and 2900(M−2) are formed or arranged in substantially the same pattern, so that the difference between the effect (e.g., pressure) of the first thickness part 1010 on the first display area and the effect (e.g., pressure) of the second thickness part 1020 on the second display area may be reduced, which may serve to ensure the image of even visual quality displayed through the screen. The plurality of opening patterns 2800(1), 2800(2), 2800(3), . . . , and 2800(N) and the plurality of recess patterns 2900(1), 2900(2), 2900(3), . . . , and 2900(M−2) are formed or arranged in substantially the same pattern, so that the difference between a structure in which the first thickness part 1010 supports (or pressurizes) the first display area and a structure in which the second thickness part 1020 supports (or pressurizes) the second display area may be reduced, which may reduce a difference in image output characteristics (e.g., pixel color) between the first display area and the second display area.

According to an embodiment, the lattice structure including the plurality of opening patterns 2800(1), 2800(2), 2800(3), . . . , and 2800(N) and the plurality of recess patterns 2900(1), 2900(2), 2900(3), . . . , and 2900(M−2) may reduce an area of the plurality of second portions 1020(1), 1020(2), 1020(3), . . . , and 1020(M) connected to the rear surface (e.g., the rear surface of the copper sheet 33e in FIG. 6) of the flexible display 30. This can reduce the bending stress on the display assembly including the flexible display 30 and the display support plate 50, and can serve to ensure the smooth bending of the display assembly. According to some embodiments, the plurality of opening patterns 2800(1), 2800(2), 2800(3), . . . , and 2800(N) in the embodiment of FIG. 30 may be replaced with the plurality of recess patterns 1800(1), 1800(2), 1800(3), . . . , and 1800(N) of the embodiment of FIG. 17. In some embodiments, the plurality of recess patterns 2900(1), 2900(2), 2900(3), . . . , and 2900(M−2) may be omitted.

According to some embodiments, although not illustrated, the plurality of second openings 2820(1), 2820(2), 2820(3), . . . , and 2820(N) and/or the plurality of third openings 2830(1), 2830(2), 2830(3), . . . , and 2830(N) may be implemented by being modified into recesses formed in the first surface 1001.

According to some embodiments, although not illustrated, the plurality of first openings 2810(1), 2810(2), 2810(3), . . . , and 2810(N) may be implemented by being modified into recesses formed in the first surface 1001.

In one embodiment, looking at one second portion 1020 (M) as shown in FIG. 30, when viewed in cross section, the second portion 1020(M) may include a third surface 1003 (M), a first side surface 1006(M) extending from one edge of the third surface 1003(M) to the second surface 1002, and a second side surface 1007(M) extending from the other edge of the third surface 1003(M) to the second surface 2002. The third surface 1003(M) may include a substantially flat surface. The third surface 1003(M) may be substantially parallel to the first surface 1001 and/or the second surface 1002 in the state in which the display support plate 50 is unfolded. The first side surface 1006(M) and the second side surface 1007(M) may be symmetrically disposed on opposite sides of the third surface 1003(M). In one embodiment, a portion of the second portion 1020(M) that protrudes with respect to the second surface 1002 and includes the third surface 1003(M), the first side surface 1006(M), and the second side surface 1007(M) may have a rectangular cross-sectional shape. For example, the first side surface 1006(M) and the second side surface 1007(M) may be substantially perpendicular to the third surface 1003(M). The remaining second portions 1020(1), 1020(2), 1020(3), . . . , and 1020(M−1) may be formed in substantially the same shape as one second portion 1020(M).

Figure 31:
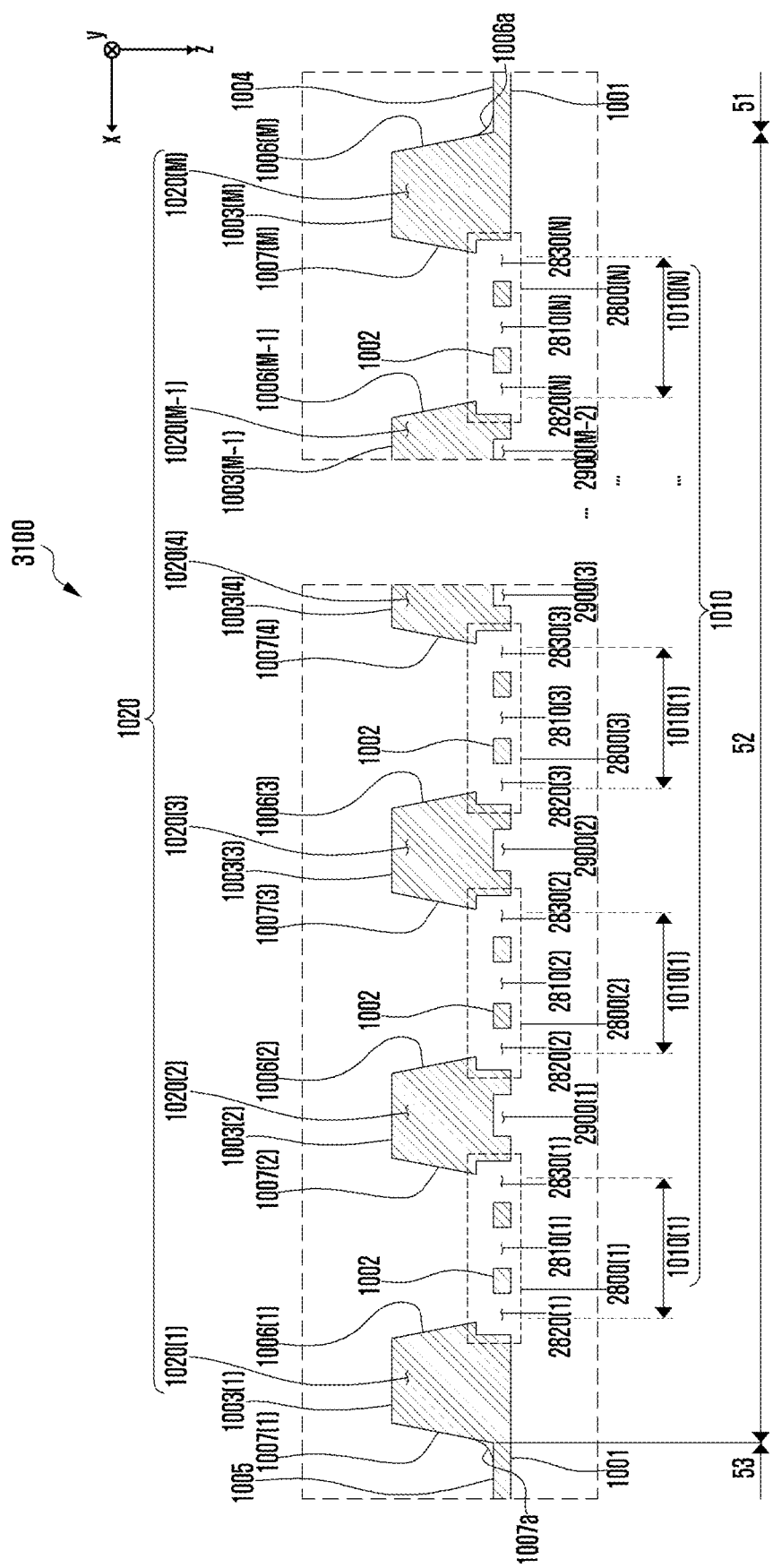
FIG. 31 is a cross-sectional view of a display support plate modified from the embodiment of FIG. 30 according to an embodiment.

FIG. 31 is a cross-sectional view 3100 of the display support plate 50 modified from the embodiment of FIG. 30 according to an embodiment.

With reference to FIG. 31, looking at one second portion 1020(M), the second portion 1020(M) may have a cross-sectional shape narrowing in the direction from the first surface 1001 to the third surface 1003(M). For example, a portion of the second portion 1020(M) that protrudes with respect to the second surface 1002 and includes the third surface 1003(M), the first side surface 1006(M), and the second side surface 1007M may have a cross-sectional shape of an isosceles trapezoid. For example, the first side surface 1006(M) and the second side surface 1007(M) may form the same obtuse (but opposite) angle with respect to the third surface 1003(M). The remaining second portions 1020 (1), 1020(2), 1020(3), . . . , and 1020 (M−1) may be formed in substantially the same shape as the one second portion 1020(M).

Figure 32:
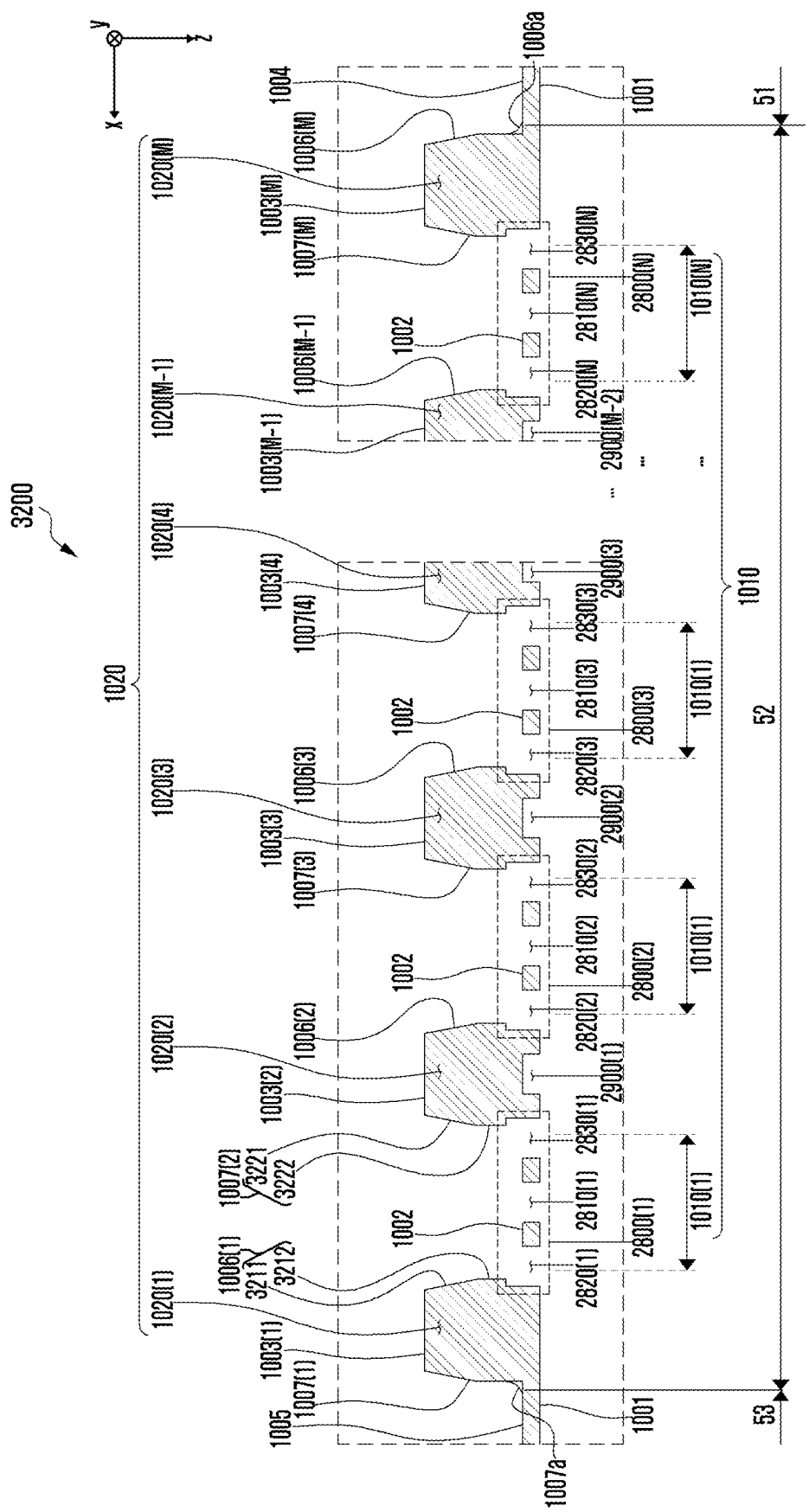
FIG. 32 is a cross-sectional view of a display support plate modified from the embodiment of FIG. 30 according to an embodiment.

FIG. 32 is a cross-sectional view 3200 of the display support plate 50 modified from the embodiment of FIG. 30 according to an embodiment.

With reference to FIG. 32, looking at the first side surface 1006(1) of one second portion 1020(1) connected to the third area 53, when viewed in cross section, the first side surface 1006(1) may include a first side area 3211 and a second side area 3212. The first side area 3211 may extend from an edge of the third surface 1003(1) and form an obtuse angle with the third surface 1003(1). The second side area 3212 may extend from the first side area 3211 and form an obtuse angle with the first side area 3211. The remaining first side surfaces 1006(2), 1006(3), 1006(4), . . . , and 1006(M) may be formed in substantially the same shape as the one first side surface 1006(1). In one embodiment, the second side area included on the first side surface 1006(M) of one second portion 1020(M) connected to the first area 51 may form a substantially right angle or an acute angle with the fourth surface 1004. In one embodiment, the second side areas included in the first side surfaces 1006(1), 1006(2), 1006(3), . . . , and 1006(M−1) of the remaining second portions 1020(1), 1020(2), 1020(3), . . . , and 1020(M−1) may form a substantially right angle or an acute angle with the second surface 1002.

According to an embodiment, looking at the second side surface 1007(2) of another second portion 1020(2) adjacent to the second portion 1020(1) connected to the first area 52, when viewed in cross section, the second side surface 1007(2) may include a third side area 3221 and a fourth side area 3222. The third side area 3221 may extend from an edge of the third surface 1003(2) and form an obtuse angle with the third surface 1003(2). For example, the angle formed by the third side area 3221 with respect to the third surface 1003(2) may be substantially the same as the angle formed by the first side area 3211 with respect to the third surface 1003(1). The fourth side area 3222 may extend from the third side area 3221 and form an obtuse angle with the third side area 3221. For example, the angle formed by the fourth side area 3222 with respect to the third side area 3221 may be substantially the same as the angle formed by the second side area 3212 with respect to the first side area 3211. The remaining second side surfaces 1007(1), 1007(3), 1007(4), . . . , and 1007(M) may be formed in substantially the same shape as the one first side surface 1007(2). In one embodiment, the fourth side area included in the second side surface 1007(1) of one second portion 1020(1) connected to the third area 53 may form a substantially right angle or an acute angle with respect to the fifth surface 1005. In one embodiment, the fourth side areas included in the second side surfaces 1007(2), 1007(3), 1007(4), . . . , and 1007(M) of the remaining second portions 1020(2), 1020(3), 1020(4), . . . , and 1020(M) may form a substantially right angle or an acute angle with the second surface 1002.

The plurality of first side surfaces 1006(1), 1006(2), 1006(3), . . . , and 1006(M) or the plurality of second side surfaces 1007(1), 1007(2), 1007(3), . . . , and 1007(M) are not limited to the embodiments of FIG. 30, 31, or 32 and may be implemented in various other forms.

In the embodiments of FIG. 30, 31, or 32, one second portion 1020(M) of the plurality of second portions 1020(1), 1020(2), 1020(3), . . . , and 1020(M) included in the second area 52 of the display support plate 50 may be connected to the first area 51. A boundary part where the first side surface 1006(M) of the second portion 1020(M) and the fourth surface 1004 of the first area 51 are connected may be formed in a corner shape. In some embodiments, a boundary part where the first side surface 1006(M) of the second portion 1020(M) and the fourth surface 1004 of the first area 51 are connected may be formed in a curved shape as indicated by reference numeral '1006a'. In some embodiments, although not illustrated, a boundary part where the first side surface 1006(M) of the second portion 1020(M) and the fourth surface 1004 of the first area 51 are connected may be formed in an inclined surface shape. A curved shape or inclined surface shape of the boundary part where the first side surface 1006(M) of the second portion 1020(M) and the fourth surface 1004 of the first area 51 are connected may prevent, for example, the bending stress when the display support plate 50 is bent from being concentrated on the boundary part (e.g., rigidity reinforcement).

In the embodiments of FIG. 30, 31, or 32, any one second portion 1020(1) of the plurality of second portions 1020(1), 1020(2), 1020(3), . . . , and 1020(M) included in the second area 52 of the display support plate 50 may be connected to the third area 53. A boundary part where the second side surface 1007(1) of the second portion 1020(1) and the fifth surface 1005 of the third area 53 are connected may be formed in a corner shape. In some embodiments, a boundary part where the second side surface 1007(1) of the second portion 1020(1) and the fifth surface 1005 of the third area 53 are connected may be formed in a curved shape as indicated by reference numeral '1007a'. In some embodiments, although not illustrated, a boundary part where the second side surface 1007(1) of the second portion 1020(1) and the fifth surface 1005 of the third area 53 are connected may be formed in an inclined plane shape. A curved shape or inclined surface shape of the boundary part where the second side surface 1007(1) of the second portion 1020(1) and the fifth surface 1005 of the third area 53 are connected may prevent, for example, the bending stress when the display support plate 50 is bent from being concentrated on the boundary part (e.g., rigidity reinforcement).

In the embodiments of FIG. 30, 31, or 32, the boundary parts where the second surface 1002 and the plurality of first side surfaces 1006(1), 1006(2), 1006(3), . . . , and 1006(M−1) are connected, and/or the boundary parts where the second surface 1002 and the plurality of second side surfaces 1007(2), 1007(3), . . . , and 1007(M) are connected may be formed in the form of a corner. In some embodiments, although not illustrated, the boundary parts where the second surface 1002 and the plurality of first side surfaces 1006(1), 1006(2), 1006(3), . . . , and 1006(M−1) are connected, and/or the boundary parts where the second surface 1002 and the plurality of second side surfaces 1007(2), 1007(3), . . . , and 1007(M) are connected may be formed in a curved shape or an inclined surface shape.

Figure 33:
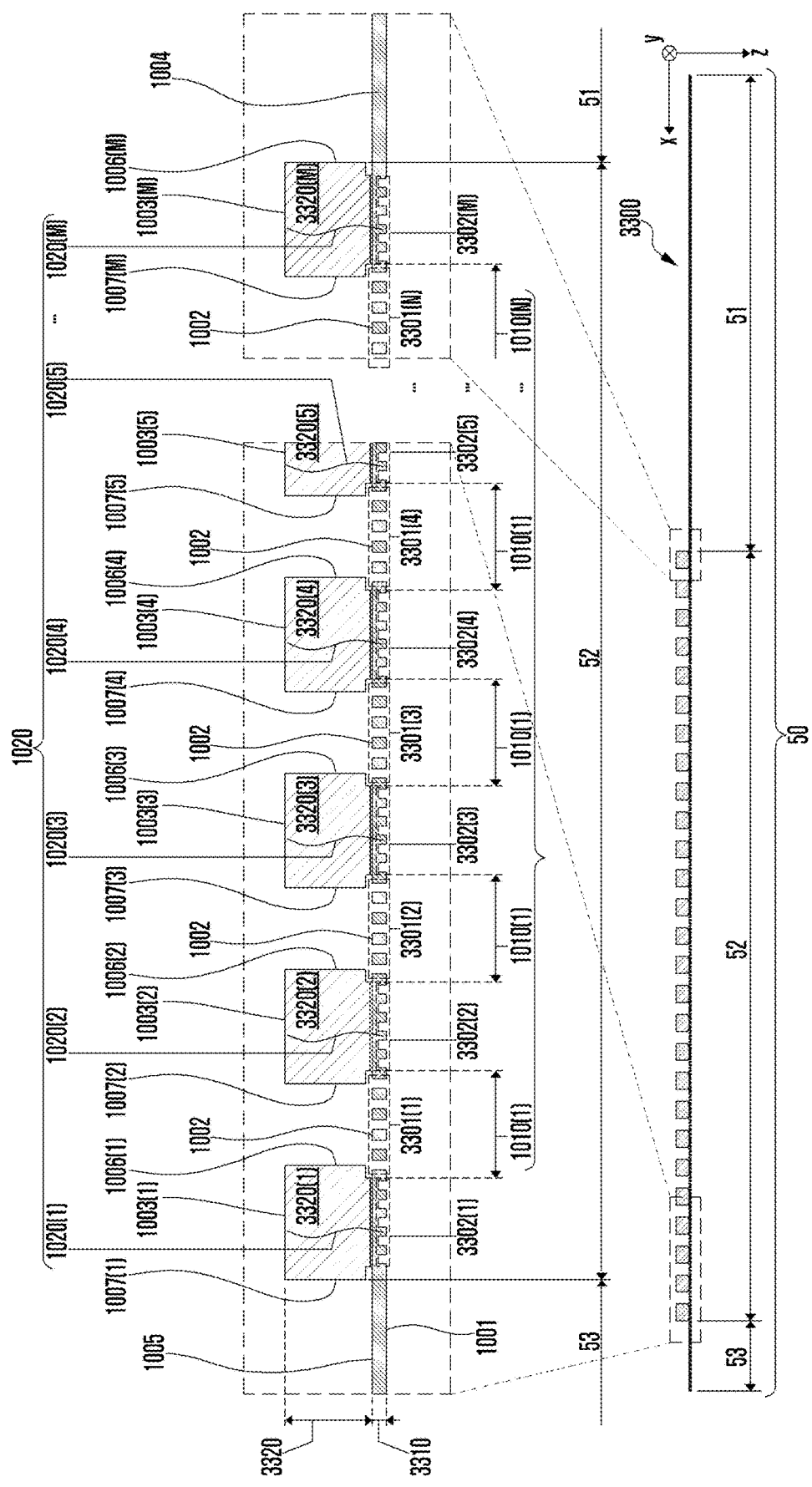
FIG. 33 is a cross-sectional view of a display support plate modified from the embodiment of FIG. 30 according to an embodiment.
Figure 34:
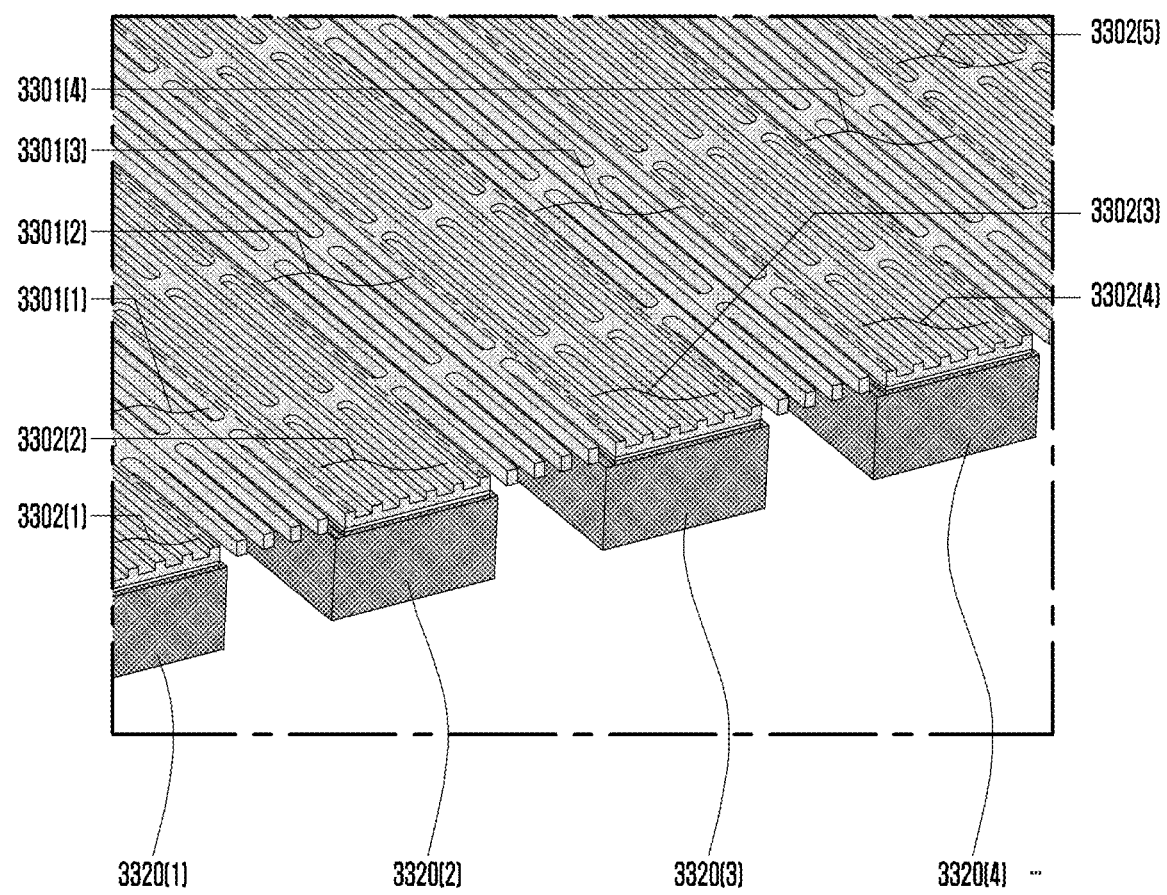
FIG. 34 is a perspective view of the display support plate of FIG. 33, according to one embodiment.

FIG. 33 is a cross-sectional view 3300 of the display support plate 50 modified from the embodiment of FIG. 30 according to an embodiment. FIG. 34 is a perspective view of the display support plate 50 of FIG. 33 according to one embodiment.

With reference to FIGS. 33 and 34, the display support plate 50 may be implemented in a form of separately coupling (e.g., attaching) to a multi-bar structure 3320, compared to the display support plate 50 according to the embodiment of FIG. 30. The multi-bar structure 3320 may include, for example, a form in which a plurality of support bars (or multi-bars) 3320(1), 3320(2), 3320(3), . . . , and 3320(M) extend in a direction orthogonal to the slide-out direction (e.g., +x axis direction) (e.g., +y axis direction, −y axis direction) protrudes with respect to the second surface 1002 and is arranged. The display support structure 50 may include, for example, a plate 3310 and a multi-bar structure 3320 coupled to the plate 3310. The multi-bar structure 3320 may be formed by a height difference between the plurality of first portions 1010(1), 1010(2), 1010(3), . . . , and 1010(N) and the plurality of second portions 1020(1), 1020(2), 1020(3), . . . , and 1020(M) in the second area 52 of the display support plate 50. In the embodiment of FIG. 33, the first thickness part 1010 including the plurality of first portions 1010(1), 1010(2), 1010(3), . . . , and 1010(N) may be formed by a portion of the plate 3310 where the multi-bar structure 3320 is not disposed. In the embodiment of FIG. 33, the second thickness part 1020 including the plurality of second portions 1020(1), 1020(2), 1020(3), . . . , and 1020(M) may be formed by the multi-bar structure 3320 and a portion of the plate 3310 where the multi-bar structure 3320 is disposed. In the embodiment of FIG. 33, the plurality of third surfaces 1003(1), 1003(2), 1003(3), . . . , and 1003(M), the plurality of sixth surfaces 1006(1), 1006(2), 1006(3), . . . , and 1006(M), and the plurality of seventh surfaces 1007(1), 1007(2), 1007(3), . . . , and 1007(M) may be formed by the multi-bar structure 3320.

According to an embodiment, the plate 3310 may include or be formed from a metal material. In some embodiments, the plate 3310 may include or be formed from a polymer such as an engineering plastic. In some embodiments, the plate 3310 may be formed from or include multiple different materials (e.g., both metallic and non-metallic materials).

According to an embodiment, the multi-bar structure 3320 may include or be formed from a metal material. In some embodiments, the multi-bar structure 3320 may include or be formed from a polymer such as an engineering plastic. In some embodiments, the multi-bar structure 3320 may be formed from or include multiple different materials (e.g., both metallic and non-metallic materials).

According to an embodiment, the plate 3310 and the multi-bar structure 3320 may include or be formed from the same material. In some embodiments, the plate 3310 and the multi-bar structure 3320 may include or be formed from different materials.

According to an embodiment, the display support plate 50 may include an adhesive member (or adhesive material) disposed between the plate 3310 and the multi-bar structure 3320. The adhesive member may include a material capable of securing interfacial bonding with the plate 3310 and the multi-bar structure 3320. The adhesive member may include, for example and without limitation, a thermally reactive adhesive material, a photoreactive adhesive material, a general adhesive, a double-sided tape, or an organic adhesive material.

According to an embodiment, the plate 3310 may include a plurality of opening patterns 3301(1), 3301(2), 3301(3), . . . , and 3301(N) formed corresponding to the plurality of first portions 1010(1), 1010(2), 1010(3), . . . , and 1010(N). The plate 3310 may include a plurality of recess patterns 3302(1), 3302(2), 3302(3), . . . , and 3302(M) formed in the first surface 1001, corresponding to the plurality of second portions 1020(1), 1020(2), 1020(3), . . . , and 1020(M). In the lattice structure included in the display support plate 50, the plurality of opening patterns 3301(1), 3301(2), 3301(3), . . . , and 3301(N) and the plurality of recess patterns 3302 (1), 3302(2), 3302(3), . . . , and 3302(M) may be formed in substantially the same pattern, but there is no limitation thereon.

According to an embodiment, the rear surface (e.g., the rear surface of the copper sheet 33e in FIG. 6) facing opposite to a surface of the flexible display 30 that is visually exposed through the transparent cover 35 (see FIG. 6) may be connected to the first surface 1001 of the display support plate 50. An area of the first surface 1001 corresponding to the first thickness part 1010 may include the plurality of opening patterns 3301(1), 3301(2), 3301(3), . . . , and 3301(N), and may be connected to the first rear area (not illustrated) of the rear surface of the flexible display 30 to support the first rear area. An area of the first surface 1001 corresponding to the second thickness part 1020 may include the plurality of recess patterns 3302(1), 3302(2), 3302(3), . . . , and 3302(M) and may be connected to the second rear area (not illustrated) of the rear surface of the flexible display 30 to support the second rear area. The first thickness part 1010 including the plurality of opening patterns 3301(1), 3301(2), 3301(3), . . . , and 3301(N) may support the first display area (or the first screen area) of the flexible display 30 including the first rear area. The second thickness part 1020 including the plurality of recess patterns 3302(1), 3302(2), 3302(3), . . . , and 3302(M) may support the second display area (or the second screen area) corresponding to the rear area of the flexible display 30. In one embodiment, the plurality of recess patterns 3302(1), 3302 (2), 3302(3), . . . , and 3302(M), when viewing a screen (e.g., the screen S1 in FIG. 4), may reduce a phenomenon in which the visual pattern corresponding to the plurality of opening patterns 3301(1), 3301(2), 3301(3), . . . , and 3301(N) is highlighted through the first display area. The plurality of opening patterns 3301(1), 3301(2), 3301(3), . . . , and 3301(N) and the plurality of recess patterns 3302(1), 3302 (2), 3302(3), . . . , and 3302(M) may be formed or arranged in substantially the same pattern, so that when viewing a screen, a phenomenon in which the visual pattern caused by the plurality of opening patterns 3301(1), 3301(2), 3301(3), . . . , and 3301(N) visible through the first display area and the visual pattern caused by the plurality of recess patterns 3302(1), 3302(2), 3302(3), . . . , and 3302 (M) visible through the second display area are visually separated can be reduced. In one embodiment, the plurality of opening patterns 3301(1), 3301(2), 3301(3), . . . , and 3301(N) and the plurality of recess patterns 3302(1), 3302 (2), 3302(3), . . . , and 3302(M) are formed or arranged in substantially the same pattern, so the difference between the effect (e.g., pressure) of the first thickness part 1010 on the first display area and the effect (e.g., pressure) of the second thickness part 1020 on the second display area is reduced to serve to ensure the image of even visual quality displayed through the screen. The plurality of opening patterns 3301 (1), 3301(2), 3301(3), . . . , and 3301(N) and the plurality of recess patterns 3302(1), 3302(2), 3302(3), . . . , and 3302 (M) are formed or arranged in substantially the same pattern, so that the difference between a structure in which the first thickness part 1010 supports (or pressurizes) the first display area and a structure in which the second thickness part 1020 supports (or pressurizes) the second display area may be reduced, which may reduce a difference in image output characteristics (e.g., pixel color) between the first display area and the second display area.

According to an embodiment, the lattice structure including the plurality of opening patterns 3301(1), 3301(2), 3301(3), . . . , and 3301(N) and the plurality of recess patterns 3302(1), 3302(2), 3302(3), . . . , and 3302(M) may reduce an area of the plurality of second portions 1020(1), 1020(2), 1020(3), . . . , and 1020 (M) connected to the rear surface of the flexible display 30 (e.g., the rear surface of the copper sheet 33e in FIG. 6). This can reduce the bending stress on the display assembly including the flexible display 30 and the display support plate 50, and can serve to ensure the smooth bending of the display assembly. According to some embodiments, the plurality of opening patterns 3301 (1), 3301(2), 3301(3), . . . , and 3301(N) in the embodiment of FIG. 33 may be replaced with the plurality of recess patterns 1800(1), 1800(2), 1800(3), . . . , and 1800(N) according to the embodiment of FIG. 17.

According to an embodiment, looking at one opening pattern 3301(1), the opening pattern 3301(1) may include a plurality of first openings (e.g., the plurality of first openings 2810(1) in FIG. 30), a plurality of second openings (e.g., the plurality of second openings 2810(2) in FIG. 30), and a plurality of third openings (e.g., the plurality of third openings 2810(3) in FIG. 30). The plurality of second openings may be formed, for example, corresponding to a boundary part between the first portion 1010(1) and a second portion 1020 adjacent to the first portion 1010(1) (e.g., a boundary part between the first side surface 1006(1) and the second surface 1002). When viewed above the first surface 1001 (e.g., when viewed in the −z axis direction), a portion (e.g., the third thickness part 3001(1) in FIG. 30) of one support bar 3320(1) adjacent to the opening pattern 3301(1) corresponding the plurality of second opening may be visible through the plurality of second openings. The plurality of third openings may be formed, for example, corresponding to a boundary part between the first portion 1010(1) and another second portion 1020(2) adjacent to the first portion 1010(1) (e.g., the boundary part between the second side surface 1007(2) and the second surface 1002). When viewed above the first surface 1001, a portion (e.g., the fourth thickness part 3002(2) in FIG. 30) of another support bar 3320(2) adjacent one opening pattern 3301(1) corresponding to the plurality of third openings can be visible through the plurality of third openings. The other opening patterns 3301(2), 3301(3), 3301(4), . . . , and 3301(N) may be formed in substantially the same manner as the one opening pattern 3301(1). The lattice structure included in the display support plate 50 may have a form in which the plurality of opening patterns 3301(1), 3301(2), and 3301(3), . . . , and 3301(N) is formed or arranged in substantially the same pattern, but is not limited thereto. The plurality of second openings and the plurality of third openings of the plurality of opening patterns 3301(1), 3301(2), 3301(3), . . . , and 3301(N) may reduce the bending stress on a boundary part between the plurality of first portions 1010(1), 1010(2), 1010(3), . . . , and 1010(N) and the plurality of second portions 1020(1), 1020 (2), 1020(3), . . . , and 1020(M) of the second area 52 of the display support plate 50, which may serve to ensure the smooth bending of the second area 52.

The plurality of second openings and the plurality of third openings of the plurality of opening patterns 3301(1), 3301 (2), 3301(3), . . . , and 3301(N) may reduce the stress generated in the attachment area between the plurality of support bars 3320(1), 3320(2), 3320(3), . . . , and 3320(M) and the plate 3310 when the display support plate 50 is bent, which can reduce the disengagement or separation of the plurality of support bars 3320(1), 3320(2), 3320(3), . . . , and 3320(M) from the plate 3310. According to some embodiments, some of the plurality of support bars 3320(1), 3320 (2), 3320(3), . . . , and 3320(M) of the multi-bar structure 3320 may be integrally formed with the plate 3310, and some others of the plurality of support bars 3320(1), 3320 (2), 3320(3), . . . , and 3320(M) of the multi-bar structure 3320 may be separately coupled (e.g., attached) to the plate 3310. For example, some of the plurality of support bars 3320(1), 3320(2), 3320(3), . . . , and 3320(M) of the multi-bar structure 3320 and the plate 3310 may be integrally formed by etching a metal base material (e.g., a metal base), and some others of the plurality of support bars 3320(1), 3320(2), 3320(3), . . . , and 3320(M) of the multi-bar structure 3320 may be separately coupled (or attached) to the plate 3310 to secure (or improve) antenna radiation performance, electrostatic discharge (ESD) related performance, and/or EMI related performance. For example, some of the plurality of support bars 3320(1), 3320(2), 3320(3), . . . , and 3320(M) separately coupled or attached to the plate 3310 may include a non-metal material such as a polymer. In some embodiments, some and some others of the plurality of support bars 3320(1), 3320(2), 3320(3), . . . , and 3320(M) of the multi-bar structure 3320 may include the same material or different materials. For example, some and some others of the plurality of support bars 3320(1), 3320(2), 3320(3), . . . , and 3320(M) of the multi-bar structure 3320 may include different metal materials, or different non-metal materials.

Figure 35:
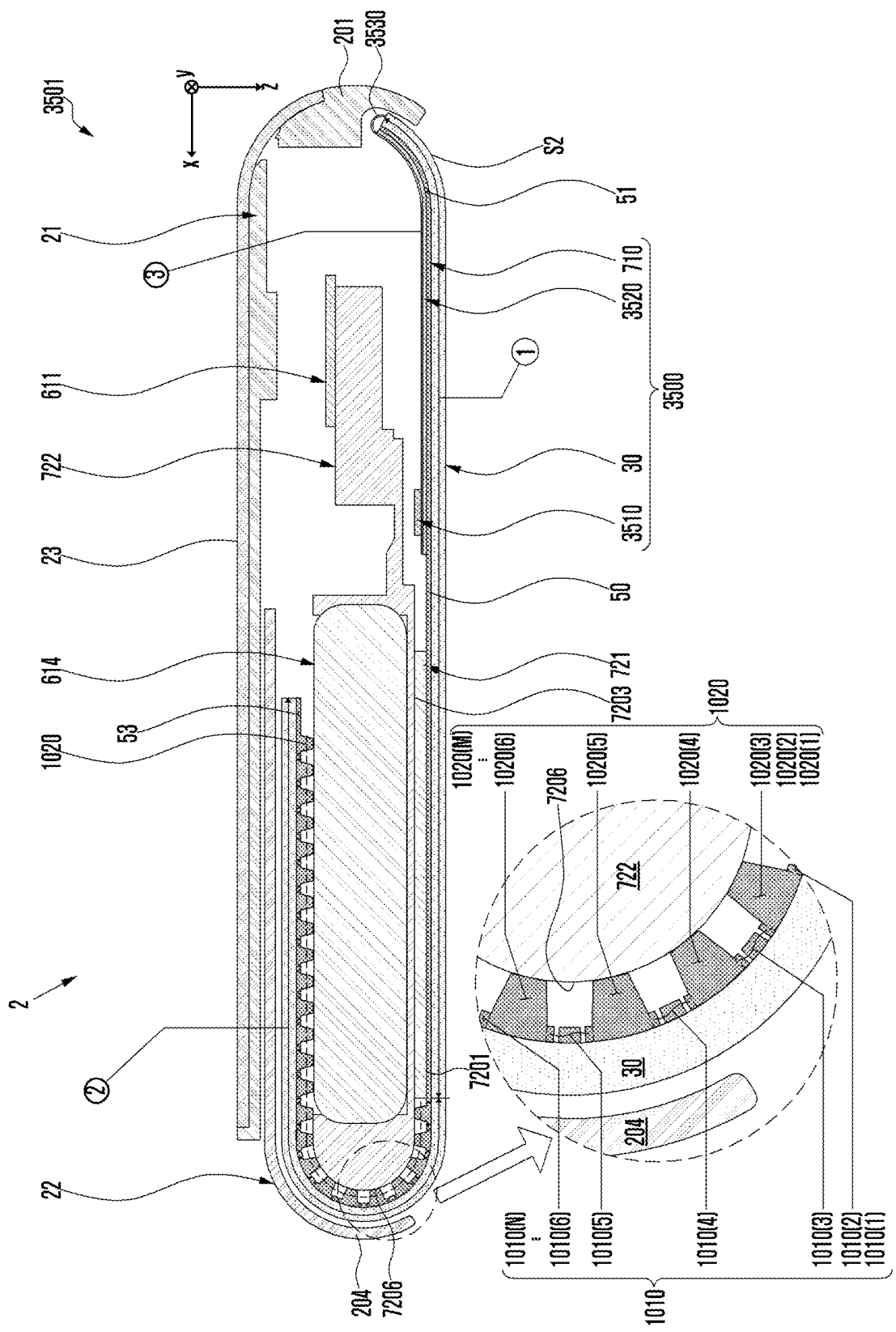
FIG. 35 is a cross-sectional view of the slidable electronic device taken along line A-A' in the closed state of the slidable electronic device of FIG. 3 according to an embodiment.
Figure 36:
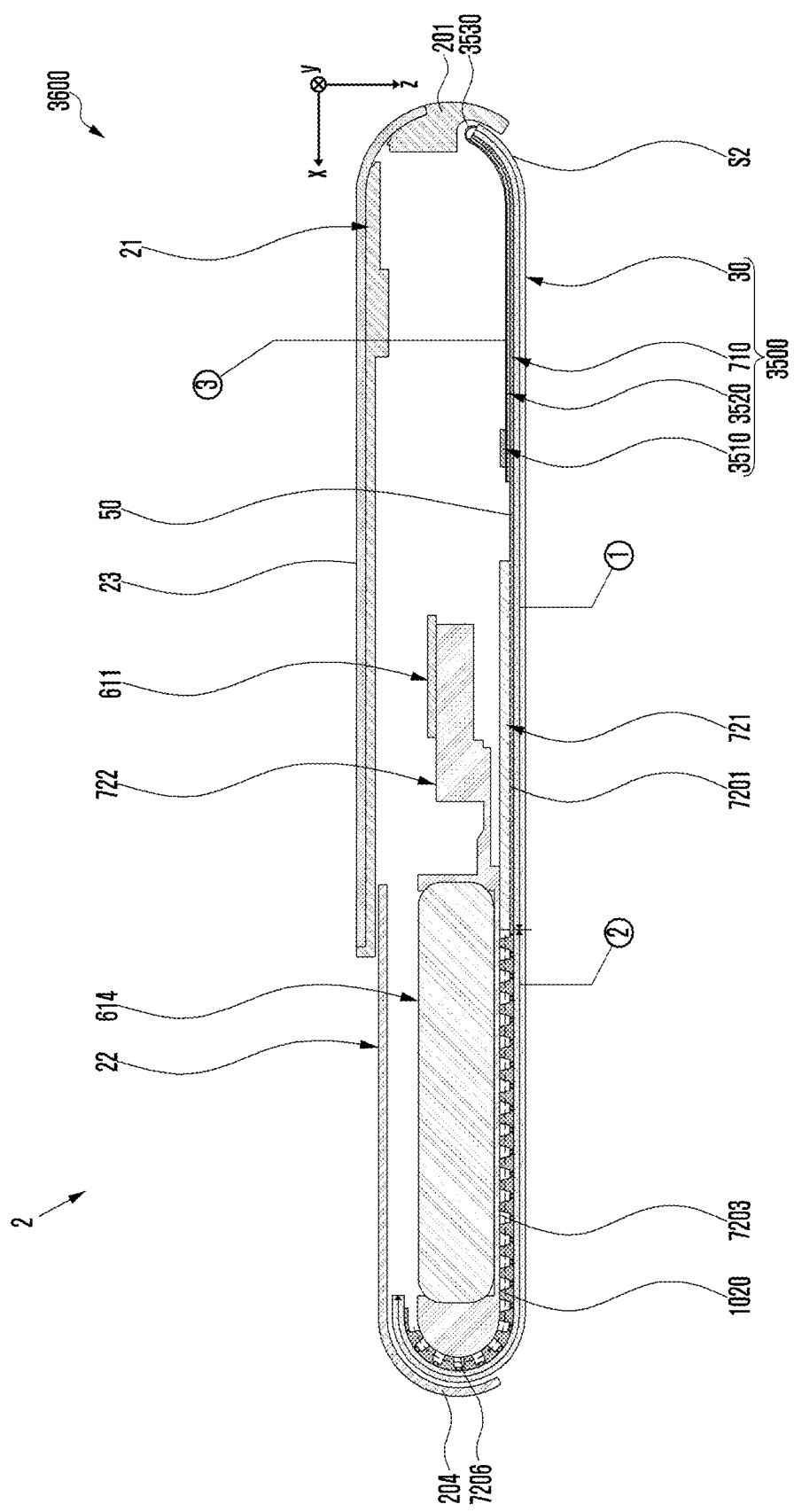
FIG. 36 is a cross-sectional view of the slidable electronic device 2 taken along line B-B' in the open state of the slidable electronic device of FIG. 5 according to an embodiment.

FIG. 35 is a cross-sectional view 3501 of the slidable electronic device 2 taken along line A-A' in the closed state of the slidable electronic device 2 of FIG. 3 according to an embodiment. FIG. 36 is a cross-sectional view 3600 of the slidable electronic device 2 taken along line B-B' in the open state of the slidable electronic device 2 of FIG. 5 according to an embodiment.

With reference to FIGS. 35 and 36, the slidable electronic device 2 may include a first housing 21, a second housing 22, a first support member 721, a second support member 722, a back cover 23, a display assembly 3500, a first printed circuit board 611, and/or a battery 614.

According to an embodiment, the display assembly 3500 may include a flexible display 30, a display support assembly 710, a display driving circuit 3510, and/or a second adhesive member 3520.

According to an embodiment, when the second housing 22 slides out or slides in, at least a portion of the flexible display 30 (e.g., the second display section ②) may be moved. The second display section ② of the flexible display 30 may be supported and moved by, for example, the display support plate 50 disposed on the rear surface of the second display section ② of the display support assembly 710.

When the second housing 22 slides out or slides in, the plurality of second portions 1020(1), 1020(2), and 1020(3), . . . , and 1020(M) included in the second thickness part 1020 of the display support plate 50 may be supported by a third support area 7203 of the second support member 722. The second display section ② of the flexible display 30 may be withdrawn from the slidable electronic device 2 through a curved space between a curved area 7206 of the third support area 7203 and the fourth side surface 204 of the second housing 22 when the second housing 22 slides out, and may be retracted in the internal space of the slidable electronic device 2 when the second housing 22 slides in. The display support plate 50 may have the flexibility due to the plurality of first portions 1010(1), 1010(2), 1010(3), . . . , and 1010(N) having a relatively thin thickness compared to the plurality of second portions 1020(1), 1020(2), 1020(3), . . . , and 1020(M). In one embodiment, the embodiment of FIGS. 35 and 36 may include the display support plate 50 according to the embodiment of FIG. 10. For example, the plurality of openings (e.g., the plurality of opening patterns 1100(1), 1100(2), 1100(3), . . . , and 1100(N) in FIG. 12) formed in the plurality of first portions 1010(1), 1010(2), 1010(3), . . . , and 1010(N) may serve to ensure the flexibility of the display support plate 50. Although the display support plate 50 according to the embodiment of FIG. 10 is illustrated in the embodiment of FIGS. 35 and 36, embodiments of the present disclosure are not limited thereto. For example, the display support plate 50 according to the embodiment of FIG. 17, the embodiment of FIG. 20, the embodiment of FIG. 22, the embodiment of FIG. 25, the embodiment of FIG. 30, the embodiment of FIG. 31, the embodiment of FIG. 32, or the embodiment of FIG. 33, or other configurations may be incorporated into configurations of slidable electronic devices in accordance with embodiments of the present disclosure.

According to an embodiment, the plurality of third surfaces 1003(1), 1003(2), 1003(3), . . . , and 1003(M) (see FIG. 10) included in the plurality of second portions 1020(1), 1020(2), 1020(3), . . . , and 1020(M) may be formed substantially flat. According to some embodiments, the plurality of third surfaces 1003(1), 1003(2), 1003(3), . . . , and 1003(M) may be formed as a curved surface corresponding to the curved area 7206 of the third support area 7203 of the second support member 722.

According to an embodiment, a tension device (or a tension structure) (not illustrated) for the flexible display 30 and/or the display support plate 50 may be formed in order to reduce the lifting phenomenon of the screen S (see FIG. 2 or 4). The tension device may serve to smooth the sliding operation while maintaining tension acting on the flexible display 30 and/or the display support plate 50. The tension device may apply tension to the flexible display 30 and the display support plate 50 using, for example, a belt (e.g., a wire-type or chain-type belt). For another example, the tension device may apply tension to the flexible display 30 and the display support plate 50 using an elastic member such as a spring. In one embodiment, the tension device may be connected to the third area 53 of the display support plate 50. When the tension by the tension device is in a critical range, the second display section ② of the flexible display 30 may be maintained in a shape that is smoothly connected to the first display section ① of the flexible display 30 without being lifted in the closed state of FIG. 2 or in the open state of FIG. 4. When the tension by the tension device is in the critical range, the second display section ② may be maintained in a shape that is smoothly connected to the first display section ① and moved without being lifted in the switching between the closed state of FIG. 2 and the open state of FIG. 4. When the tension by the tension device is in the critical range, the slide operation may be smoothly performed in switching between the closed state of FIG. 2 and the open state of FIG. 4. For example, in the comparison example in which the tension by the tension device is less than the critical range, the second display section ② may be lifted or may not be smoothly connected to the first display section area ① due to the elasticity of the flexible display 30 and/or the elasticity of the display support plate 50. As another example, in the comparison case in which the tension by the tension device is greater than the critical range, the second display section ② may be smoothly connected to the first display section area ① without being lifted, but the slide operation may not be smoothly performed in the switching between the closed state of FIG. 2 and the open state of FIG. 4.

According to an embodiment, in order to reduce the frictional force between the third support area 7203 of the second support member 722 and the display support plate 50, a lubricant (e.g., grease) may be placed (e.g., applied) between the third support area 7203 and the display support plate 50. In some embodiments, the friction surface between the second support member 722 and the display support plate 50 may be coated with a lubricant (e.g., tetrafluoroethylene material (e.g., polytetrafluoroethylene (PTFE), also known as Teflon) coating).

According to some embodiments, a rotation member such as a roller or a pulley may be positioned in place of the curved area 7206 of the third support area 7203 of the second support member 722. For example, one end of the rotation shaft of the rotation member may be rotatably coupled to the third support member 723 (see FIG. 6), and the other end of the rotation shaft of the rotation member may be rotatably coupled to the fourth support structure 724 (see FIG. 6). In some embodiments, the rotation member may be interpreted as a curved member, a curved support member, or a curved support structure rotatably implemented based on friction with the display support plate 50.

According to one embodiment, the display driving circuit 3510 may be disposed in the display assembly 3500 in a chip-on panel (COP) scheme. The display driving circuit 3510 may include, for example, a display drive integrated circuit (DDI) or a DDI chip. The flexible display 30 may include a third display section (or an extension part) ③ extended from the first display section ①. In one embodiment, the third display section ③ is bent from the first display section ① on the side of the first curved part S2 of the screen S (e.g., see FIG. 2 or 4) to overlap and connect to the first area 51 of the display support plate 50. The third display section ③ may include, for example, a folding section 3530 bent with a corresponding radius of curvature on the side of the first curved part S2. The second adhesive member 3520 may be positioned between the third display area ③ of the flexible display 30 and the first area 51 of the display support plate 50. The display driving circuit 3510 may be disposed in the third display section ③. In one embodiment, the display driving circuit 3510 may be disposed in the third display section ③ using tape automated bonding (TAB).

According to an embodiment, the third display section ③ of the flexible display 30 may extend from the display panel 31 (see FIG. 6). The third display section ③ may be, for example, a part of the TFT film (or a TFT substrate) 31b (see FIG. 6). The third display section ③ may be electrically connected to the first printed circuit board 611 using a flexible printed circuit board (not illustrated). The third display section ③ may include electrical paths (e.g., wires implemented in a conductive pattern) electrically connecting at least one TFT and a flexible printed circuit board. In one embodiment, the third display section ③ may be electrically connected to the flexible printed circuit board using anisotropic conductive film (ACF) bonding. The third display section ③ may be a portion that is not included in the screen (e.g., the screen S in FIG. 2 or 4) and may not include pixels implemented as light emitting elements. In one embodiment, the light emitting layer 31a and the encapsulation layer 31c of FIG. 6 may not extend into the third display section ③. The TFT film 31b of FIG. 6 may extend into the third display section ③, but may be implemented in a form that does not include a TFT in the third display section ③. The electrical paths included in the third display section ③ may be disposed on the TFT film 31b. In some embodiments, the light emitting layer 31a extends into the third display section ③, but may be implemented in a form in which a plurality of pixels is not substantially present in the third display section ③. In some embodiments, the encapsulation layer 31c may extend into the third display section ③. A signal commanded by a processor (e.g., the processor 120 in FIG. 1) may be transmitted to the display driving circuit 3510 disposed in the third display section ③ through the flexible printed circuit board. The display driving circuit 3510 may serve as a signal path between the flexible display 30 and the processor, and can control pixels through TFTs in the flexible display 30. For example, the display driving circuit 3510 can be configured to turn the pixels included in the flexible display 30 on or off, and may be electrically connected to a gate electrode of the TFT. The display driving circuit 3510 may adjust the amount of red, green, and blue (RGB) signals of the pixel in order to generate a color difference, and may be electrically connected to the source electrode of the TFT. The TFT may include a gate line electrically connecting the display driving circuit 3510 and the gate electrode of the TFT and a source line (or a data line) electrically connecting the display driving circuit 3510 and the source electrode of the TFT. In some embodiments, the display driving circuit 3510 may operate in response to a red, green, blue, white (RGBW) scheme in which a white pixel is added to the RGB pixels.

According to some embodiments, the display driving circuit 3510 may include a DDI package. The DDI package may include a DDI (or a DDI chip), a timing controller (T-CON), a graphic RAM (GRAM), and/or a power generating circuit. In some embodiments, the graphic RAM may be omitted and/or a memory may be provided separately from the display driving circuit 3510.

According to some embodiments, the display driving circuit 3510 may be disposed on the display assembly 3500 in a chip-on film (COF) scheme. For example, the third display section ③ of the flexible display 30 may be a flexible film substrate connecting the display panel 31 (see FIG. 6) and the flexible printed circuit board electrically connected to the first printed circuit board 611. The film substrate may include, for example, a flexible plastic substrate or a polymer substrate (e.g., a polyimide substrate) on which circuits or wires are formed. One end of the film substrate may be electrically connected to the display panel 31 (or the TFT film 31b) (see FIG. 6), and the other end of the film substrate may be electrically connected to the flexible printed circuit substrate electrically connected to the first printed circuit board 611. In one embodiment, the display driving circuit 3510 may be disposed on the film substrate using TAB. In one embodiment, the film substrate may be electrically connected to the display panel 31 and/or the flexible printed circuit board using ACF bonding.

According to an embodiment, the first area 51 of the display support plate 50 and the second adhesive member 3520 may be disposed in a state in which the third display section ③ of the flexible display 30 is bent with a corresponding radius of curvature, so that the stress of the folding section 3530 can be reduced.

According to some embodiments, the display support plate 50 may reduce electromagnetic interference (EMI) with respect to the flexible display 30. In some embodiments, the display support plate 50 may diffuse or dissipate the heat emitted from a heat dissipating component (e.g., the display driving circuit 3510).

Figure 37:
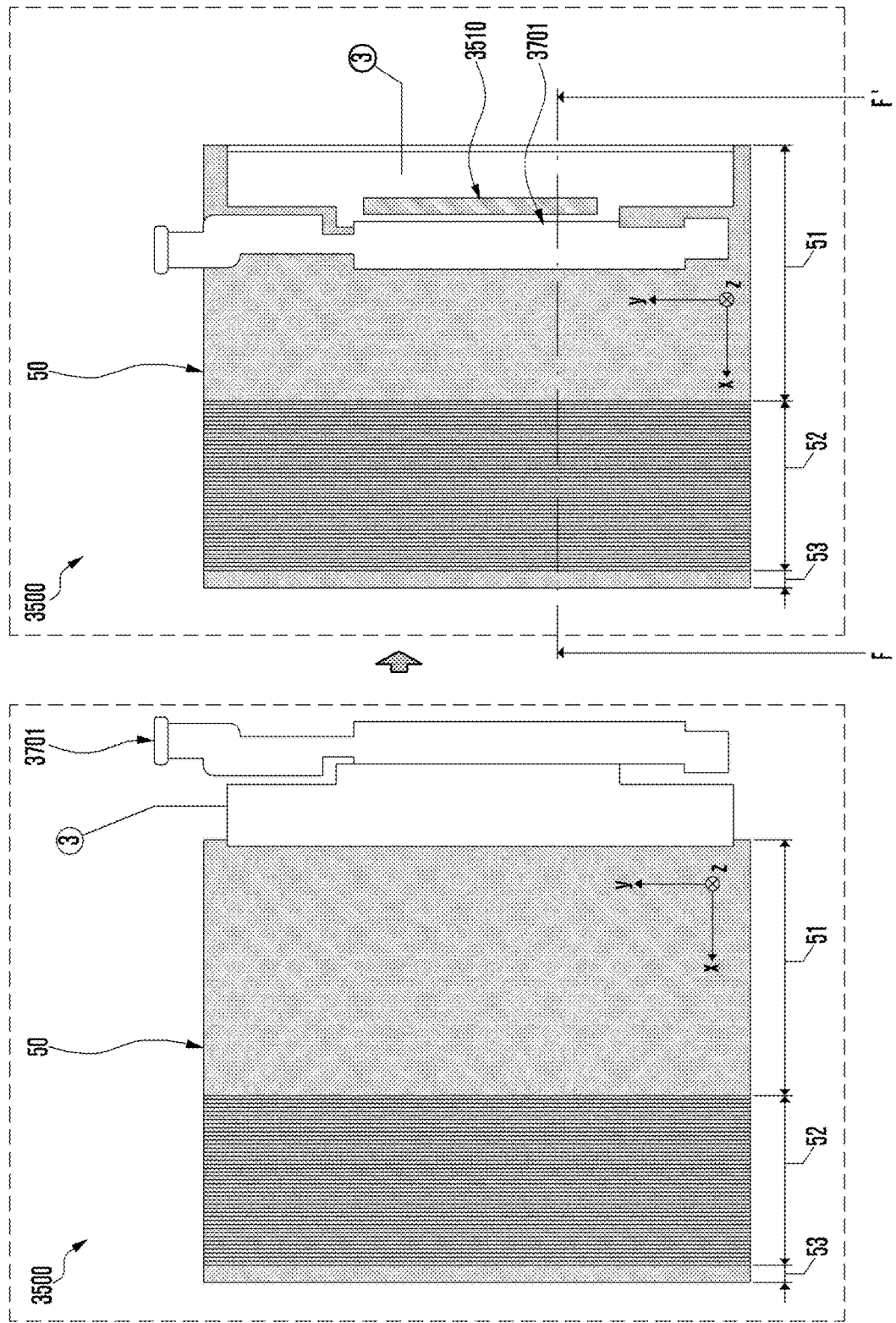
FIG. 37 is a view illustrating a display assembly according to an embodiment.
Figure 38:
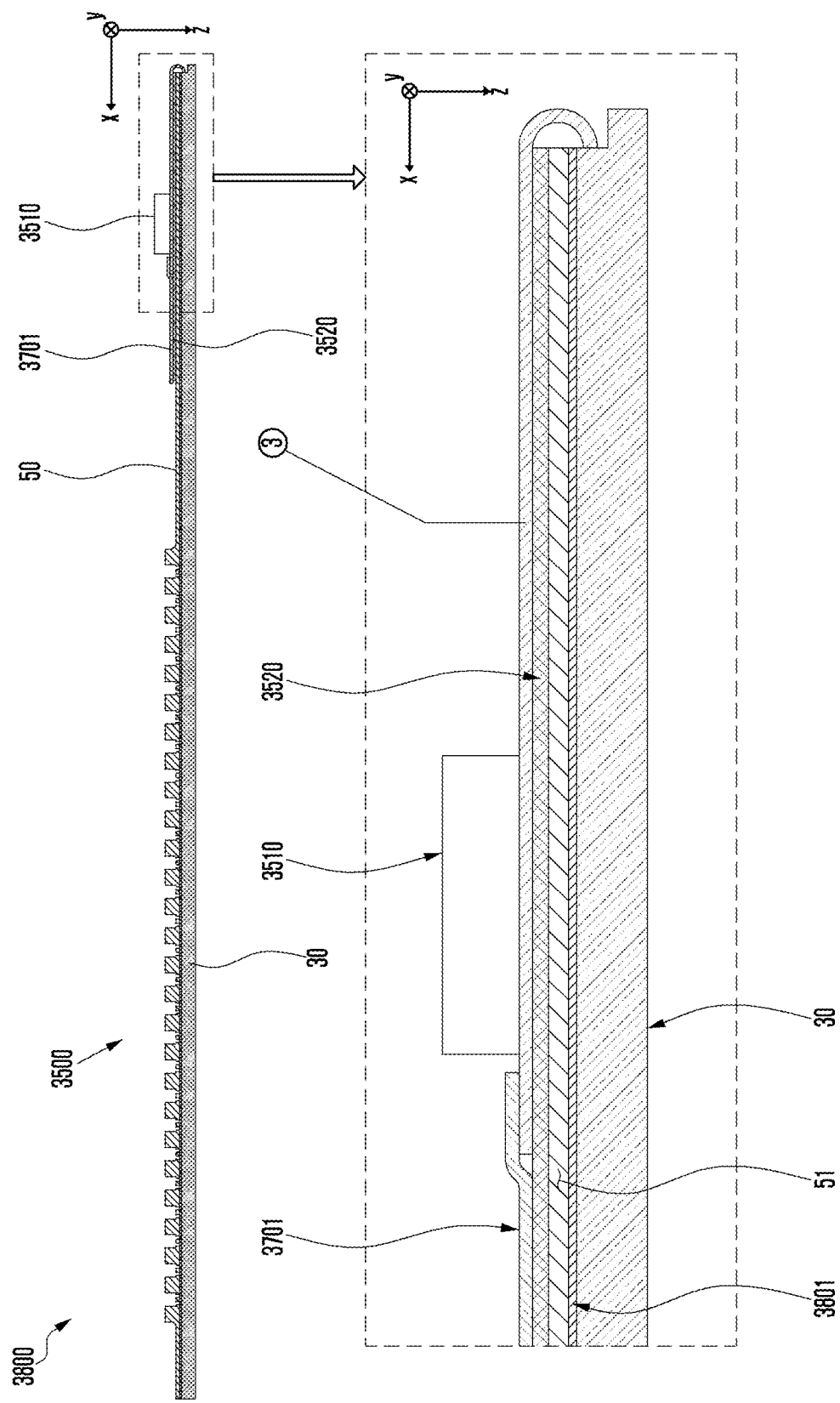
FIG. 38 is a cross-sectional view of the display assembly taken along line F-F' in FIG. 37 according to one embodiment.

FIG. 37 is a view illustrating a display assembly 3500 according to an embodiment. FIG. 38 is a cross-sectional view 3800 of the display assembly 3500 taken along line F-F' in FIG. 37 according to an embodiment.

With reference to FIGS. 37 and 38, in one embodiment, the display assembly 3500 may include a flexible display 30, a display support plate 50, a display driving circuit 3510, a second adhesive member 3520, and/or a flexible printed circuit board 3701.

According to one embodiment, the flexible display 30 may include the third display section ③ extending from the first display section ① (see FIG. 33) or electrically connected to the first display section ①. The display driving circuit 3510 (e.g., DDI or DDI chip) may be disposed in the third display section ③. The flexible printed circuit board 3701 may be electrically connected to the third display section ③ and the first printed circuit board 611 (see FIG. 6).

According to an embodiment, the display support plate 50 may be disposed on the rear surface of the flexible display 30. For example, a first adhesive member 3801 (e.g., a thermally reactive adhesive material, a photoreactive adhesive material, a general adhesive, a double-sided tape, or an organic adhesive material) may be positioned between the display support plate 50 and the flexible display 30. The third display section ③ of the flexible display 30 may be bent and overlap and connect to the first area 51 of the display support plate 50. The second adhesive member 3520 may be positioned between the third display section ③ of the flexible display 30 and the first area 51 of the display support plate 50. The flexible printed circuit board 3701 may overlap and connect to the first area 51 of the display support plate 50 using the second adhesive member 3520.

According to some embodiments, the first adhesive member 3801 may include a conductive adhesive material. In this case, the conductive display support plate 50 and the copper sheet 33e (see FIG. 6) forming the rear surface of the flexible display 30 may be electrically connected through the first adhesive member 3801.

Although the embodiment of FIG. 38 illustrates the display support plate 50 according to the embodiment of FIG. 10, it is not limited thereto. For example, the display support plate 50 may be configured according to the embodiment of FIG. 17, the embodiment of FIG. 20, the embodiment of FIG. 22, the embodiment of FIG. 25, the embodiment of FIG. 30, the embodiment of FIG. 31, the embodiment of FIG. 32, the embodiment of FIG. 33, or with other configurations in accordance with the present disclosure.

According to some embodiments, the first area 51 of the display support plate 50 is a part supporting the first display section ① and the third display section ③ of the flexible display 30, and may be referred to as various other terms such as a 'first support part', a 'first support area', a 'first plate area', a 'first plate part', or a 'first support plate area'. The second area 52 of the display support plate 50 is a part supporting the second display section ② of the flexible display 30, and may be referred to as various other terms such as a 'second support part', a 'second support area', a 'second plate area', a 'second plate part', or a 'second support plate area'. The third area 53 of the display support plate 50 is a part supporting a portion of the flexible display 30 and may be referred to as various other terms such as a 'third support part', a 'third support area', a 'third plate area', a 'third plate part', or a 'third support plate area'.

Figure 39:
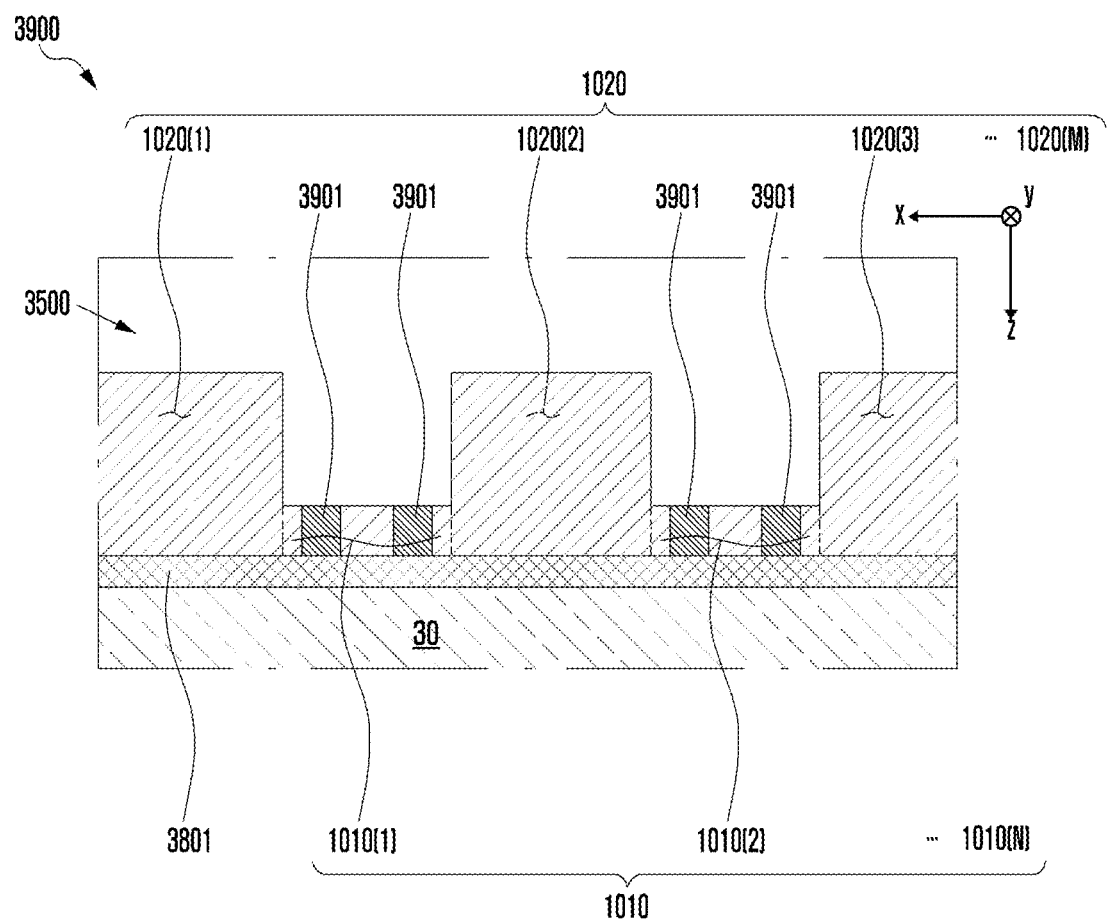
FIG. 39 is a partial cross-sectional view of the display assembly taken along line F-F' in FIG. 37 according to one embodiment.

FIG. 39 is a partial cross-sectional view 3900 of the display assembly 3500 taken along line F-F' in FIG. 37, according to an embodiment.

With reference to FIG. 39, in one embodiment, a filler member 3901 may be positioned (e.g., filled) in a plurality of opening patterns 1100(1), 1100(2), and 1100(3), . . . , and 1100(N) included in the first thickness part 1010 of the display support plate 50 (see FIG. 10). The filler member 3901 may include a flexible material (e.g., silicon) to reduce a decrease in flexibility of the display assembly 3500. In some embodiments, the filler member 3901 may include or be formed from a non-conductive material. In some embodiments, the filler member 3901 may include or be formed from a conductive material. The filler member 3901 may reduce bending stress on the second area 52 (see FIG. 37) of the display support plate 50 and serve to ensure the smooth bending of the second area 52.

Figure 40:
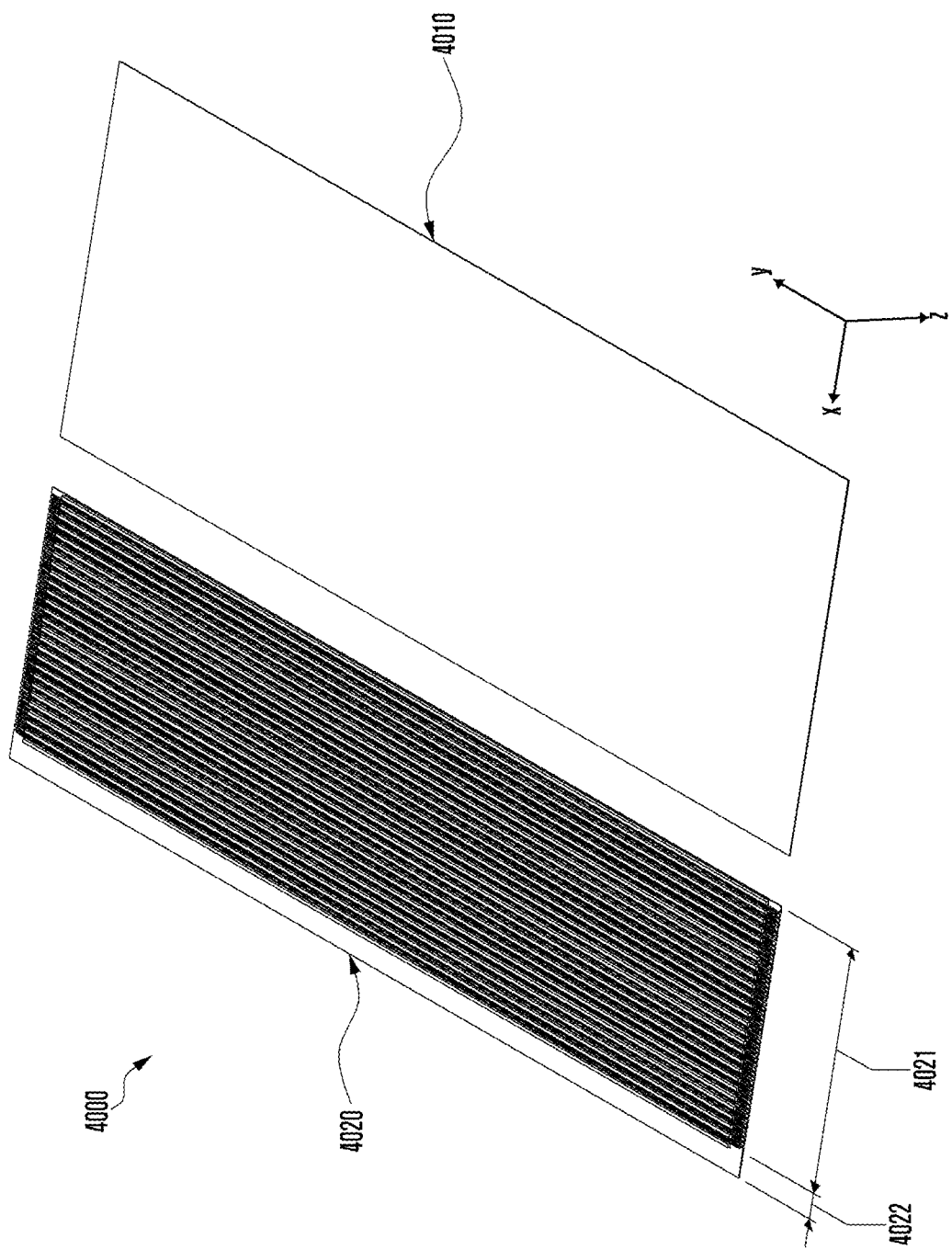
FIG. 40 is a perspective view of a display support plate according to another embodiment.
Figure 41:
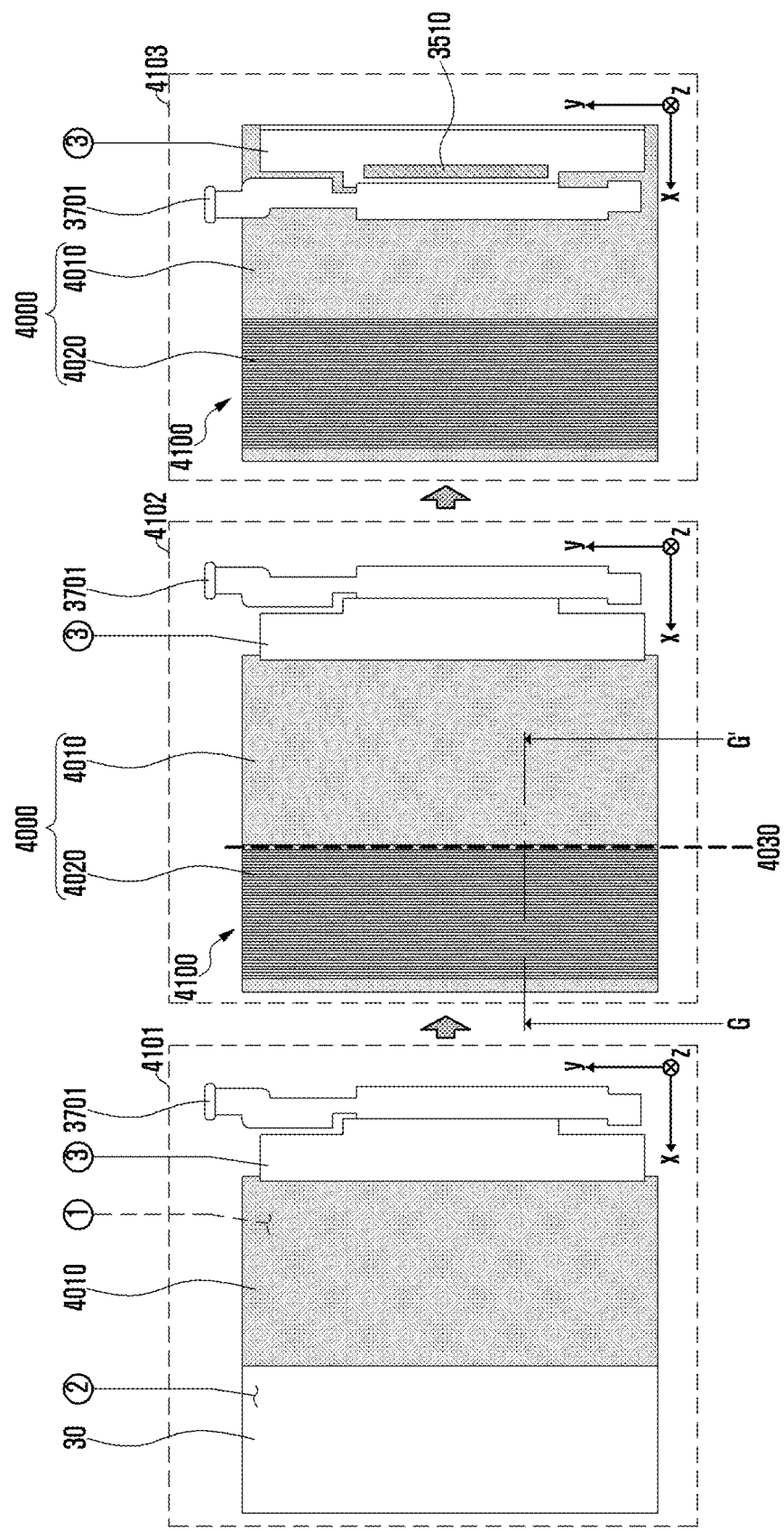
FIG. 41 illustrates a method of assembling the display assembly using the display support plate of FIG. 40 according to an embodiment.
Figure 42:
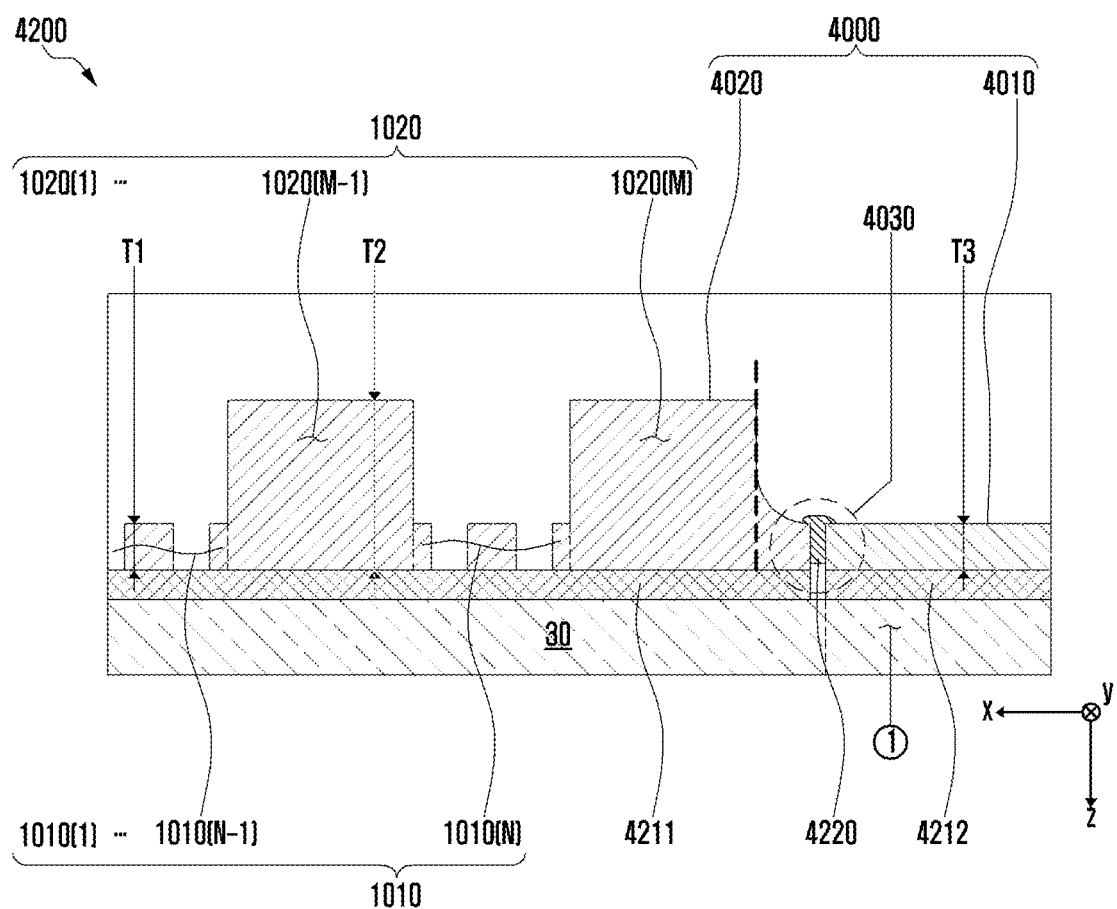
FIG. 42 is a cross-sectional view of the display assembly taken along line G-G' in FIG. 41 according to one embodiment.
Figure 43:
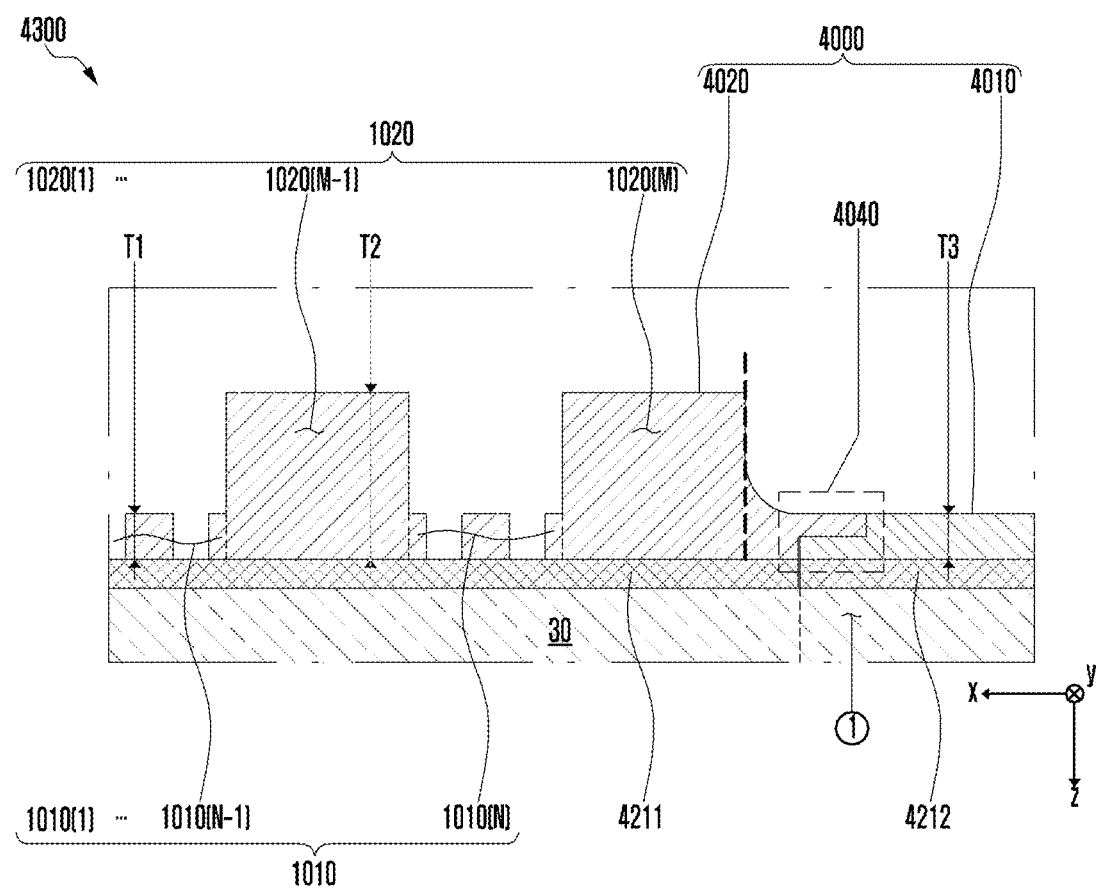
FIG. 43 is a cross-sectional view of the display assembly taken along line G-G' in FIG. 41 according to another embodiment.

FIG. 40 is a perspective view of a display support plate 4000, according to another embodiment. FIG. 41 illustrates a method of assembling a display assembly 4100 using the display support plate 4000 of FIG. 40 according to an embodiment. FIG. 42 is a cross-sectional view 4200 of the display assembly 4100 taken along line G-G' in FIG. 41 according to an embodiment. FIG. 43 is a cross-sectional view 4300 of the display assembly 4100 taken along line G-G' in FIG. 41 according to another embodiment.

With reference to FIG. 40, in one embodiment, a display support plate 4000 may include a first support plate 4010 and a second support plate 4020 formed separately from the first support plate 4010. The first support plate 4010 may be, for example, formed substantially the same as the first area 51 of the display support plate 50 illustrated in FIG. 9. The second support plate 4020 may include, for example, a first area part 4021 formed substantially the same as the second area 52 of the display support plate 50 of FIG. 9 and a second area part 4022 substantially the same as the third area 53 of the display support plate of FIG. 9. With reference to FIG. 9, when the display support plate 50 is manufactured as an integral or single structure, the second area 52 may impact production yield or mass productivity due to its structural complexity, compared to the first area 51. Because the embodiment of FIG. 40 provides for the first support plate 4010 and the second support plate 4020 to be manufactured separately, it can serve to improve production yield and/or mass productivity compared to a method of implementing the display support plate 50 as an integral or single structure. Further, such separate manufacturing, as provided by the embodiment of FIG. 40, restrictions on degrees of freedom in design of the first support plate 4010 or the second support plate 4020 may be reduced.

According to an embodiment, the first support plate 4010 and the second support plate 4020 may include or be formed from the same metal material (e.g., stainless steel). In some embodiments, the first support plate 4010 and the second support plate 4020 may include or be formed from different metal materials. In some embodiments, the first support plate 4010 and the second support plate 4020 may include or be formed from the same non-metal material. In some embodiments, the first support plate 4010 and the second support plate 4020 may include or be formed from different non-metal materials. In some embodiments, one of the first support plate 4010 and the second support plate 4020 may include or be formed from a metal material, and the other may include or be formed from a non-metal material.

With reference to FIGS. 41 and 42, in one embodiment, a display assembly 4100 may include a flexible display 30, a display support plate 4000 (e.g. as shown in FIG. 40), a first adhesive member 4211, a second adhesive member 4212, an adhesive material 4220, a display driving circuit 3510, and/or a flexible printed circuit board 3701. Although the embodiment of FIG. 42 illustrates the second support plate 4020 formed in a shape including a second area 52 and the third area 53 of the display support plate 50 according to the embodiment of FIG. 10, embodiments of the present disclosure are not limited thereto. For example, the second support plate 4020 may have a form including the second area 52 and the third area 53 of the display support plate 50 according to the embodiment of FIG. 17, the embodiment of FIG. 20, the embodiment of FIG. 22, the embodiment of FIG. 25, the embodiment of FIG. 30, the embodiment of FIG. 31, the embodiment of FIG. 32, the embodiment of FIG. 33, or variations thereon. As such, the illustrative configuration of FIG. 42 is not intended to be limited to the specific configuration illustrated therein. Hereinafter, an assembly method of forming the display assembly 4100 will be described with reference to FIGS. 41 and 42.

According to an embodiment, in a first operation indicated by reference numeral 4101, the first support plate 4010 of the display support plate 4000 may be disposed on the first display section ① of the flexible display 30. In some embodiments, the first adhesive member 4211 (shown in FIG. 42) may be positioned between the first support plate 4010 of the display support plate 4000 and the first display section ① of the flexible display 30. In a second operation indicated by reference numeral 4102, the second support plate 4020 of the display support plate 4000 may be disposed on the second display section ② of the flexible display 30. In some embodiments, the second adhesive member 4212 (shown in FIG. 42) may be positioned between the second support plate 4020 of the display support plate 4000 and the second display section ② of the flexible display 30. The first adhesive member 4211 and/or the second adhesive member 4212 may include, for example, thermally reactive adhesive material, a photoreactive adhesive material, a general adhesive, a double-sided tape, or an organic adhesive material. In some embodiments, the first adhesive member 4211 and/or the second adhesive member 4212 may include a conductive adhesive material. In some embodiments, the first adhesive member 4211 and the second adhesive member 4212 may include or be formed from different metal materials and/or non-metal materials. In some embodiments, one of the first adhesive member 4211 and the second adhesive member 4212 may include or be formed from a metal material, and the other may include or be formed from a non-metal material. In some embodiments, in the case that the first adhesive member 4211 and/or the second adhesive member 4212 include a conductive adhesive material, the display support plate 4000 may be a conductive display support plate and thus may electrically connect to a copper sheet 33e formed on the rear surface of the flexible display 30 (see FIG. 6) through the first adhesive member 4211 and/or the second adhesive member 4212. In some embodiments, an integral adhesive member (e.g., the first adhesive member 3801 in FIG. 38) may be employed and replace the first adhesive member 4211 and the second adhesive member 4212 and may be positioned between the display support plate 4000 and the flexible display 30.

According to an embodiment, in the second operation indicated by reference numeral 4102, a boundary part 4030 (shown in FIG. 42) between the first support plate 4010 and the second support plate 4020 may be connected using the adhesive material 4220 (shown in FIG. 42). The adhesive material 4220 may be a conductive adhesive material or a non-conductive adhesive material. In one embodiment, the first support plate 4010 and the second support plate 4020 may be connected using welding.

With reference to FIG. 43, in some embodiments, a boundary part 4040 between the first support plate 4010 and the second support plate 4020 may be formed in a form in which a portion of the first support plate 4010 and a portion of the second support plate 4020 overlap each other when viewed from above the screen S (see FIG. 2 or 4) (e.g., when viewed in the −z axis direction). A portion of the first support plate 4010 and a portion of the second support plate 4020 overlapping each other at the boundary part 4040 may be connected by screw fastening (e.g., as shown in FIG. 42) or ultrasonic welding. Although not illustrated, a structure or method for connecting the first support plate 4010 and the second support plate 4020 may be various other than the above.

According to an embodiment, the first support plate 4010 may be connected to the first display section ① and a first support area 7201 between the first display section ① of the flexible display 30 and the first support area 7201 of a first support member 721 (see FIG. 6, 35 or 36). In one embodiment, in order to slim a laminated structure including the first display section ① of the flexible display 30, the first support member 721, and the first support plate 4010, the first support plate 4010 may have the third thickness T3 thinner than the first thickness T1 of the first thickness part 1010 included in the second support plate 4020. In the embodiment of FIG. 40, because the first support plate 4010 and the second support plate 4020 are manufactured separately, a restriction may be reduced in forming the first support plate 4010 with the third thickness T3 thinner than the first thickness T1, as compared to a method of implementing the display support plate 50 as an integral or single structure.

According to some embodiments (not illustrated), the electronic device is not limited to the embodiment of FIG. 2 and may be implemented in various other forms capable of expanding the screen according to the movement of a flexible display. For example, the electronic device may be implemented such that at least a portion of the flexible display is disposed in the internal space of the electronic device in a rolled state. In this case, the flexible display may be referred to as a rollable display. A display support plate formed at least in part in the same way as the display support plate 50 according to an embodiment may be disposed on the rear surface of the flexible display. The display support plate 50 may support the flexible display so that the flexible display can be maintained in a smooth form between a support component such as a support member or a roller and the flexible display.

Figure 44:
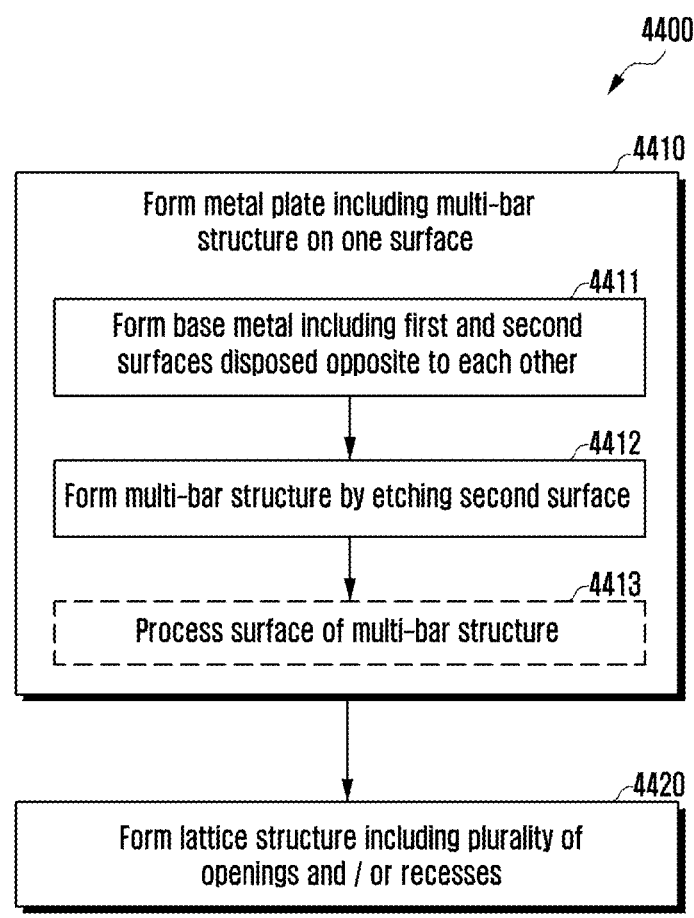
FIG. 44 illustrates a manufacture flow of a display support plate, according to one embodiment.
Figure 45:
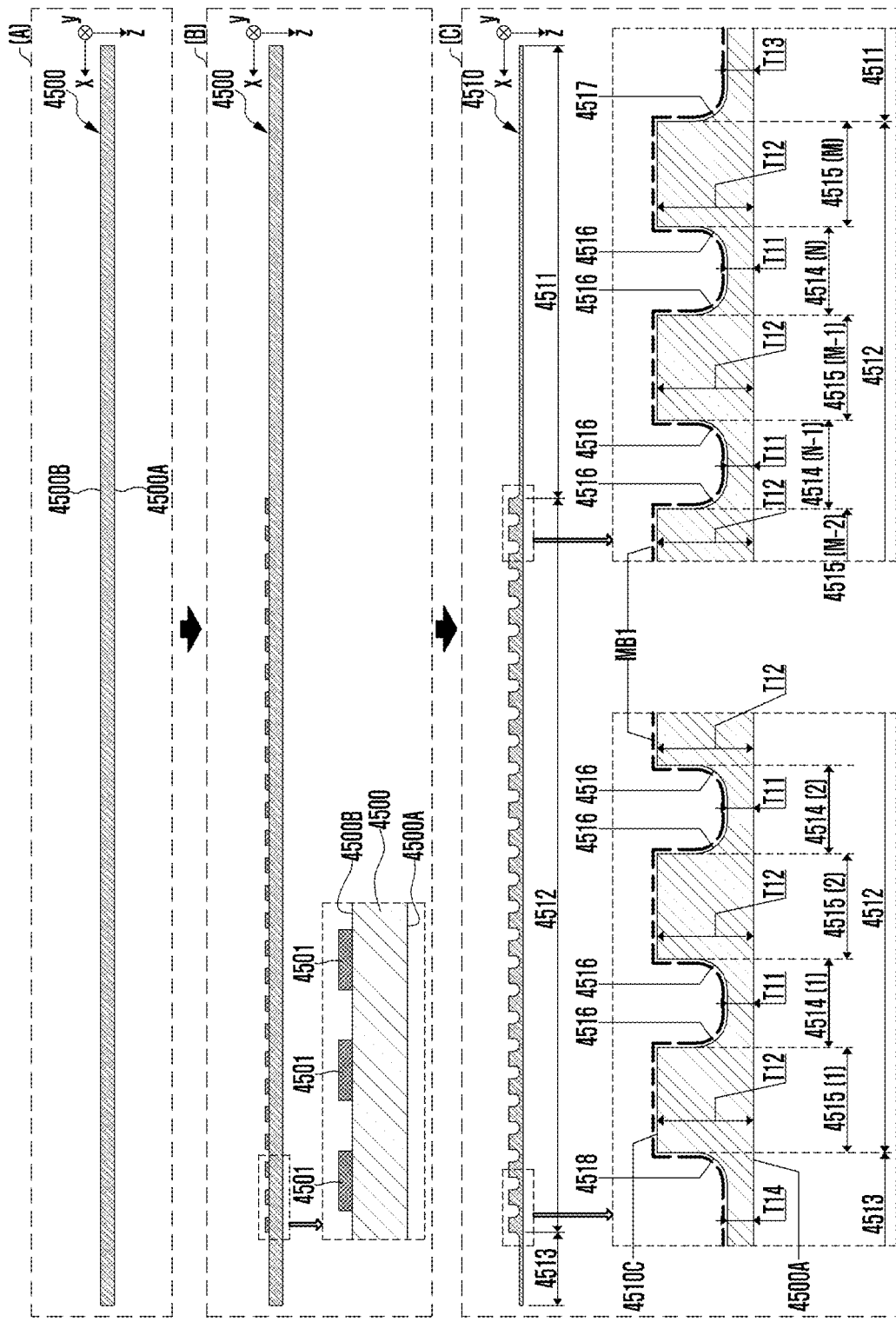
FIGS. 45, 46, and 47 are cross-sectional views of members related to each operation of the manufacture flow of FIG. 44, according to one embodiment.
Figure 46:
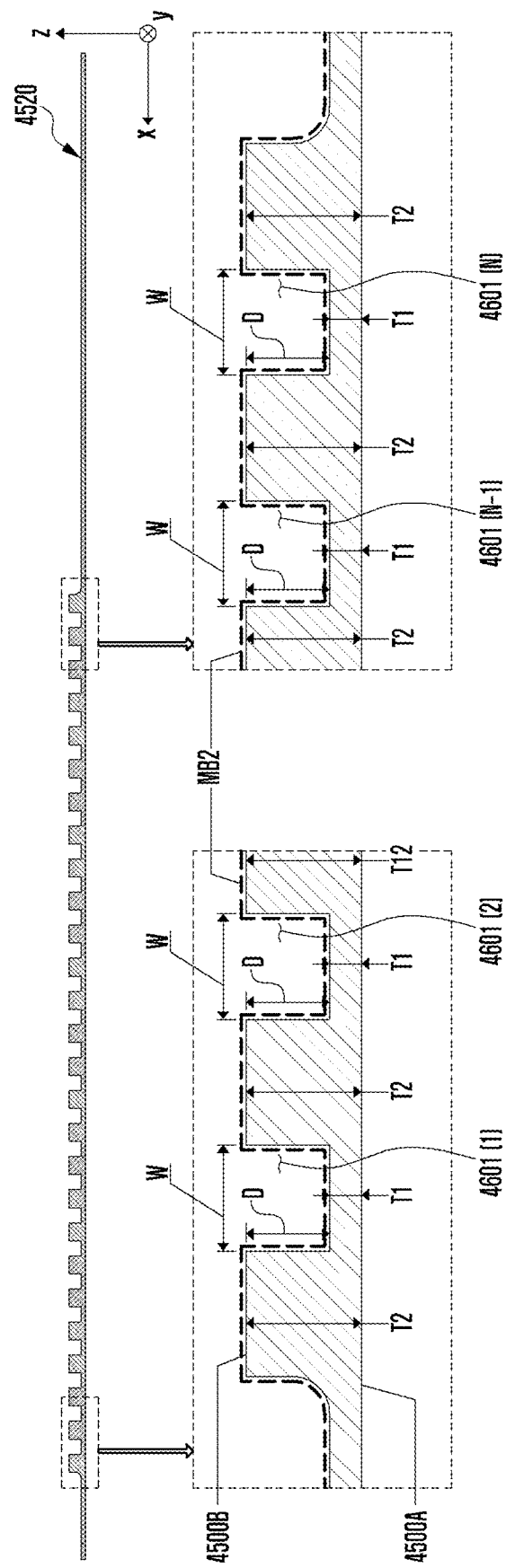
Figure 47:
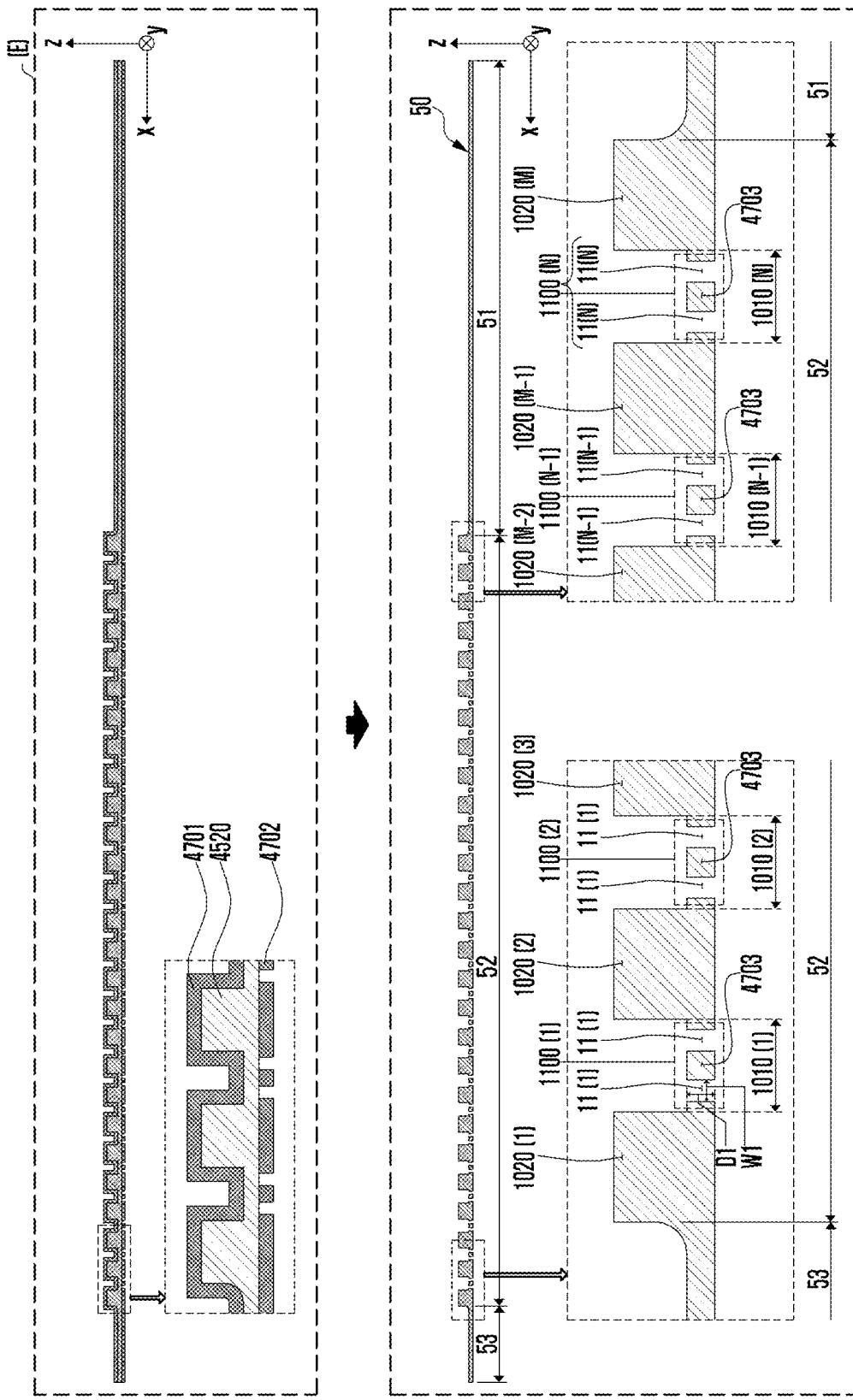

FIG. 44 illustrates a manufacturing flow 4400 of the display support plate 50, according to an embodiment. FIGS. 45, 46, and 47 are cross-sectional views of members involved in the respective operations of the manufacturing flow 4400 of FIG. 44, according to an embodiment.

With reference to FIG. 44, in one embodiment, in operation 4410, a metal plate including a multi-bar structure on one surface may be formed. With reference to FIG. 10, the multi-bar structure may be formed as a combination of a plurality of surfaces, for example, the second surface 1002, the plurality of third surfaces 1003(1), 1003(2), 1003(3), . . . , and 1003(M), the plurality of first side surfaces 1006(1), 1006(2), 1006(3), . . . , and 1006(M), the plurality of second side surfaces 1007(1), 1007(2), 1007(3), . . . , and 1007(M), the fourth surface 1004, and the fifth surface 1005 of the display support plate 50.

According to an embodiment, operation 4410 may include operation 4411 of forming a base metal (base) including first and second surfaces disposed opposite to each other. With reference to (A) in FIG. 45, a base metal 4500 is a metal member that forms a base or base layer for manufacturing the display support plate 50, and may be, for example, in the form of a plate including a first surface 4500A and a second surface 4500B positioned on the opposite side of the base metal 4500 from the first surface 4500A. The base metal 4500 may be formed using various processing methods such as, for example, computer numerical control (CNC), die casting, or pressing, but is not limited thereto. The base metal 4500 may include or be formed from stainless steel, but is not limited thereto and may include or be formed from various other metal materials. In one embodiment, a heat treatment operation for removing stress resistance may be performed on the base metal 4500 so as to reduce deformation such as warpage during external processing, such as etching. In one embodiment, the first surface 1001 included in the display support plate 50 of FIG. 10 may be substantially formed by the first surface 4500A of the base metal 4500. In one embodiment, the plurality of third surfaces 1003(1), 1003(2), 1003(3), . . . , and 1003(M) included in the display support plate 50 of FIG. 10 may be substantially formed by the second surface 4500B of the base metal 4500.

According to an embodiment, operation 4410 may include operation 4412 of forming a multi-bar structure by etching the second surface 4500B of the base metal 4500. With reference to (B) in FIG. 45, a masking area 4501 may be disposed on the second surface 4500B of the base metal 4500. Through a method including disposing a photosensitive dry film on the second surface 4500B of the base metal 4500 with heat and pressure, then irradiating the dry film with light using a master film having a pattern thereon, and then developing the dry film (e.g., a photographic printing method), the masking area 4501 (e.g., the portions remaining on the dry film) may be disposed (or printed) on the second surface 4500B of the base metal 4500. As another example, the masking area 4501 may be disposed (or printed) on the second surface 4500B of the base metal 4500 through a method using a silkscreen having a pattern thereon in place of the dry film (e.g., a screen-printing method). In some embodiments, the masking area 4501 may be disposed on the second surface 4500B of the base metal 4500 through spraying such as painting or electrodeposition. In some embodiments, the masking area 4501 may be formed by disposing a masking film on the second surface 4500B and then removing a portion of the masking film using a method such as laser processing. The masking area 4501 may be disposed on the second surface 4500B of the base metal 4500 using various other methods. With reference to (C) in FIG. 45, when an etching solution (e.g., corrosive material) is applied, a portion of the base metal 4500 not covered by the masking area 4501 is removed (e.g., corrosion) by the etching solution, and as a result, a metal plate 4510 including a third surface 4510C, which implements the multi-bar structure MB1, may be formed. Because the display support plate 50 (see FIG. 9) must be implemented to secure flexibility, the base metal 4500 may be formed in a thin plate shape correspondingly. In the case of a comparative example in which the second surface 4500B of the base metal 4500 is externally processed by a cutting method such as a CNC, the heat or load generated during cutting may impact the thin plate-shaped base metal 4500, resulting in the occurrence of defects (e.g., warping or damage). An embodiment in which the second surface 4500B of the base metal 4500 is externally processed using etching can reduce defects compared to a comparative example using a cutting method such as a CNC. In order to form the third surface 4510C implementing the multi-bar structure MB1, a method of externally processing the second surface 4500B may be various.

The metal plate 4510, including the multi-bar structure MB1, formed through operation 4412 may include, for example, a first plate area 4511 for the first area 51 (see FIG. 10) of the display support plate 50, a second plate area 4512 for the second area 52 (see FIG. 10) of the display support plate 50, and a third plate area 4513 for the third area 53 (see FIG. 10) of the display support plate 50. The second plate area 4512 may include, for example, a plurality of first sections 4514(1), 4514(2), 4514(3), . . . , and 4514(N) for the plurality of first portions 1010(1), 1010(2), 1010(3), . . . , and 1010(N) of the display support plate 50 (see FIG. 10), and a plurality of second sections 4515(1), 4515(2), 4515(3), . . . , and 4515(M) for the plurality of second portions 1020(1), 1020(2), 1020(3), . . . , and 1020(M) of the display support plate 50 (see FIG. 10). A thickness T12 of the plurality of second sections 4515(1), 4515(2), 4515(3), . . . , and 4515(M) may be equal to the thickness of the base metal 4500 (e.g., a distance between the first surface 4500A and the second surface 4500B), and may be thicker than a thickness T11 of the plurality of first sections 4514(1), 4514(2), 4514(3), . . . , and 4514(N). The first plate area 4511 and/or the third plate area 4513 may be thinner than the thickness T12 of the plurality of second sections 4515(1), 4515(2), 4515(3), . . . , and 4515(M). In one embodiment, the thickness T12 of the plurality of second sections 4515(1), 4515(2), 4515(3), . . . , and 4515(M) may be substantially the same as the second thickness T2 of the plurality of second portions 1020(1), 1020(2), 1020(3), . . . , and 1020(M) in the embodiment of FIG. 10. In one embodiment, the thickness T11 of the plurality of first sections 4514(1), 4514(2), 4514(3), . . . , and 4514(N) may be substantially the same as the first thickness T1 of the plurality of first portions 1010(1), 1010(2), 1010(3), . . . , and 1010(N) in the embodiment of FIG. 10. The first plate area 4511 or the third plate area 4513 may be substantially the same as the thickness T11 of the plurality of first sections 4514(1), 4514(2), 4514(3), . . . , and 4514(N). For another example, the first plate area 4511 or the third plate area 4513 may be thinner than the thickness T11 of the plurality of first sections 4514(1), 4514(2), 4514(3), . . . , and 4514(N).

According to an embodiment, in operation 4411, the base metal 4500 may be formed to have substantially the same thickness as the second thickness part 1020 included in the display support plate 50. In this case, as in the illustrated example, the masking area 4501 may be disposed on the second surface 4500B and one-sided etching may be performed by applying an etching solution. In some embodiments, in operation 4411, the base metal 4500 may be formed to have a thickness greater than that of the second thickness part 1020 included in the display support plate 50. In this case, etching may be performed on the first surface 4500A of the base metal 4500 to reduce the thickness. For example, a double-sided etching including an etch for the first side 4500A and an etch for the second side 4500B may be performed.

According to an embodiment, in the metal plate 4510 formed by operation 4412, the boundary parts where the plurality of first sections 4514(1), 4514(2), 4514(3), . . . , and 4514(N) and the plurality of second sections 4515(1), 4515 (2), 4515(3), . . . , and 4515(M) are connected may be formed as a plurality of second curved surfaces 4516 that are not corner-shaped, due to the characteristics of external processing using etching. In the metal plate 4510 formed in operation 4412, the boundary part where the first plate area 4511 and one second section 4515(M) are connected may be formed as a curved surface 4517 that is not corner-shaped, due to the characteristics of external processing using etching. In the metal plate 4510 formed by operation 4412, the boundary part where the third plate area 4513 and one second section 4515(1) are connected may be formed as a third curved surface 4518 that is not corner-shaped, due to the characteristics of external processing using etching. The first curved surface 4517, the plurality of second curved surfaces 4516, and/or the third curved surface 4518 may have, for example, a corresponding radius of curvature. In one embodiment, the first curved surface 4517 is for the curved shape indicated by reference numeral 1006a in the embodiment of FIG. 10 or the embodiment of FIG. 30, and the third curved surface 4518 is for a curved shape indicated by reference numeral 1007a in the embodiment of FIG. 10 or the embodiment of FIG. 30. In one embodiment, operation 4410 may include operation 4413 of processing the surface (e.g., the third surface 4510C) of the multi-bar structure MB1. In operation 4413, for example, the plurality of second curved surfaces 4516 may be externally processed into a corner shape (e.g., corner processing). In one embodiment, operation 4413 may use a CNC or laser, but is not limited thereto. In one embodiment, in operation 4413, cutting using a method such as a CNC may be performed on a local area that does not substantially create defects or the like. When the plurality of second curved surfaces 4516 is processed into a corner shape, the bending stress on the second area 52 of the display support plate 50 (see FIG. 10) may be reduced, which may serve to ensure the smooth bending of the second area 52. In some embodiments, when the second area 52 of the display support plate 50 is bent, as illustrated above, the plurality of second curved surfaces 4516 may be maintained to prevent bending stress from being concentrated on the boundary parts where the plurality of first sections 4514(1), 4514(2), 4514(3), . . . , and 4514(N) and the plurality of second sections 4515(1), 4515(2), 4515 (3), . . . , and 4515(M) are connected, and/or to reinforce rigidity against the boundary parts. In some embodiments in which the plurality of second curved surfaces 4516 are maintained for rigidity reinforcement or the like, surface processing (e.g., corner processing) on the plurality of second curved surfaces 4516, such as operation 4413, may be omitted.

According to one embodiment, in the embodiment of FIG. 31, the plurality of second portions 1020(1), 1020(2), 1020 (3), . . . , and 1020(M) including the plurality of first side surfaces 1006(1), 1006(2), 1006(3), . . . , and 1006(M) and the plurality of second side surfaces 1007(1), 1007(2), 1007(3), . . . , and 1007(M) may be formed through operations 4411 and 4412. In this case, operation 4413 may be substantially or entirely omitted.

According to an embodiment, the embodiment of FIG. 30 or the embodiment of FIG. 32 may be implemented by forming the plurality of second portions 1020(1), 1020(2), 1020(3), . . . , and 1020(M), and then further performing operation 4413 of surface processing (e.g., cutting processing using a method such as a CNC) of the plurality of first side surfaces 1006(1), 1006(2), 1006(3), . . . , and 1006(M) and the plurality of second side surfaces 1007(1), 1007(2), 1007(3), . . . , and 1007(M).

According to one embodiment, the metal plate 4520 formed by operation 4410 (see FIG. 46) may include a plurality of recesses 4601(1), 4601(2), 4601(3), . . . , and 4601(N). A width W of the plurality of recesses 4601(1), 4601(2), 4601(3), . . . , and 4601(N) may correspond to the intervals in which the plurality of second portions 1020(1), 1020(2), 1020(3), . . . , and 1020(M) are arranged in the embodiment of FIG. 10. In some embodiments, and for example, the width W may be a size between about 0.5 mm to about 1.0 mm, but is not limited thereto. Further, a depth D of the plurality of recesses 4601(1), 4601(2), 4601(3), . . . , and 4601(N) may correspond to the difference between the thickness T1 and the thicknesses T2 and may be, for example, a dimension of between about 0.4 mm to about 0.7 mm, but is not limited thereto.

According to an embodiment, in operation 4420, a lattice structure including a plurality of openings and/or recesses may be formed. Operation 4420 may include, for example, etching. With reference to (E) in FIG. 47, in operation 4420, a first masking area 4701 may be disposed on the metal plate 4520 such that the multi-bar structure MB2 (e.g., the multi-bar structure formed by surface processing of the multi-bar structure MB1 formed by operation 4412) of the metal plate 4520 formed in operation 4410 substantially entirely cover one surface.

In one embodiment, the first masking area 4701 may be disposed on the metal plate 4520 including the multi-bar structure MB2. For example, a method of forming the first masking area 4701 through spraying such as painting or electrodeposition may serve to reduce masking defects on one surface including the multi-bar structure MB2. In one embodiment, in operation 4420, a second masking area 4702 may be disposed on the other surface positioned opposite to one surface (e.g., the first surface 4500A) including the multi-bar structure MB2 of the metal plate 4520 formed in operation 4410. For example, through a method including disposing a photosensitive dry film on the metal plate 4520 including the multi-bar structure MB2 with heat and pressure, then irradiating the dry film with light using a master film having a pattern thereon, and then developing the dry film (e.g., a photographic printing), the second masking area 4702 (e.g., the portions remaining on the dry film) may be formed. As another example, the second masking area 4702 may be formed through a method using a silkscreen having a pattern thereon in place of the dry film (e.g., a screen-printing). In some embodiments, the second masking area 4702 may be formed through spraying such as painting or electrodeposition. In some embodiments, the second masking area 4702 may be formed by disposing a masking film on the metal plate 4520 including the multi-bar structure MB2 and then removing a portion of the masking film using a method such as laser processing. The second masking area 4702 may be formed using various other methods. In operation 4420, an etching solution is applied to remove a portion of the metal plate 4520 including the multi-bar structure MB2 that is not covered by the second masking area 4702 by the etching solution, so that a plurality of openings 11(1), 11(2), 11(3), . . . , and 11(N) may be formed. Accordingly, the display support plate 50 including the multi-bar structure MB2 and the plurality of opening patterns 1100(1), 1100(2), 1100(3), . . . , and 1100(N) based on the plurality of openings 11(1), 11(2), 11(3), . . . , and 11(N) may be formed. The first masking area 4701 may reduce damage or deformation of the multi-bar structure MB2 due to the etching solution during etching.

According to an embodiment, the etching may be performed so that a width W1 of the plurality of openings 11(1), 11(2), 11(3), . . . , and 11(N) is formed to be larger compared to a depth D1 of the plurality of openings 11(1), 11(2), 11(3), . . . , and 11(N). In an embodiment in which etching is performed to form the width W1 larger compared to the depth D1, the flow (or fluidity) of the etching solution is increased compared to an example in which etching is performed so that the width W1 is equal to or smaller than the depth D1, so a defect of removing portions 4703 supporting the plurality of openings 11(1), 11(2), 11(3), . . . , and 11(N) of the plurality of first portions 1010(1), 1010(2), 1010(3), . . . , and 1010(N) may be reduced. In some embodiments, for example, the width W1 may have a value of between about 0.15 mm and about 0.3 mm, but is not limited thereto. Further, in some embodiments, for example, the depth D1 may have a value of between about 0.1 mm and about 0.25 mm, but is not limited thereto.

According to some embodiments, operation 4420 may use a cutting method such as a CNC or laser. In such embodiments, operation 4420 may be performed with cutting conditions that do not substantially create defects.

According to some embodiments, operation 4420 may be performed to form the plurality of recess patterns 1800(1), 1800(2), 1800(3), . . . , and 1800(N) according to the embodiment of FIG. 17, in place of the plurality of opening patterns 1100(1), 1100(2), 1100(3), . . . , and 1100(N).

According to some embodiments, in the embodiment of FIG. 22, a plurality of recess patterns (e.g., the plurality of recess patterns 2300(1), 2300(2), 2300(3), . . . , and 2300 (M)) included in the plurality of second portions 1020(1), 1020(2), 1020(3), . . . , and 1020(M) of the display support plate 50 may be formed in operation 4420. The etching in operation 4420 may be performed to form, for example, the plurality of opening patterns 1100(1), 1100(2), 1100(3), . . . , and 1100(N) and the plurality of recess patterns 2300(1), 2300(2), 2300(3), . . . , and 2300(M). In some embodiments, the plurality of recess patterns 2300(1), 2300(2), 2300(3), . . . , and 2300(M) may be formed using additional etching or cutting processes such as a CNC or laser after forming the plurality of opening patterns 1100(1), 1100(2), 1100(3), . . . , and 1100(N).

According to some embodiments, such as in the embodiment of FIG. 25, the plurality of first openings 2510(1), 2510(2), 2510(3), . . . , and 2510(N) and/or the plurality of second openings 2520(1), 2520(2), 2520(3), . . . , and 2520(N) included in the plurality of second portions 1020(1), 1020(2), 1020(3), . . . , and 1020(M) of the display support plate 50 may be formed in operation 4420. The etching in operation 4420 may be performed to form, for example, the plurality of opening patterns 1100(1), 1100(2), 1100(3), . . . , and 1100(N), the plurality of first openings 2510(1), 2510(2), 2510(3), . . . , and 2510(N), and the plurality of second openings 2520(1), 2520(2), 2520(3), . . . , and 2520(N). In some embodiments, the plurality of first openings 2510(1), 2510(2), 2510(3), . . . , and 2510(N), and/or the plurality of second openings 2520(1), 2520(2), 2520(3), . . . , and 2520(N) may be formed by additional etching after forming the plurality of opening patterns 1100(1), 1100(2), 1100(3), . . . , and 1100(N). In some embodiments, the plurality of first openings 2510(1), 2510(2), 2510(3), . . . , and 2510(N), and/or the plurality of second openings 2520(1), 2520(2), 2520(3), . . . , and 2520(N) may be formed by various other methods such as but not limited to etching using a CNC or laser.

According to an embodiment, the plurality of opening patterns 2800(1), 2800(2), 2800(3), . . . , and 2800(N) included in the second area 52 of the display support plate 50 may be formed by operation 4420, such as in the embodiments of FIG. 30, 31, or 32. In operation 4420, the etching may be performed to form, for example, the plurality of opening patterns 2800(1), 2800(2), 2800(3), . . . , and 2800(N). In some embodiments, operation 4420 may include a first etching to form the plurality of first openings 2810(1), 2810(2), 2810(3), . . . , and 2810(N), and a second etching to form the plurality of second openings 2820(1), 2820(2), 2820(3), . . . , and 2820(N) and the plurality of third openings 2830(1), 2830(2), 2830(3), . . . , and 2830(N). In some embodiments, the plurality of opening patterns 2800(1), 2800(2), 2800(3), . . . , and 2800(N) may be formed by various other methods such as but not limited to etching using a CNC or laser.

According to some embodiments, operation 4420 may be performed to form the plurality of recess patterns 2100(1), 2100(2), 2100(3), . . . , and 2100(N) according to the embodiment of FIG. 20, in place of the plurality of opening patterns 1100(1), 1100(2), 1100(3), . . . , and 1100(N).

According to some embodiments, although not illustrated, the manufacturing flow 4400 of FIG. 44 may include at least one operation for a surface treatment of the display support plate 50 to have properties such as surface hardening or corrosion resistance. Various other pre- or post-treatment operations and processes may be performed without departing from the scope of the present disclosure.

According to one embodiment, in the embodiment of FIG. 33, the plate 3310 of the display support plate 50 may include an operation of forming the base metal including first and second surfaces disposed opposite to each other (e.g., the operation 4411 in FIG. 44), and an operation of forming the plurality of opening patterns 3301(1), 3301(2), 3301(3), . . . , and 3301(N) and the plurality of recess patterns 3302(1), 3302(2), 3302(3), . . . , and 3302(M). The operation for forming the plurality of opening patterns 3301(1), 3301(2), 3301(3), . . . , and 3301(N) and/or the plurality of recess patterns 3302(1), 3302(2), 3302(3), . . . , and 3302(M) may include etching. The plurality of opening patterns 3301(1), 3301(2), 3301(3), . . . , and 3301(N) and/or the plurality of recess patterns 3302(1), 3302(2), 3302 (3), . . . , and 3302(M) may be formed by various other methods such as but not limited to etching using a CNC or laser. In some embodiments, in the manufacturing flow 4400, the plate 3310 of the display support plate 50 may further include an operation for exterior processing such as surface processing or an operation for surface treatment.

According to an example embodiment of the disclosure, an electronic device (e.g., the electronic device 2 in FIG. 2) may include a flexible display (e.g., the display 30 in FIG. 2) at least partially withdrawable from an internal space of the electronic device. The electronic device may include a plate (e.g., the display support plate 50 in FIG. 9) disposed on the rear surface of the flexible display. In the plate, a first portion of a first thickness and a second portion of a second thickness thicker than the first thickness may be repeatedly arranged based on one surface (e.g., the first surface 1001 in FIG. 10 or 30) of the plate connected to the rear surface of the flexible display (e.g., the plurality of first portions 1010(1), 1010(2), 1010(3), . . . , and 1010(N), and the plurality of second portions 1020(1), 1020(2), 1020(3), . . . , and 1020(M) in FIG. 10 or 30). The first portion and the second portion may define a repeating pattern. The plate may include a plurality of openings (e.g., the plurality of openings 11(1), 11(2), 11(3), . . . , and 11(N) in FIG. 10, or a plurality of first openings 2810(1), 2810(2), 2810(3), . . . , and 2810 (N) in FIG. 30) formed in the first portion. The first portion and the second portion may be integrally formed and may include or be formed from the same material.

According to an example embodiment of the disclosure, the first portion may include a lattice structure including a plurality of openings (e.g., the plurality of opening patterns 1100(1), 1100(2), 1100(3), . . . , and 1100(N) in FIG. 10).

According to an example embodiment of the disclosure, the second portion may include a plurality of recesses (e.g., the plurality of recesses 23(1), 23(2), 23(3), . . . , or 23(M) in FIG. 22) formed on one surface (e.g., the first surface 1001 in FIG. 22) of the plate connected to the rear surface of the flexible display.

According to an example embodiment of the disclosure, the plate (e.g., the display support plate 50 in FIG. 9) may further include a plurality of other openings. For example, and without limitation, the plate may be processed to include the plurality of first openings 2510(1), 2510(2), 2510(3), . . . , and 2510(N) and the plurality of second openings 2520(1), 2520(2), 2520(3), . . . , and 2520(N) shown in FIG. 25, or the plurality of second openings 2820(1), 2820(2), 2820(3), . . . , and 2820(N) and the plurality of third openings 2830(1), 2830(2), 2830(3), . . . , and 2830(N) shown in FIG. 30. Such openings may be positioned on a boundary between the first portion and the second portion.

According to an example embodiment of the disclosure, the plate (e.g., the display support plate 50 in FIG. 9) may further include a plurality of recesses positioned at a boundary between the first portion and the second portion.

According to an example embodiment of the disclosure, the plate (e.g., the display support plate 50 in FIG. 9) may include or be formed from a metal material.

According to an example embodiment of the disclosure, the plate (e.g., the display support plate 50 in FIG. 9) may include or be formed from an engineering plastic.

According to an example embodiment of the disclosure, the plate (e.g., the display support plate 50 in FIG. 10 or 30) may include a first surface (e.g., the first surface 1001 in FIG. 10 or 30) connected to a rear surface of the flexible display. The plate may include a second surface (e.g., the second surface 1002 in FIG. 10 or 30) positioned opposite the first surface. The second surface may be positioned spaced apart from the first surface at a first height. The plate may further include a third surface that is positioned spaced apart from the first surface at a second height greater than the first height (e.g., the third surface 1003(1), 1003(2), 1003(3), . . . , or 1003(M) in FIG. 10 or 30). The second surface may be formed by a first portion (e.g., the first portion 1010(1), 1010(2), 1010(3), . . . , or 1010(N) in FIG. 10 or 30). The third surface may be formed by the second portion (e.g., the second portion 1020(1), 1020(2), 1020(3), . . . , or 1020(M) in FIG. 10 or 30). The second portion may include a first side surface (e.g., the first side surface 1006(1), 1006(2), 1006(3), . . . , or 1006(M) in FIG. 10 or 30) and a second side surface (e.g., the second side surface 1007(1), 1007(2), 1007(3), . . . , or 1007(M) in FIG. 10 or 30) that connect the second surface and the third surface and are positioned opposite to each other.

According to an example embodiment of the disclosure, the first side surface and the second side surface form the same (but opposite) obtuse angle with respect to the third surface.

According to an example embodiment of the disclosure, the first side surface and the second side surface may be perpendicular to the third side surface.

According to an example embodiment of the disclosure, an electronic device may include a first housing (e.g., the first housing 21 in FIG. 6) and a second housing slidable with respect to the first housing (e.g., the second housing 22 in FIG. 6). The electronic device may include a first support member (e.g., the support member 721 in FIG. 6) positioned on the first housing. The electronic device may include a second support member (e.g., the second support member 722 in FIG. 6) positioned on the second housing. The flexible display may include a first display section (e.g., the first display section (in FIG. 33) and a second display section (e.g., the second display section ②  in FIG. 33) extending from the first display section. The first display section may be disposed on the first support member and visually exposed to the outside. When sliding, the second display section may be supported by the second support member and withdrawn from the internal space of the electronic device or retracted into the internal space of the electronic device.

According to an example embodiment of the disclosure, the plate (e.g., the display support plate 50 in FIG. 10 or 30) may include a first area (e.g., the first area 51 in FIG. 10 or 30) disposed on the rear surface of the first display section, and a second area (e.g., the second area 52 in FIG. 10 or 30) disposed on the rear surface of the second display section. The first portion (e.g., the first portion 1010(1), 1010(2), 1010(3), . . . , or 1010(N) in FIG. 30 or 30) and the second portion (e.g., the second portion 1020(1), 1020(2), 1020(3), . . . , or 1020(M) in FIG. 10 or 30) may be included in the second area.

According to an example embodiment of the disclosure, the first area (e.g., the first area 51 in FIG. 10 or 30) may be formed to have a first thickness.

According to an example embodiment of the disclosure, the first area (e.g., the first support plate 3810 in FIG. 38) and the second area (e.g., the second support plate 3820 in FIG. 38) may be separately formed. The first area and the second area may be connected using an adhesive material (e.g., the adhesive material 4020 in FIG. 40).

According to an example embodiment of the disclosure, the flexible display may further include a third display section (e.g., the third display section ③ in FIG. 33) that is bent and extended from the display panel included in the flexible display and overlaps and connects to the first area (e.g., the first area 51 in FIG. 33). A display driving circuit (e.g., the display driving circuit 3310 in FIG. 33) may be disposed on the third display section.

According to an example embodiment of the disclosure, an electronic device may include a plurality of first guide pins (e.g., the plurality of first guide pins 812(1), 812(2), 812(3), . . . , and 812(M) in FIG. 15) positioned on one side of a plate (e.g., the display support plate 50 in FIG. 14). The electronic device may include a plurality of second guide pins (e.g., the plurality of second guide pins 822(1), 822(2), 822(3), . . . , and 822(M) in FIG. 14) positioned on the other side of the plate. The electronic device may include a first guide rail (e.g., the first guide rail 801 in FIG. 8) positioned in the internal space of the electronic device, corresponding to the plurality of first guide pins. The electronic device may include a second guide rail positioned in the internal space of the electronic device, corresponding to the plurality of second guide pins.

According to an example embodiment of the disclosure, the first guide pin may be connected to one side of a second portion (e.g., the second portion 1020(1), 1020(2), 1020(3), . . . , or 1020(M) in FIG. 14 or 15), and the second guide pin may be connected to the other side of the second portion.

According to an example embodiment of the disclosure, an electronic device may include a first housing (e.g., the first housing 21 in FIG. 6) and a second housing slidable with respect to the first housing (e.g., the second housing 22 in FIG. 6). The electronic device may include a first support member (e.g., the first support member 721 in FIG. 6) positioned in the first housing. The electronic device may include a second support member (e.g., the second support member 722 in FIG. 6) positioned in the second housing. The flexible display may include a first display section (e.g., the first display section ① in FIG. 33) and a second display section (e.g., the second display section ② in FIG. 33) extending from the first display section. The first display section may be disposed on the first support member and visually exposed to the outside. When sliding, the second display section may be supported by a second support member and withdrawn from the internal space of the electronic device or retracted into the internal space of the electronic device. The electronic device may include a plate (e.g., the display support plate 50 in FIG. 10, 20, 22, 25, 30, 31, or 32) disposed on the rear surface of the flexible display. In the plate, a first portion of a first thickness and a second portion of a second thickness thicker than the first thickness may be repeatedly arranged based on one surface (e.g., the first surface 1001 in FIG. 10, 20, 22, 25, 30, 31, or 32) of the plate connected to the rear surface of the flexible display (e.g., the plurality of first portions 1010(1), 1010(2), 1010(3), . . . , and 1010(N), and the plurality of second portions 1020(1), 1020(2), 1020(3), . . . , and 1020(M) in FIG. 10, 20, 22, 25, 30, 31, or 32). The plate may include a lattice structure including a plurality of openings (e.g., the plurality of openings 11(1), 11(2), 11(3), . . . , and 11(N) in FIG. 10 or the plurality of first openings in 2810(1), 2810(2), 2810(3), . . . , and 2810(N) in FIG. 30) formed in the first portion. The first portion and the second portion may be integrally formed and may include or be formed from the same material.

According to an example embodiment of the disclosure, the plate (e.g., the display support plate 50 in FIG. 10, 20, 22, 25, 30, 31, or 32) may include a first area disposed on the rear surface of the first display section (e.g., the first area 51 in FIG. 10, 20, 22, 25, 30, 31, or 32) and a second area disposed on the rear surface of the second display section (e.g., the second area 52 in FIG. 10, 20, 22, 25, 30, 31, or 32). The first portion (e.g., the first portion 1010(1), 1010(2), 1010(3), . . . , or 1010(N) in FIG. 10, 20, 22, 25, 30, 31, or 32) and the second portion (e.g., the second portion 1020(1), 1020(2), 1020(3), . . . , or 1020(M) in FIG. 10, 20, 22, 25, 30, 31, or 32) may be included in the second area.

According to an example embodiment of the disclosure, the second portion may include a plurality of recesses (e.g., the plurality of recesses 23(1), 23(2), 23(3), . . . , or 23(M) in FIG. 22) formed on one surface (e.g., the first surface 1001 in FIG. 22) of the plate connected to the rear surface of the flexible display.

The embodiments disclosed in the disclosure and drawings are only presented as specific examples to easily explain technical contents and help understanding of the embodiments, and are not intended to limit the scope of the embodiments. Therefore, the scope of various embodiments of the disclosure should be construed as including changes or modifications other than the embodiments disclosed herein within the scope of various embodiments of the disclosure.

What is claimed is:

1. An electronic device, comprising:
    a flexible display at least partially withdrawable from an internal space of the electronic device; and
    a plate disposed on a rear surface of the flexible display,
    wherein the plate comprises a first portion having a first thickness and a second portion having a second thickness that is greater than the first thickness based on one surface of the plate connected to the rear surface of the flexible display, and wherein the first portion and the second portion define a repeating pattern,
    wherein the plate includes a plurality of openings formed on the first portion, and
    wherein the first portion and the second portion are integrally formed, and comprise the same material;
    a plurality of first guide pins positioned on a first side of the plate;
    a plurality of second guide pins positioned on a second side of the plate opposite the first side of the plate;
    a first guide rail positioned in the internal space of the electronic device, corresponding to the plurality of first guide pins;
    a second guide rail positioned in the internal space of the electronic device, corresponding to the plurality of second guide pins;
    wherein the plurality of first guide pins are connected to a first side of the second portion, and
    the plurality of second guide pins are connected to a second side of the second portion opposite the first side.

2. The electronic device of claim 1, wherein the first portion includes a lattice structure including the plurality of openings.

3. The electronic device of claim 1, wherein the second portion includes a plurality of recesses formed on one surface of the plate connected to the rear surface of the flexible display.

4. The electronic device of claim 1, wherein the plate further includes a plurality of other openings positioned on a boundary between the first portion and the second portion.

5. The electronic device of claim 1, wherein the plate further includes a plurality of recesses positioned on a boundary between the first portion and the second portion.

6. The electronic device of claim 1, wherein the plate comprises a metal material.

7. The electronic device of claim 1, wherein the plate comprises an engineering plastic.

8. The electronic device of claim 1,
    wherein the plate comprises:
        a first surface connected to the rear surface of the flexible display; and
        a second surface positioned opposite to the first surface and spaced apart from the first surface by a first height, and a third surface spaced apart from the first surface by a second height greater than the first height,
    wherein the second surface is defined by the first portion,
    wherein the third surface is defined by the second portion, and
    wherein the second portion includes a first side surface and a second side surface that connect the second surface and the third surface and are positioned opposite to each other relative to the third surface.

9. The electronic device of claim 8, wherein the first side surface and the second side surface form the same but opposite obtuse angle with respect to the third surface.

10. The electronic device of claim 8, wherein the first side surface and the second side surface are perpendicular to the third surface.

11. The electronic device of claim 1, further comprising:
    a first housing and a second housing slidable with respect to the first housing, wherein the first housing and the second housing define, at least in part, the internal space of the electronic device;
    a first support member positioned in the first housing; and
    a second support member positioned in the second housing,
    wherein the flexible display includes:
        a first display section disposed on the first support member and visually exposed to an outside; and
        a second display section that extends from the first display section and is supported by the second support member during the sliding, and is withdrawn from or retracted into the internal space of the electronic device.

12. The electronic device of claim 11,
    wherein the plate includes a first area disposed on a rear surface of the first display section and a second area disposed on a rear surface of the second display section,
    wherein the first portion and the second portion are included in the second area.

13. The electronic device of claim 12, wherein the first area has the first thickness.

14. The electronic device of claim 12, wherein the first area and the second area are separately formed, and the first area and the second area are connected together using an adhesive material.

15. The electronic device of claim 11,
    wherein the flexible display comprises a third display section that is bent and extended from a display panel included in the flexible display and overlaps and connects to the first area, and
    wherein a display driving circuit is disposed in the third display section.

16. An electronic device, comprising:
    a first housing and a second housing slidable with respect to the first housing;
    a first support member positioned in the first housing;
    a second support member positioned in the second housing;
    a flexible display including a first display section disposed on the first support member and visually exposed to an outside, and a second display section that extends from the first display section, is supported by the second support during a sliding movement, and is withdrawable from or retractable into the internal space of the electronic device; and a plate disposed on a rear surface of the flexible display,
wherein the plate comprises a first portion of a first thickness and a second portion of a second thickness thicker than the first thickness, the first portion and the second portion repeatedly arranged based on one surface of the plate connected to the rear surface of the flexible display,
wherein the plate includes a lattice structure including a plurality of openings formed on the first portion, and
wherein the first portion and the second portion are integrally formed, and comprise the same material;
a plurality of first guide pins positioned on a first side of the plate;
a plurality of second guide pins positioned on a second side of the plate opposite the first side of the plate;
a first guide rail positioned in the internal space of the electronic device, corresponding to the plurality of first guide pins;
a second guide rail positioned in the internal space of the electronic device, corresponding to the plurality of second guide pins;
wherein the plurality of first guide pins are connected to a first side of the second portion, and
the plurality of second guide pins are connected to a second side of the second portion opposite the first side.

17. The electronic device of claim 16,
wherein the plate includes a first area disposed on a rear surface of the first display section and a second area disposed on a rear surface of the second display section, and
wherein the first portion and the second portion are included in the second area.

18. The electronic device of claim 16, wherein the second portion includes a plurality of recesses formed on one surface of the plate connected to the rear surface of the flexible display.

* * * * *